(12) United States Patent
Yamazaki et al.

(10) Patent No.: US 12,720,961 B2
(45) Date of Patent: Aug. 25, 2026

(54) METHOD OF FABRICATING DISPLAY DEVICE USING SACRIFICIAL FILM

(71) Applicant: SEMICONDUCTOR ENERGY LABORATORY CO., LTD., Atsugi (JP)

(72) Inventors: Shunpei Yamazaki, Tokyo (JP); Kenichi Okazaki, Atsugi (JP); Yuichi Yanagisawa, Atsugi (JP); Naoto Goto, Tochigi (JP); Shun Mashiro, Oyama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 473 days.

(21) Appl. No.: 18/260,969

(22) PCT Filed: Dec. 27, 2021

(86) PCT No.: PCT/IB2021/062320

§ 371 (c)(1),
(2) Date: Jul. 11, 2023

(87) PCT Pub. No.: WO2022/153118

PCT Pub. Date: Jul. 21, 2022

(65) Prior Publication Data

US 2024/0324279 A1 Sep. 26, 2024

(30) Foreign Application Priority Data

Jan. 14, 2021 (JP) ................................ 2021-004507
Jan. 27, 2021 (JP) ................................ 2021-011066

(51) Int. Cl.
*H10K 59/122* (2023.01)
*H10K 50/00* (2023.01)
(Continued)

(52) U.S. Cl.
CPC ........... *H10K 59/122* (2023.02); *H10K 50/00* (2023.02); *H10K 59/00* (2023.02);
(Continued)

(58) Field of Classification Search
CPC .. H10K 59/122; H10K 59/1201; H10K 59/00; H10K 59/8722; H10K 59/8731;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001653855 A 8/2005
CN 102760698 A 10/2012
(Continued)

OTHER PUBLICATIONS

International Search Report (Application No. PCT/IB2021/062320) Dated Mar. 22, 2022.
(Continued)

*Primary Examiner* — Eric W Jones
(74) *Attorney, Agent, or Firm* — Fish & Richardson P.C.

(57) ABSTRACT

A method of fabricating a display device with high resolution is provided. A display device having both high display quality and high resolution is provided. The method of fabricating a display device includes steps of forming a first EL film and a first sacrificial film over a first pixel electrode and a second pixel electrode; etching the first sacrificial film to form a first sacrificial layer; etching the first EL film to form a first EL layer and to expose the second pixel electrode; forming a second EL film and a second sacrificial film; etching the second sacrificial film to form a second sacrificial layer; etching the second EL film to form a second
(Continued)

EL layer; forming an insulating film covering the first sacrificial layer, the first EL layer, the second sacrificial layer, and the second EL layer; and etching the insulating film to form an insulating layer including a region in contact with a side surface of the first EL layer and a region in contact with a side surface of the second EL layer.

18 Claims, 33 Drawing Sheets

(51) Int. Cl.
*H10K 50/10* (2023.01)
*H10K 59/00* (2023.01)
*H10K 59/12* (2023.01)
*H10K 59/80* (2023.01)
*H10K 71/20* (2023.01)

(52) U.S. Cl.
CPC ....... *H10K 59/1201* (2023.02); *H10K 71/233* (2023.02); *H10K 50/10* (2023.02); *H10K 59/871* (2023.02); *H10K 59/8722* (2023.02); *H10K 59/8731* (2023.02)

(58) Field of Classification Search
CPC .... H10K 59/871; H10K 71/233; H10K 50/00; H10K 50/10
USPC .................. 257/40, 59, 91, 99, 100; 438/34
See application file for complete search history.

(56) References Cited

U.S. PATENT DOCUMENTS

| | | | | |
|---|---|---|---|---|
| 7,399,991 | B2 | 7/2008 | Seo et al. | |
| 7,534,557 | B2 | 5/2009 | Tachikawa et al. | |
| 7,663,149 | B2 | 2/2010 | Seo et al. | |
| 7,914,976 | B2 | 3/2011 | Tachikawa. et al. | |
| 9,219,253 | B2 | 12/2015 | Izumi et al. | |
| 2002/0072139 | A1 | 6/2002 | Kashiwabara | |
| 2005/0153058 | A1 | 7/2005 | Tachikawa et al. | |
| 2009/0191486 | A1 | 7/2009 | Tachikawa et al. | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1* | 4/2013 | Yoshitoku | H10K 59/35 257/E51.026 |
| 2013/0084666 | A1* | 4/2013 | Oshige | H10K 59/35 438/35 |
| 2013/0280839 | A1 | 10/2013 | Sonoda. et al. | |
| 2013/0295705 | A1 | 11/2013 | Sonoda. et al. | |
| 2014/0004640 | A1 | 1/2014 | Hamaguchi et al. | |
| 2014/0004642 | A1 | 1/2014 | Otsuka et al. | |
| 2015/0048328 | A1* | 2/2015 | Kato | H10K 59/80515 438/34 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2018/0261798 | A1 | 9/2018 | Choi et al. | |
| 2020/0028112 | A1 | 1/2020 | Choi et al. | |
| 2020/0203662 | A1 | 6/2020 | Mollard. et al. | |
| 2020/0274110 | A1 | 8/2020 | Chen et al. | |

FOREIGN PATENT DOCUMENTS

| | | | | |
|---|---|---|---|---|
| CN | 108574053 | A | | 9/2018 |
| CN | 111627957 | A | | 9/2020 |
| CN | 111628113 | A | | 9/2020 |
| EP | 3373356 | A | | 9/2018 |
| JP | 2000-036385 | A | | 2/2000 |
| JP | 2000-113982 | A | | 4/2000 |
| JP | 2002-324673 | A | | 11/2002 |
| JP | 2003-059663 | A | | 2/2003 |
| JP | 2003-332051 | A | | 11/2003 |
| JP | 2008-098106 | A | | 4/2008 |
| JP | 2008147072 | A | * | 6/2008 |
| JP | 2008-251270 | A | | 10/2008 |
| JP | 2012-238580 | A | | 12/2012 |
| JP | 2014-120218 | A | | 6/2014 |
| JP | 2014-135251 | A | | 7/2014 |
| JP | 2014-232568 | A | | 12/2014 |
| JP | 2015-115178 | A | | 6/2015 |
| JP | 2016-197494 | A | | 11/2016 |
| JP | 2019-179696 | A | | 10/2019 |
| JP | 2020-160305 | A | | 10/2020 |
| KR | 10-0931279 | | | 12/2009 |
| KR | 2014-0020674 | A | | 2/2014 |
| KR | 2018-0104257 | A | | 9/2018 |
| KR | 2021-0001729 | A | | 1/2021 |
| TW | 202032827 | | | 9/2020 |
| TW | 202040843 | | | 11/2020 |
| WO | WO-2003/096754 | | | 11/2003 |

OTHER PUBLICATIONS

Written Opinion (Application No. PCT/IB2021/062320) Dated Mar. 22, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke. T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 6A
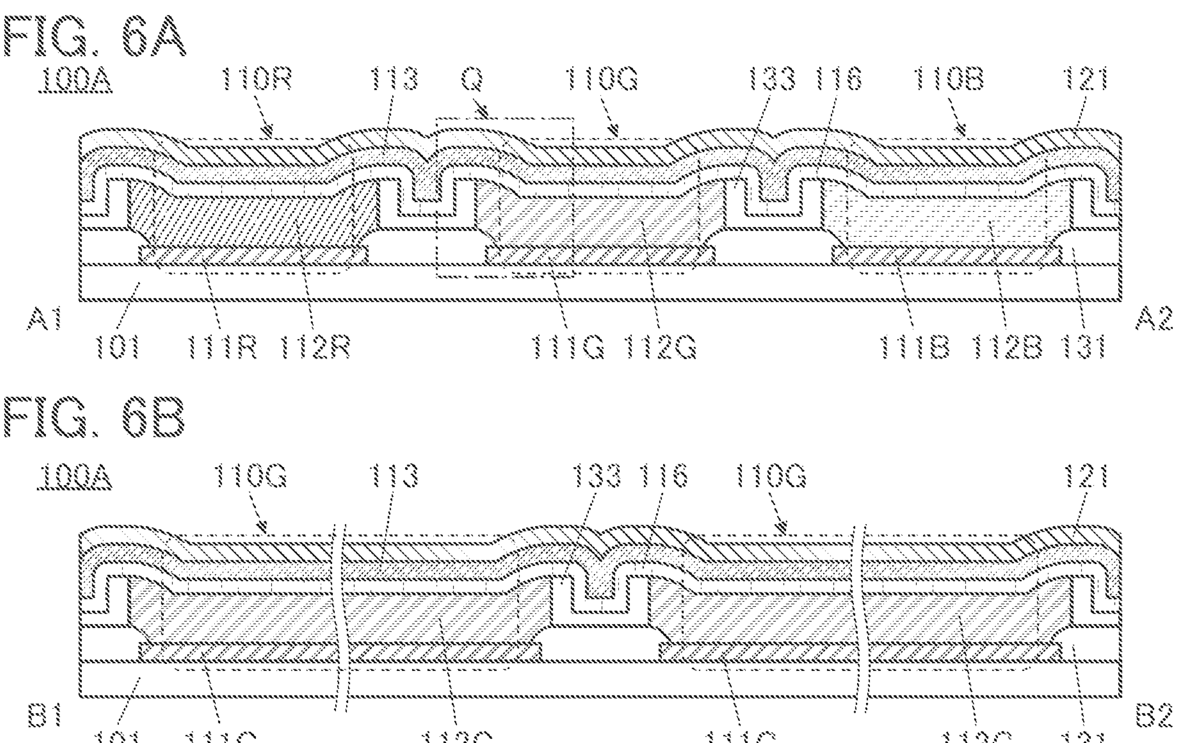
FIG. 6B
FIG. 6C
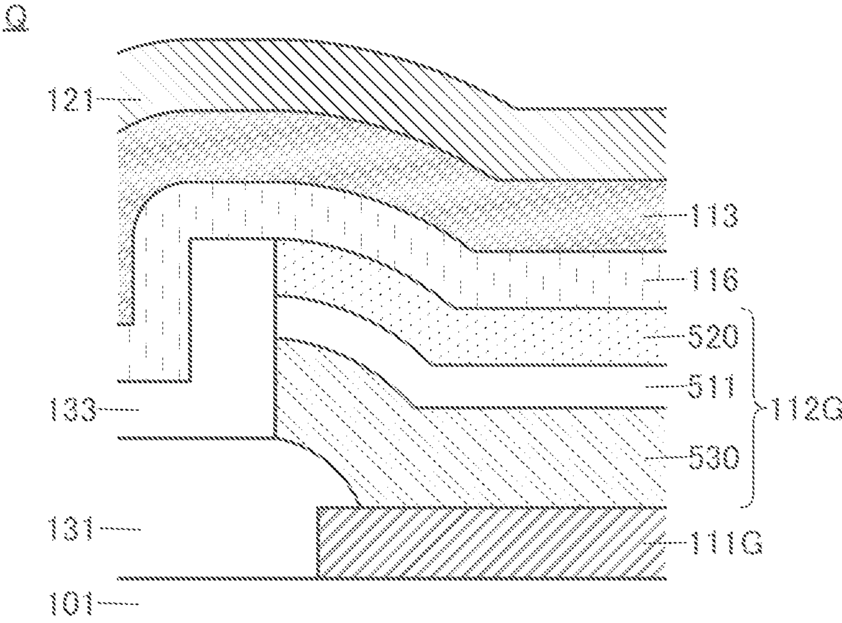

FIG. 9A
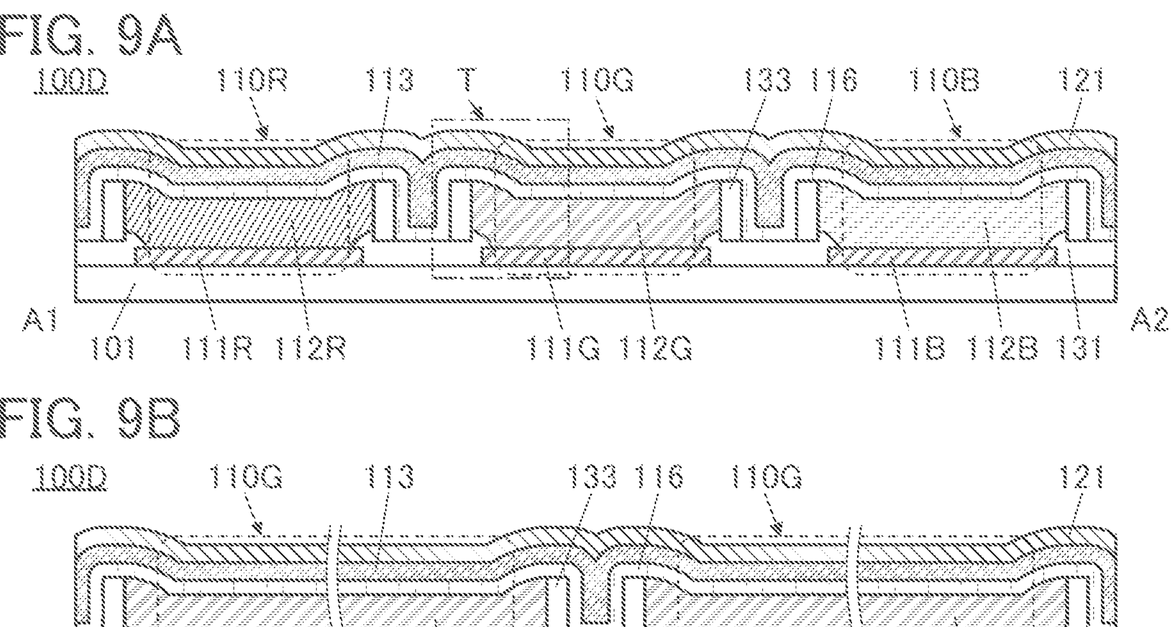
FIG. 9B
FIG. 9C
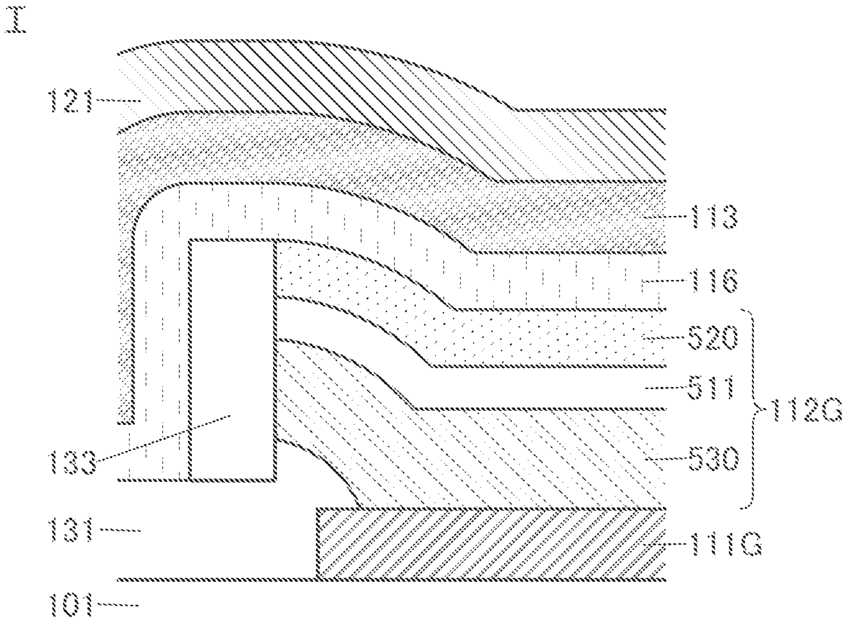

100E
110R
113
110G
133
116
110B
121
A1
101
111R
112R
111G
112G
111B
112B
131
A2

100E
110G
113
133
116
110G
121
B1
101
111G
112G
111G
112G
131
B2

100E
A1
A2
121
131
110B
116
113
110G
133
110R
131aC
131aB
112B
111B
131cB
131cC
131cG
112G
111G
131bG
131bC
131bR
112R
111R
101
131aR 400A
442
228
443
215
213
211
222b
223
205
231
221
222a
430c
B
426c
411c
452
416
205
430b
G
462
426b
411b
421
433
430a
205
R
426a
411a
417
464
201
465
242
466
204
472
214
451

416c
416a
215
213
211
442
228
416b
443
430c
416
452
417
433
421
451

7100

7101

7000

7103

7111

7200

7211

7000

7212

7213

7214

8100
8101
8102
8006
8103
8004
8001
8002
8000
8003

8200
8201
8202
8206
8205
8203
8204

8300
8301
8304
8304

8300
8301
8305
8302
8304
8304
8305

8300
8305
8301
8302
8305

8400
8402
8403
8405
8401
8404

9101
9001
9050
9051
9005
9000

9102
9053
9052
9001
9000
9054

9200
9001
9000
9007
9005
9003
9008
9005
9006
19:34

9201
9001
9055
9000

9201
9001
9055
9000

9201
9055
9000
9001

METHOD OF FABRICATING DISPLAY DEVICE USING SACRIFICIAL FILM

CROSS REFERENCE TO RELATED APPLICATIONS

This application is a U.S. National Phase Application under 35 U.S.C. § 371 of International Application PCT/IB2021/062320, filed on Dec. 27, 2021, which is incorporated by reference and claims the benefit of foreign priority applications filed in Japan on Jan. 14, 2021, as Application No. 2021-004507 and on Jan. 27, 2021, as Application No. 2021-011066.

TECHNICAL FIELD

One embodiment of the present invention relates to a display device. One embodiment of the present invention relates to a method of fabricating a display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a fabricating method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop personal computer. Furthermore, higher resolution has been required for a stationary display device such as a television device or a monitor device along with an increase in definition. An example of a device required to have the highest resolution is a device for virtual reality (VR) or augmented reality (AR).

Examples of a display device that can be used for a display panel include, typically, a liquid crystal display device, a light-emitting apparatus including a light-emitting device such as an organic EL (Electro Luminescence) device or a light-emitting diode (LED), and electronic paper performing display by an electrophoretic method or the like.

For example, the basic structure of an organic EL device (also referred to as an organic EL element) is a structure in which a layer containing a light-emitting organic compound is provided between a pair of electrodes. By voltage application to this device, light emission can be obtained from the light-emitting organic compound. A display device using such an organic EL device does not need a backlight that is necessary for a liquid crystal display device and the like; thus, a thin, lightweight, high-contrast, and low-power display device can be achieved. Patent Document 1, for example, discloses an example of a display device using an organic EL device.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a method of fabricating a display device with high resolution. An object of one embodiment of the present invention is to provide a display device having both high display quality and high resolution. An object of one embodiment of the present invention is to provide a display device with a high contrast. An object of one embodiment of the present invention is to provide a highly reliable display device.

An object of one embodiment of the present invention is to provide a display device having a novel structure or a method of fabricating a display device. An object of one embodiment of the present invention is to provide a method of fabricating the above-described display device with high yield. An object of one embodiment of the present invention is to reduce at least one of problems of the conventional technique.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a method of fabricating a display device, including: a first step of forming a first pixel electrode and a second pixel electrode; a second step of forming a first EL film over the first pixel electrode and the second pixel electrode; a third step of forming a first sacrificial film covering the first EL film; a fourth of etching the first sacrificial film to form a first sacrificial layer including a region overlapping with the first pixel electrode; a fifth step of etching the first EL film to form a first EL layer including a region overlapping with the first sacrificial layer and to expose the second pixel electrode; a sixth step of forming a second EL film over the first sacrificial layer and the second pixel electrode; a seventh step of forming a second sacrificial film covering the second EL film; an eighth step of etching the second sacrificial film to form a second sacrificial layer including a region overlapping with the second pixel electrode; a ninth step of etching the second EL film to form a second EL layer including a region overlapping with the second sacrificial layer; a tenth step of forming an insulating film covering a top surface and a side surface of the first sacrificial layer, a side surface of the first EL layer, a top surface and a side surface of the second sacrificial layer, and a side surface of the second EL layer; an eleventh step of etching the insulating film to form a first insulating layer including a region in contact with a side surface of the first EL layer and a region in contact with a side surface of the second EL layer and to expose the first sacrificial layer and the second sacrificial layer; and a twelfth step of removing the first sacrificial layer and the second sacrificial layer.

One embodiment of the present invention is a method of fabricating a display device, including: a first step of forming a first pixel electrode and a second pixel electrode; a second step of forming a first EL film over the first pixel electrode and the second pixel electrode; a third step of forming a first sacrificial film covering the first EL film; a fourth of etching the first sacrificial film to form a first sacrificial layer including a region overlapping with the first pixel electrode; a fifth step of etching the first EL film to form a first EL layer including a region overlapping with the first sacrificial layer and to expose the second pixel electrode; a sixth step of forming a second EL film over the first sacrificial layer and the second pixel electrode; a seventh step of forming a second sacrificial film covering the second EL film; an eighth step of etching the second sacrificial film to form a second sacrificial layer including a region overlapping with the second pixel electrode; a ninth step of etching the second EL film to form a second EL layer including a region overlapping with the second sacrificial layer; a tenth step of forming an insulating film covering a top surface and a side surface of the first sacrificial layer, a side surface of the first EL layer, a top surface and a side surface of the second sacrificial layer, and a side surface of the second EL layer; an eleventh step of etching the insulating film to form a first insulating layer including a region in contact with a side surface of the first EL layer and a region in contact with a side surface of the second EL layer and to form a second insulating layer over the first sacrificial layer and a third insulating layer over the second sacrificial layer; and a twelfth step of removing the first sacrificial layer and the second sacrificial layer and removing the second insulating layer and the third insulating layer.

In the above-described method of fabricating a display device, the first sacrificial film preferably includes one or more of a metal film, an alloy film, a metal oxide film, a semiconductor film, and an inorganic insulating film. In the fifth step, dry etching using an etching gas not containing an oxygen gas is preferably employed as the etching of the first EL film.

In the above-described method of fabricating a display device, the etching gas not containing an oxygen gas is preferably one or more selected from $CF_4$, $C_4F_8$, $SF_6$, $CHF_3$, $Cl_2$, $H_2O$, $BCl_3$, $H_2$, and a noble gas.

The above-described method of fabricating a display device preferably includes a step of forming a first protective layer including a region overlapping with the first pixel electrode between the third step and the fourth step. In the fourth step, the first sacrificial film is preferably etched using the first protective layer as a mask to form the first sacrificial layer.

The above-described method of fabricating a display device preferably includes a step of removing the first protective layer between the fifth step and the sixth step.

The above-described method of fabricating a display device preferably includes a thirteenth step of forming a common electrode covering a top surface of the first EL layer, a top surface of the second EL layer, and a top surface and a side surface of the first insulating layer after the twelfth step.

The above-described method of fabricating a display device preferably includes a step of forming a layer covering a top surface of the first EL layer, a top surface of the second EL layer, a top surface and a side surface of the first insulating layer between the twelfth step and the thirteenth step. The layer is preferably a layer containing a substance with a high electron-injection property.

The above-described method of fabricating a display device preferably includes a step of forming a layer covering a top surface of the first EL layer, a top surface of the second EL layer, and a top surface and a side surface of the first insulating layer between the twelfth step and the thirteenth step. The layer preferably has a stacked-layer structure of a first layer containing a substance with a high electron-transport property and a second layer containing a substance with a high electron-injection property over the first layer.

The above-described method of fabricating a display device preferably includes a step of forming a layer covering a top surface of the first EL layer, a top surface of the second EL layer, and a top surface and a side surface of the first insulating layer between the twelfth step and the thirteenth step. The layer is preferably a layer containing a substance with a high hole-injection property.

The above-described method of fabricating a display device preferably includes a step of forming a layer covering a top surface of the first EL layer, a top surface of the second EL layer, a top surface and a side surface of the first insulating layer between the twelfth step and the thirteenth step. The layer preferably has a stacked-layer structure of a first layer containing a substance with a high hole-transport property and a second layer containing a substance with a high hole-injection property over the first layer.

One embodiment of the present invention is a method of fabricating a display device, including: a first step of forming a first pixel electrode and a second pixel electrode; a second step of forming an EL film over the first pixel electrode and the second pixel electrode; a third step of forming a sacrificial film covering the EL film; a fourth of etching the sacrificial film to form a first sacrificial layer including a region overlapping with the first pixel electrode and to form a second sacrificial layer including a region overlapping with the second pixel electrode; a fifth step of etching the EL film to form a first EL layer including a region overlapping with the first sacrificial layer and to form a second EL layer including a region overlapping with the second sacrificial layer; a sixth step of forming an insulating film covering a top surface and a side surface of the first sacrificial layer, a side surface of the first EL layer, a top surface and a side surface of the second sacrificial layer, and a side surface of the second EL layer; a seventh step of etching the insulating film to form a first insulating layer including a region in contact with a side surface of the first EL layer and a region in contact with a side surface of the second EL layer and to expose the first sacrificial layer and the second sacrificial layer; and an eighth step of removing the first sacrificial layer and the second sacrificial layer. The EL film includes a light-emitting layer emitting white light.

One embodiment of the present invention is a method of fabricating a display device, including: a first step of forming a first pixel electrode and a second pixel electrode; a second step of forming an EL film over the first pixel electrode and the second pixel electrode; a third step of forming a sacrificial film covering the EL film; a fourth of etching the sacrificial film to form a first sacrificial layer including a region overlapping with the first pixel electrode and to form a second sacrificial layer including a region overlapping with the second pixel electrode; a fifth step of etching the EL film to form a first EL layer including a region overlapping with the first sacrificial layer and to form a second EL layer including a region overlapping with the second sacrificial layer; a sixth step of forming an insulating film covering a top surface and a side surface of the first sacrificial layer, a side surface of the first EL layer, a top surface and a side surface of the second sacrificial layer, and a side surface of the second EL layer; a seventh step of etching the insulating film to form a first insulating layer including a region in contact with a side surface of the first EL layer and a region in contact with a side surface of the second EL layer and to form a second insulating layer over the first sacrificial layer and a third insulating layer over the second sacrificial layer; and an eighth step of removing the first sacrificial layer and the second sacrificial layer and removing the second insulating layer and the third insulating layer. The EL film includes a light-emitting layer emitting white light.

Effect of the Invention

According to one embodiment of the present invention, a method of fabricating a display device with high resolution can be provided. Alternatively, a display device having both high display quality and high resolution can be provided. Alternatively, a display device with a high contrast can be provided. Alternatively, a highly reliable display device can be provided.

According to one embodiment of the present invention, a display device having a novel structure or a method of fabricating a display device can be provided. Alternatively, a method of fabricating the above-described display device with a high yield can be provided. According to one embodiment of the present invention, at least one of problems of the conventional technique can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 6A to FIG. 6C are diagrams illustrating a structure example of a display device.

FIG. 9A to FIG. 9C are diagrams illustrating a structure example of a display device.

MODE FOR CARRYING OUT THE INVENTION

Figure 1A:
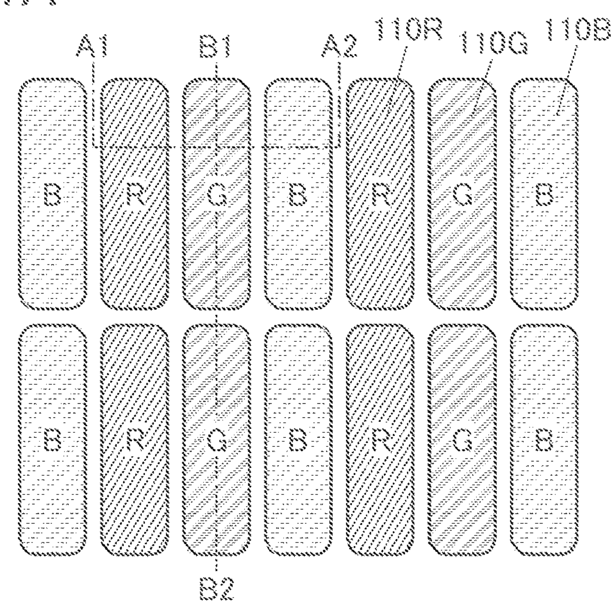
FIG. 1A to FIG. 1D are diagrams illustrating structure examples of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first" and "second" are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting device.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display device of one embodiment of the present invention and an example of a method of fabricating the display device will be described.

One embodiment of the present invention is a display device including a light-emitting device (also referred to as a light-emitting element). The display device includes at least two light-emitting devices that emit light of different colors. The light-emitting devices each include a pair of electrodes and an EL layer between them. The light-emitting devices are preferably organic EL devices (organic electroluminescent devices). The two or more light-emitting devices that exhibit different colors include EL layers containing different materials. For example, three kinds of light-emitting devices emitting light of red (R), green (G), and blue (B) are included, whereby a full-color display device can be achieved.

Here, as a way of forming EL layers separately between light-emitting devices of different colors, an evaporation method using a shadow mask, such as a metal mask (MM) or a fine metal mask (FMM), is known. However, this method causes a deviation from the designed shape and position of an island-shaped organic film due to various influences such as the accuracy of the shadow mask, the positional deviation between the shadow mask and a substrate, a warp of the shadow mask, and the vapor-scattering-induced expansion of the outline of the deposited film; accordingly, it is difficult to achieve high resolution and a high aperture ratio. Thus, a measure has been taken for pseudo improvement in resolution (also referred to as a pixel density) by employing a unique pixel arrangement method such as PenTile arrangement.

In this specification and the like, a shadow mask such as a metal mask (MM) or a fine metal mask (FMM) is referred to as a metal mask (MM) in some cases. A device fabricated using a metal mask (MM) is referred to as a metal mask (MM) structure in some cases. A device fabricated without using a metal mask is referred to as a metal mask less (MML) structure in some cases.

In this specification and the like, a structure in which light-emitting layers in light-emitting devices of different colors (for example, red (R), green (G), and blue (B)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

In one embodiment of the present invention, fine patterning of an EL layer is performed without a metal mask. This allows fabrication of a display device with high resolution and a high aperture ratio that has been difficult to achieve. Moreover, EL layers can be formed separately, enabling the display device to perform extremely clear display with a high contrast and high display quality.

Here, description is made on the case where EL layers in light-emitting devices of two colors are separately formed, for simplicity. First, a stack of a first EL film and a first sacrificial film is formed to cover two pixel electrodes. Next, the first sacrificial film is etched to form a first sacrificial layer that includes a region overlapping with one pixel electrode (a first pixel electrode). Then, the first EL film is etched to form a first EL layer including a region overlapping with the first sacrificial layer and to expose the other pixel electrode (a second pixel electrode). Thus, the first EL layer over the first pixel electrode and the first sacrificial layer over the first EL layer can be formed.

Next, a stack of a second EL film and a second sacrificial film is formed. Then, the second sacrificial film is etched to form a second sacrificial layer including a region overlapping with the second pixel electrode. Subsequently, the second EL film is etched to form a second EL layer including a region overlapping with the second sacrificial layer. Thus, the second EL layer over the second pixel electrode and the second sacrificial layer over the second EL layer can be formed. In this manner, the first EL layer and the second EL layer can be formed separately.

Next, an insulating film covering a top surface and a side surface of the first sacrificial layer, a side surface of the first EL layer, a top surface and a side surface of the second sacrificial layer, and a side surface of the second EL layer is formed. Then, the insulating film is etched to form a protective insulating layer including a region in contact with the side surface of the first EL layer and a region in contact with the side surface of the second EL layer and to expose the first sacrificial layer and the second sacrificial layer. Finally, the first sacrificial layer and the second sacrificial layer are removed and a common electrode is formed, whereby light-emitting devices of two colors can be formed separately.

Providing the protective insulating layer on the side surface of the first EL layer and the side surface of the second EL layer can inhibit oxygen, moisture, or constituent elements thereof from entering the inside of the EL layer from the side surface of the EL layer, whereby a highly reliable display device can be provided.

Furthermore, by repeating the above-described steps, EL layers in light-emitting devices of three or more colors can be separately formed; accordingly, a display device including light-emitting devices of three colors or four or more colors can be achieved.

It is difficult to set the distance between the EL layers for different colors to be less than m by a formation method using a metal mask, for example; however, by the above method, the distance can be decreased to 3 m or less, 2 m or less, or 1 m or less. For example, with the use of an exposure apparatus for LSI, the distance can be decreased to 500 nm or less, 200 nm or less, 100 nm or less, or 50 nm or less. Accordingly, the area of a non-light-emitting region that may exist between two light-emitting devices can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern, which causes a reduction in an effective area that can be used as a light-emitting region with respect to the entire pattern area. By contrast, in the above fabrication method, a film deposited to have a uniform thickness is processed to form a pattern, which enables a uniform thickness in the pattern; thus, even with a fine pattern, almost the entire area can be used as a light-emitting region. Therefore, the above fabrication method makes it possible to achieve both high resolution and a high aperture ratio.

As described above, with the above fabrication method, a display device in which minute light-emitting devices are integrated can be obtained, and it is not necessary to conduct a pseudo improvement in resolution with a unique pixel arrangement method such as PenTile arrangement, for example; therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called stripe arrangement where R, G, and B are arranged in one direction.

More specific structure examples and fabrication method examples of a display device of one embodiment of the present invention will be described below with reference to drawings.

Structure Example 1

FIG. 1A is a schematic top view of a display device 100 of one embodiment of the present invention. The display device 100 includes a plurality of light-emitting devices 110R exhibiting red, a plurality of light-emitting devices 110G exhibiting green, and a plurality of light-emitting devices 110B exhibiting blue. In FIG. 1A, light-emitting regions of the light-emitting devices are denoted by R, G, and B to easily differentiate the light-emitting devices.

The light-emitting devices 110R, the light-emitting devices 110G, and the light-emitting devices 110B are arranged in a matrix. FIG. 1A illustrates what is called stripe arrangement, in which the light-emitting devices of the same color are arranged in one direction. Note that the arrangement method of the light-emitting devices is not limited thereto; another arrangement method such as delta arrangement, zigzag arrangement, or PenTile arrangement may also be used.

As the light-emitting devices 110R, the light-emitting devices 110G, and the light-emitting devices 110B, EL devices such as OLEDs (Organic Light Emitting Diodes) or QLEDs (Quantum-dot Light Emitting Diodes) are preferably used. Examples of a light-emitting substance contained in the EL device include a substance that emits fluorescent light (a fluorescent material), a substance that emits phosphorescent light (a phosphorescent material), an inorganic compound (a quantum dot material or the like), and a substance that exhibits thermally activated delayed fluorescence (a thermally activated delayed fluorescent (TADF) material).

Figure 1B:
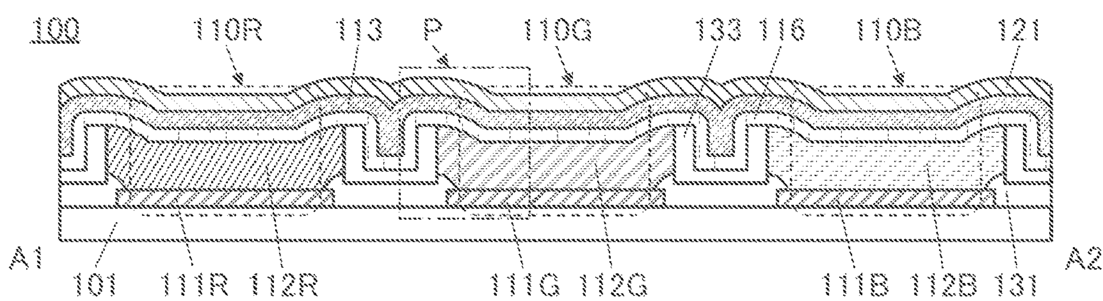

FIG. 1B is a schematic cross-sectional view taken along the dashed-dotted line A1-A2 in FIG. 1A.

FIG. 1B illustrates cross sections of the light-emitting device 110R, the light-emitting device 110G, and the light-emitting device 110B provided over the substrate 101. The light-emitting device 110R includes a pixel electrode 111R, an EL layer 112R, a layer 116, and a common electrode 113. The light-emitting device 110G includes a pixel electrode 111G, an EL layer 112G, the layer 116, and the common electrode 113. The light-emitting device 1101B includes a pixel electrode 111B, an EL layer 112B, the layer 116, and the common electrode 113.

Note that in the case where the light-emitting device 110R, the light-emitting device 110G, and the light-emitting device 110B are not distinguished from one another or are collectively called, the light-emitting devices are referred to as light-emitting devices 110 in some cases. Similarly, in the case where the pixel electrode 111R, the pixel electrode 111G, and the pixel electrode 111B are not distinguished from one another or are collectively called, the pixel electrodes are referred to as pixel electrodes 111 in some cases. In the case where the EL layer 112R, the EL layer 112G, and the EL layer 112B not distinguished from one another or are collectively called, the EL layers are referred to as EL layers 112 in some cases. Note that the same applies to other components in some cases.

The light-emitting device 110R includes the EL layer 112R between the pixel electrode 111R and the common electrode 113. The EL layer 112R contains at least a light-emitting organic compound that emits light with intensity in a red wavelength range. The light-emitting device 110G includes the EL layer 112G between the pixel electrode 111G and the common electrode 113. The EL layer 112G contains at least alight-emitting organic compound that emits light with intensity in a green wavelength range. The light-emitting device 110B includes the EL layer 112B between the pixel electrode 111B and the common electrode 113. The EL layer 112B contains at least a light-emitting organic compound that emits light with intensity in a blue wavelength range. The EL layer 112R, the EL layer 112G, and the EL layer 112B emit light of different colors.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer).

The light-emitting device 110R includes the layer 116 between the EL layer 112R and the common electrode 113. The light-emitting device 110G includes the layer 116 between the EL layer 112G and the common electrode 113. The light-emitting device 110B includes the layer 116 between the EL layer 112B and the common electrode 113.

The layer 116 can be a layer containing a substance having a high carrier-injection property. For example, the layer 116 can function as an electron-injection layer when a substance having a high electron-injection property is used for the layer 116. Note that the function of the layer 116 is not limited to the function of an electron-injection layer. For example, by using a substance having a high hole-injection property for the layer 116, a function of a hole-injection layer can be given to the layer 116. Note that the layer 116 is not necessarily provided.

The layer 116 is provided as a continuous layer common to the light-emitting devices. By providing the common layer 116 for the light-emitting devices, the manufacturing process can be simplified and the manufacturing cost can be reduced.

The pixel electrode 111R, the pixel electrode 111G, and the pixel electrode 111B are provided for the respective light-emitting devices. The common electrode 113 is provided as a continuous layer shared by the light-emitting devices. A conductive film that has a property of transmitting visible light is used for either the respective pixel electrodes or the common electrode 113, and a reflective conductive film is used for the other. The light-transmitting pixel electrodes and the reflective common electrode 113 offer a bottom-emission display device, whereas the reflective pixel electrodes and the light-transmitting common electrode 113 offer a top-emission display device. Note that when both the pixel electrodes and the common electrode 113 transmit light, a dual-emission display device can be obtained.

Note that FIG. 1A and the like illustrate an example in which the width of the pixel electrode 111 is smaller than the width of the EL layer 112, i.e., an end portion of the pixel electrode 111 is positioned inward from an end portion of the EL layer 112, but one embodiment of the present invention is not limited to this example. The width of the pixel electrode 111 may be larger than the width of the EL layer 112, i.e., the end portion of the pixel electrode 111 may be positioned outward from the end portion of the EL layer 112. Alternatively, the width of the pixel electrode 111 may be equal to the width of the EL layer 112, i.e., the end portion of the pixel electrode 111 may be aligned with the end portion of the EL layer 112.

The display device 100 includes an insulating layer 131. The insulating layer 131 is provided to cover end portions of the pixel electrode 111R, the pixel electrode 111G, and the pixel electrode 111B. The end portion of the insulating layer 131 preferably has a tapered shape.

In this specification and the like, a tapered shape indicates a shape in which at least part of a side surface of a structure is inclined to a substrate surface. For example, the angle formed between an inclined side surface and the substrate surface (also referred to as a taper angle) is preferably less than 90°.

The EL layer 112R, the EL layer 112G, and the EL layer 112B each include a region in contact with the top surface of the pixel electrode and a region in contact with the surface of the insulating layer 131. The end portions of the EL layer 112R, the EL layer 112G, and the EL layer 112B are positioned over the insulating layer 131.

As illustrated in FIG. 1B, there is a gap between the two EL layers of the light-emitting devices of different colors. In this manner, the EL layer 112R, the EL layer 112G, and the EL layer 112B are preferably provided so as not to be in contact with one another. This can suitably prevent unintentional light emission due to current flowing through the two adjacent EL layers. As a result, the contrast can be increased to achieve a display device with high display quality.

As illustrated in FIG. 1B, an insulating layer 133 is provided over the insulating layer 131 between two EL layers. The insulating layer 133 includes a region in contact with the side surface of the EL layer 112 and a region in contact with the top surface of the insulating layer 131. Specifically, the insulating layer 133 between the EL layer 112R and the EL layer 112G includes a region in contact with the side surface of the EL layer 112R and a region in contact with the side surface of the EL layer 112G. The insulating layer 133 between the EL layer 112G and the EL layer 112B includes a region in contact with the side surface of the EL layer 112G and a region in contact with the side surface of the EL layer 112B. Although not illustrated in FIG. 1B, the insulating layer 133 between the EL layer 112R and the EL layer 112B includes a region in contact with the side surface of the EL layer 112R and a region in contact with the side surface of the EL layer 112B.

The insulating layer 133 includes a region in contact with the side surface of the EL layer 112 and functions as a protective insulating layer of the EL layer 112. Providing the insulating layer 133 can inhibit oxygen, moisture, or constituent elements thereof from entering the inside of the EL layer 112 from the side surface of the EL layer 112, whereby a highly reliable display device can be provided. Furthermore, providing the insulating layer 133 can inhibit a component of the layer 116 from being attached to the side surface of the EL layer 112 and thus can suppress generation of leakage current in the light-emitting device 110.

Figure 2A:
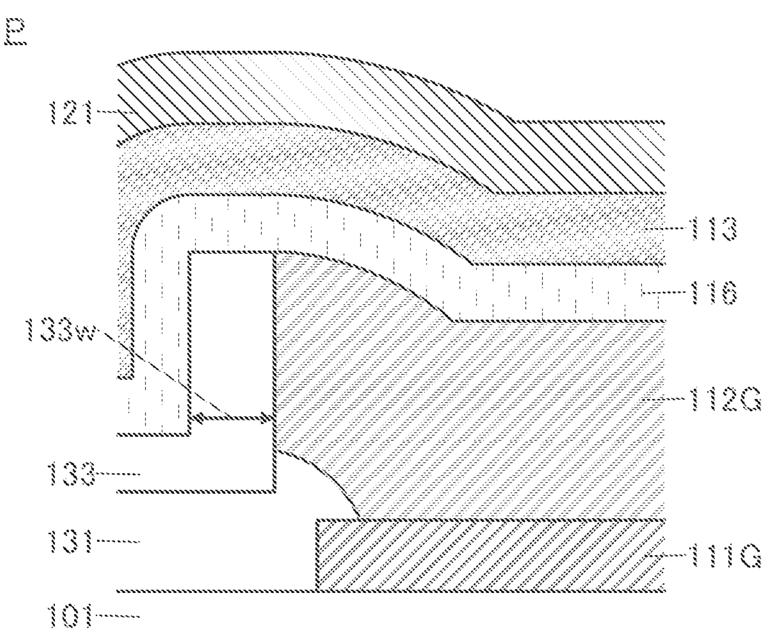
FIG. 2A and FIG. 2B are diagrams illustrating structure examples of a display device.

FIG. 2A is an enlarged view of a region P surrounded by a dashed-dotted line in FIG. 1B. Here, when the width 133*w* of the insulating layer 133 in the region in contact with the side surface of the EL layer 112 is large, the distance between the EL layers 112 is increased and the aperture ratio is lowered in some cases. When the width 133*w* of the insulating layer 133 is small, the effect of inhibiting oxygen, moisture, or constituent elements thereof from entering the inside of the EL layer 112 from the side surface of the EL layer 112 becomes small in some cases. The width 133*w* of the insulating layer 133 in the region in contact with the side surface of the EL layer 112 is preferably greater than or equal to 3 nm and less than or equal to 200 nm, further preferably greater than or equal to 3 nm and less than or equal to 150 nm, still further preferably greater than or equal to 5 nm and less than or equal to 150 nm, yet further preferably greater than or equal to 5 nm and less than or equal to 100 nm, yet still further preferably greater than or equal to 10 nm and less than or equal to 100 nm, yet still further preferably greater than or equal to 10 nm and less than or equal to 50 nm. When the width 133*w* of the insulating layer 133 is within the above-described range, a highly reliable display device with a high aperture ratio can be obtained.

As the width 133*w* of the insulating layer 133, a width of the insulating layer 133 in a region being in contact with the side surface of the EL layer 112 and sandwiched between the EL layer 112G and the layer 116 can be used.

For the insulating layer 133, aluminum oxide, magnesium oxide, hafnium oxide, gallium oxide, indium gallium zinc oxide, silicon oxide, silicon oxynitride, silicon nitride, silicon nitride oxide, or the like can be used, for example. Note that the insulating layer 133 may be formed by stacking some of these.

Note that in this specification, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 133, a sputtering method, a chemical vapor deposition (CVD) method, a molecular beam epitaxy (MBE) method, a pulsed laser deposition (PLD) method, an atomic layer deposition (ALD) method, or the like can be used. An ALD method achieving favorable coverage can be suitably used for forming the insulating layer 133.

Although FIG. 1B and the like illustrate an example of the display device 100 in which the height of an end surface of the insulating layer 133 in contact with the EL layer 112G is the same as the height of the top surface of the EL layer 112G, one embodiment of the present invention is not limited to this example. The height of the end surface of the insulating layer 133 in contact with the EL layer 112G may be different from the height of the top surface of the EL layer 112G.

Note that in this specification and the like, an end surface of a layer refers to a side surface of the layer in the case where a surface in contact with a surface where the layer is to be formed is regarded as a bottom surface. For example, the end surface of the insulating layer 133 refers to a side surface of the insulating layer 133 in the case where a surface in contact with the EL layer 112, which is a surface where the insulating layer 133 is to be formed, is regarded as a bottom surface. Furthermore, in this specification and the like, the height of an end surface of a layer refers to the height from a substrate to the highest portion of the end surface of the layer. The height of a top surface of a layer refers to the height from a substrate to the highest portion of the top surface of the layer.

The layer 116 is provided to cover the insulating layer 133 and the EL layer 112. The layer 116 includes regions in contact with the top surface and the end surface of the insulating layer 133 and a region in contact with the top surface of the EL layer 112.

As illustrated in FIG. 2A, the height of the insulating layer 131 in a region overlapping with the insulating layer 133 is lower than the height of the insulating layer 131 in a region overlapping with the EL layer 112G in some cases. Note that the height of the insulating layer 131 in the region overlapping with the insulating layer 133 may be the same or substantially the same as the height of the insulating layer 131 in the region overlapping with the EL layer 112G. Note that in this specification and the like, the heights are substantially the same means that one of the compared heights is greater than or equal to 0.8 and less than or equal to 1.2 with respect to the other height.

A structure example of a light-emitting device is described. Here, the light-emitting device 110G is described as an example.

Figure 2B:
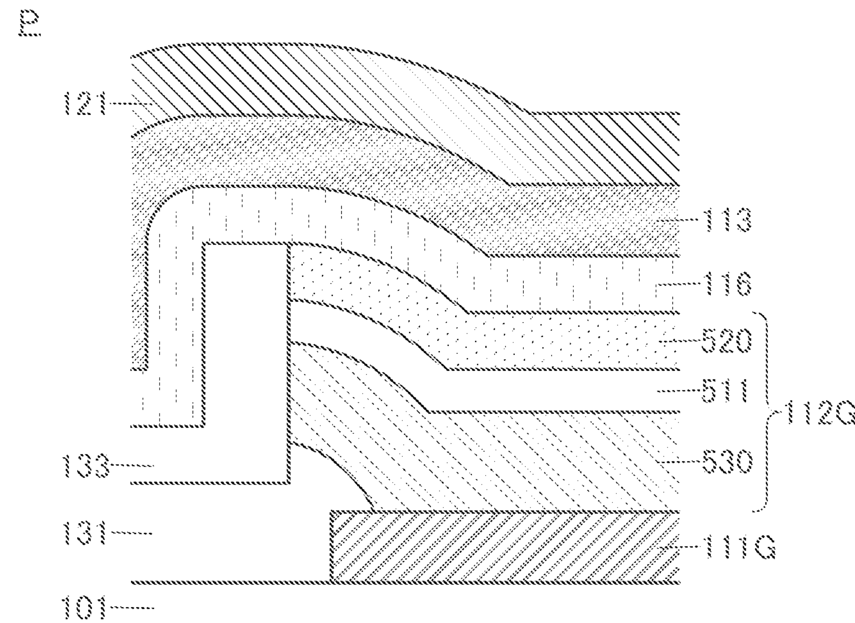

FIG. 2B illustrates a structure example of the light-emitting device 110G. The light-emitting device 110G includes the EL layer 112G and the layer 116 between a pair of electrodes (the pixel electrode 111G and the common electrode 113). The EL layer 112G can include a plurality of layers such as a layer 530, a light-emitting layer 511, and a layer 520. The light-emitting layer 511 contains a light-emitting compound, for example.

The layer 530 can include one or more of a carrier-injection layer and a carrier-transport layer. The carrier-transport layer may have a stacked-layer structure of a carrier-injection layer and a carrier-transport layer over the carrier-injection layer, for example. The carrier-transport layer is a layer containing a substance with a high carrier-transport property. The layer 520 is a layer containing a substance with a high carrier-transport property.

For example, in a light-emitting device where the pixel electrode 111 is an anode and the common electrode 113 is a cathode, the layer 530 can be a layer containing a substance with a high hole-transport property (hereinafter referred to as a hole-transport layer), the layer 520 can be a layer containing a substance with a high electron-transport property (hereinafter referred to as an electron-transport layer), and the layer 116 can be a layer containing a substance with a high electron-injection property (hereinafter referred to as an electron-injection layer). The layer 530 may have a stacked-layer structure of a layer containing a substance with a high hole-injection property (hereinafter referred to as a hole-injection layer) and a hole-transport layer over the hole-injection layer.

For another example, in a light-emitting device where the pixel electrode 111 is a cathode and the common electrode 113 is an anode, the layer 530 can be an electron-transport layer, the layer 520 can be a hole-transport layer, and the layer 116 can be a hole-injection layer. The layer 530 may have a stacked-layer structure of an electron-injection layer and an electron-transport layer over the electron-injection layer.

Here, a specific structure example of a light-emitting device is described below.

The light-emitting device includes at least the light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an inkjet method, a coating method, or the like.

For example, the light-emitting device can include one or more of a hole-injection layer, ahole-transport layer, ahole-blocking layer, an electron-blocking layer, an electron-transport layer, and an electron-injection layer.

The hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by an electron-injection layer, to a light-emitting layer. The electron-transport layer is a layer containing an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used.

Alternatively, as the above-described electron-injection layer, an electron-transport material may be used. For example, a compound having an unshared electron pair and having an electron deficient heteroaromatic ring skeleton can be used as the material having an electron-transport property. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

The structure illustrated in FIG. 2B in which the layer 530, the light-emitting layer 511, the layer 520, and the layer 116 are included between the pair of electrodes (the pixel electrode 111G and the common electrode 113) can function as a single light-emitting unit, and the structure is referred to as a single structure in this specification and the like.

Providing the insulating layer 133 in contact with the side surface of the EL layer 112 can inhibit oxygen, moisture, or a constituent element thereof from entering the inside of the layer 530, the light-emitting layer 511, and the layer 520 from the side surfaces of the layer 530, the light-emitting layer 511, and the layer 520, whereby a highly reliable display device can be provided. The insulating layer 133 is preferably in contact with at least aside surface of the light-emitting layer 511.

Figure 3A:
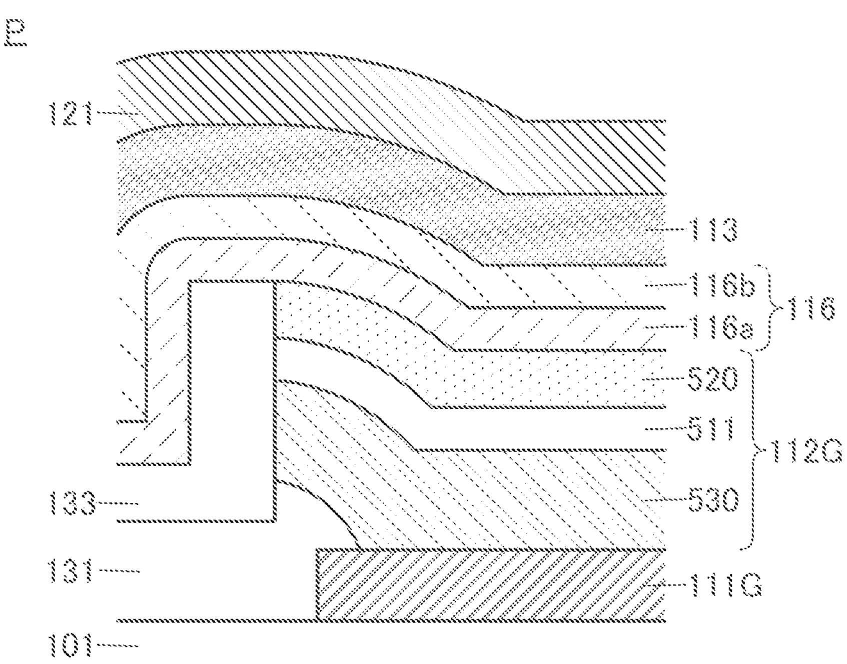
FIG. 3A and FIG. 3B are diagrams illustrating structure examples of a display device.

The layer 116 may have a stacked-layer structure as illustrated in FIG. 3A. FIG. 3A illustrates an example in which the layer 116 has a stacked-layer structure of a layer 116*a* and a layer 116*b* over the layer 116*a*.

For example, in a light-emitting device where the pixel electrode 111 is an anode and the common electrode 113 is a cathode, the layer 116*a* can be an electron-transport layer and the layer 116*b* can be an electron-injection layer. The layer 520 functioning as an electron-transport layer, the layer 116*a* functioning as an electron-transport layer, and the layer 116*b* functioning as an electron-injection layer can be stacked in this order between the light-emitting layer 511 and the common electrode 113. In that case, two electron-transport layers are stacked. As compared with the case where an electron-transport layer with a desired thickness is formed by only the layer 520, in the case where the electron-transport layer is formed by two layers, the layer 520 and the layer 116*a*, a step caused by the EL layer 112G is small and a step coverage with a layer (e.g., the common electrode 113) formed over the EL layer 112G is improved, whereby defects such as disconnection and a void can be inhibited from being generated in the layer.

For example, in a light-emitting device where the pixel electrode 111 is a cathode and the common electrode 113 is an anode, the layer 116*a* can be a hole-transport layer and the layer 116*b* can be a hole-injection layer. The layer 520 functioning as a hole-transport layer, the layer 116*a* functioning as a hole-transport layer, and the layer 116*b* functioning as a hole-injection layer can be stacked in this order between the light-emitting layer 511 and the common electrode 113. In that case, two hole-transport layers are stacked. As compared with the case where a hole-transport layer with a desired thickness is formed by only the layer 520, in the case where the hole-transport layer is formed by two layers, the layer 520 and the layer 116*a*, a step caused by the EL layer 112G is small and a step coverage with a layer (e.g., the common electrode 113) formed over the EL layer 112G is improved, whereby defects such as disconnection and a void can be inhibited from being generated in the layer.

Note that the layer 116*a* may have a stacked-layer structure of two or more layers. In addition, the layer 116*b* may have a stacked-layer structure of two or more layers.

Figure 3B:
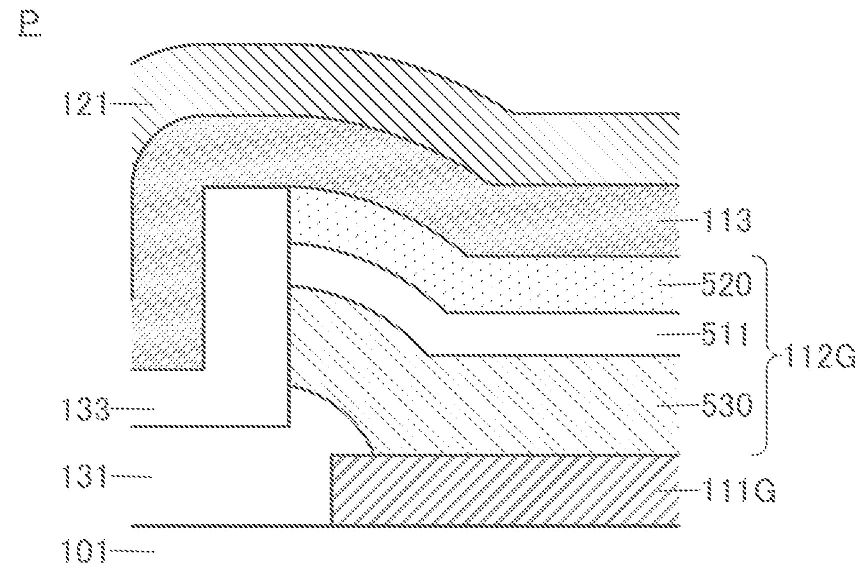

Although FIG. 1A and the like illustrate a structure example in which the display device 100 includes the layer 116, a structure in which the layer 116 is not provided may be employed as illustrated in FIG. 3B. In the case where the layer 116 is not provided, the common electrode 113 is provided in contact with the insulating layer 133 and the EL layer 112G. The common electrode 113 includes regions in contact with the top surface and the end surface of the insulating layer 133 and a region in contact with the top surface of the EL layer 112G. Providing the insulating layer 133 on the side surface of the EL layer 112 can inhibit the common electrode 113 from being in contact with the side surface of the EL layer 112, and thus can inhibit a short circuit of the light-emitting device 110. In particular, providing the insulating layer 133 on the side surface of the light-emitting layer 511 is preferable because a short circuit of the light-emitting device 110 can be inhibited.

Figure 4A:
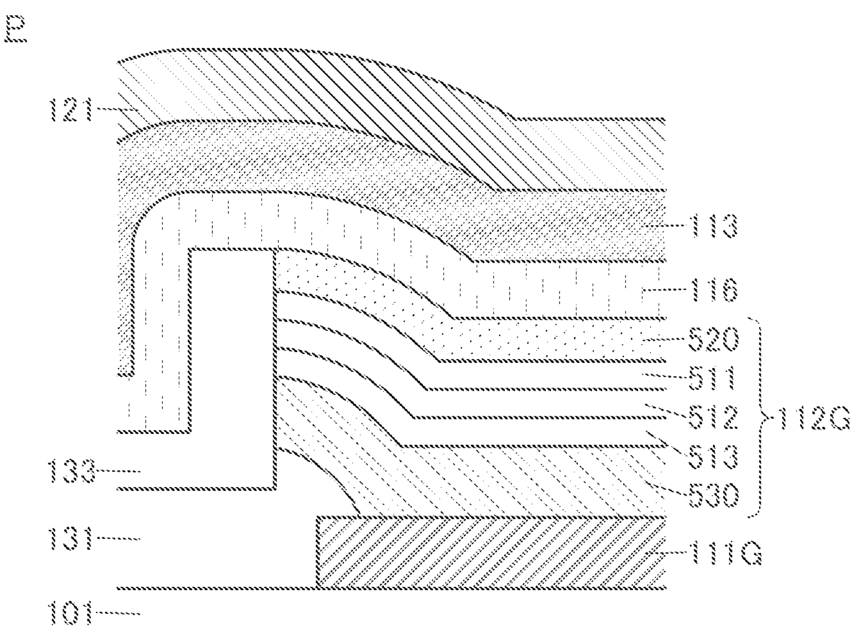
FIG. 4A and FIG. 4B are diagrams illustrating structure examples of a display device.

Although FIG. 2B illustrates a structure in which the light-emitting device 110G includes one light-emitting layer 511, one embodiment of the present invention is not limited to this example. The light-emitting device 110G may include a plurality of light-emitting layers. FIG. 4A illustrates a structure in which a plurality of light-emitting layers (the light-emitting layer 511, a light-emitting layer 512, and a light-emitting layer 513) are provided between the layer 530 and the layer 520. Note that the structure illustrated in FIG. 4A in which the plurality of light-emitting layers are provided between the layer 530 and the layer 520 can also be referred to as a single structure.

The light-emitting layer 511, the light-emitting layer 512, and the light-emitting layer 513 may contain the same light-emitting material or different light-emitting materials. Although FIG. 4A illustrates an example in which the light-emitting device 110G includes three light-emitting layers, one embodiment of the present invention is not limited to this example. The number of light-emitting layers included in the light-emitting device 110G is not particularly limited. The light-emitting device 110G may include two light-emitting layers or four or more light-emitting layers.

Figure 4B:
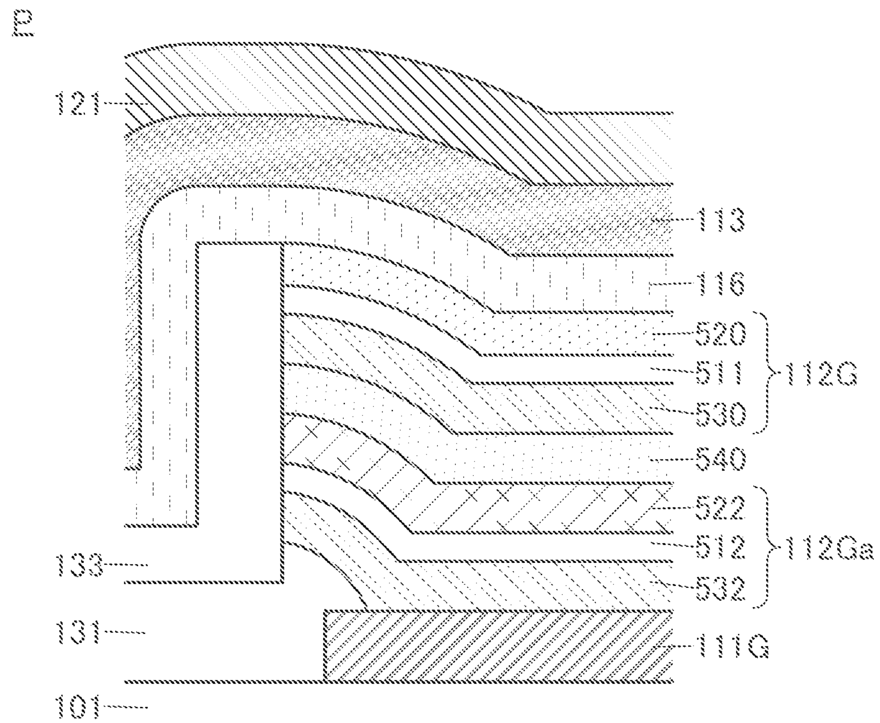

FIG. 4B illustrates a structure example that is different from the structures illustrated in FIG. 2B and FIG. 4A. The light-emitting device illustrated in FIG. 4B has a structure in which a plurality of light-emitting units (the EL layer 112G and an EL layer 112Ga) are connected in series with an intermediate layer 540 provided therebetween, and this structure is referred to as a tandem structure in this specification. In the tandem structure, the intermediate layer 540 functions as a charge-generation layer. The tandem structure enables the light-emitting device to emit light at high luminance. The tandem structure may be referred to as a stack structure.

The layer 522 in the EL layer 112Ga can include, for example, an electron-injection layer and an electron-transport layer. The layer 532 can include, for example, a hole-injection layer and a hole-transport layer.

In a light-emitting device in which the pixel electrode 111 is an anode and the common electrode 113 is a cathode, for example, the layer 532 can be a hole-transport layer and the layer 522 can be an electron-transport layer. The layer 532 may have a stacked-layer structure of a hole-injection layer and a hole-transport layer over the hole-injection layer. The layer 522 may have a stacked-layer structure of an electron-injection layer and an electron-transport layer over the electron-injection layer. The layer 530 can be a hole-transport layer, the layer 520 can be an electron-transport layer, and the layer 116 can be an electron-injection layer. The layer 530 may have a stacked-layer structure of a hole-injection layer and a hole-transport layer over the hole-injection layer.

In a light-emitting device in which the pixel electrode 111 is a cathode and the common electrode 113 is an anode, for example, the layer 532 can be an electron-transport layer and the layer 522 can be a hole-transport layer. The layer 532 may have a stacked-layer structure of an electron-injection layer and an electron-transport layer over the electron-injection layer. The layer 522 may have a stacked-layer structure of a hole-injection layer and a hole-transport layer over the hole-injection layer. The layer 530 can be an electron-transport layer, the layer 520 can be a hole-transport layer, and the layer 116 can be a hole-injection layer. The layer 530 may have a stacked-layer structure of an electron-injection layer and an electron-transport layer over the electron-injection layer.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Note that the light-emitting device 110G is described as an example with reference to FIG. 2A to FIG. 4B, and the light-emitting device 110R and the light-emitting device 110B can have the same structure as the light-emitting device 110G.

The emission color of the light-emitting device can be red, green, blue, cyan, magenta, yellow, white, or the like depending on the material that constitutes the EL layer 112. Furthermore, the color purity can be further increased when the light-emitting device has a microcavity structure.

The light-emitting device that emits white light preferably contains two or more kinds of light-emitting substances in the light-emitting layer. To obtain white light emission, two or more light-emitting substances are selected such that their emission colors are complementary colors. For example, when the emission color of a first light-emitting layer and the emission color of a second light-emitting layer have a relationship of complementary colors, it is possible to obtain the light-emitting device that emits white light as a whole. The same applies to a light-emitting device including three or more light-emitting layers.

The light-emitting layer preferably contains two or more of light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

Figure 1C:
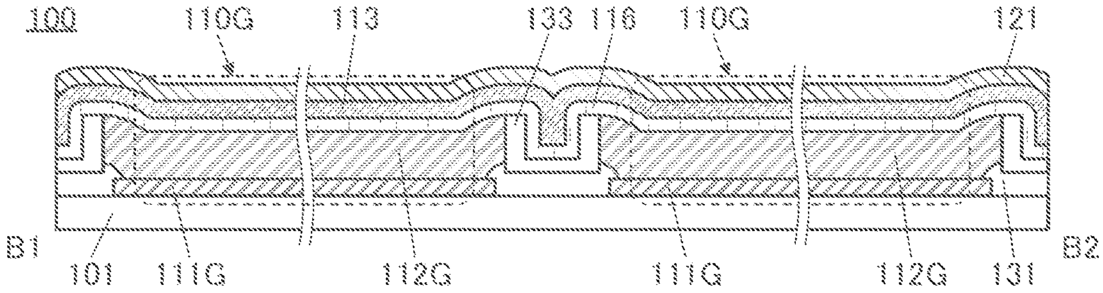
Figure 1D:
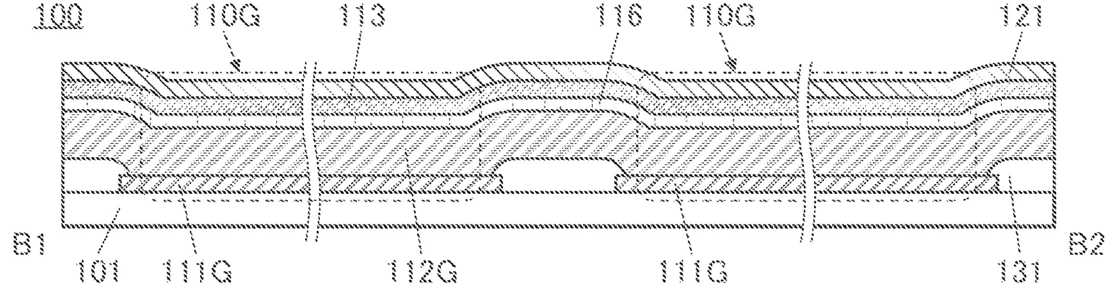

FIG. 1C is a schematic cross-sectional view taken along the dashed-dotted line B1-B2 in FIG. 1A. FIG. 1C illustrates an example in which the EL layer 112G is processed into an island shape. Note that the EL layer 112G may be processed into a belt-like shape so as to be continuous in the column direction as illustrated in FIG. 1D. When the EL layer 112G and the like are formed into a belt-like shape, a space for dividing them is unnecessary and the area of a non-light-emitting region between the light-emitting devices can be reduced, so that the aperture ratio can be increased. As illustrated in FIG. 1D, in the case where the EL layer 112G is one continuous layer, the insulating layer 133 is not necessarily provided between the EL layer 112G and the EL layer 112G which are adjacent to each other.

Note that FIG. 1C and FIG. 1D each illustrate the cross section of the light-emitting device 110G as an example; the light-emitting device 110R and the light-emitting device 110B can have a similar shape.

A protective layer 121 is provided over the common electrode 113 to cover the light-emitting device 110R, the light-emitting device 110G, and the light-emitting device 110B. The protective layer 121 has a function of preventing diffusion of impurities such as water into the light-emitting devices from above. Alternatively, the protective layer 121 preferably includes a layer having a function of capturing or fixing (also referred to as gettering) at least one of water and oxygen. Further preferably, a layer having a function of capturing or fixing hydrogen, a substance to which hydrogen is bonded (e.g., water ($H_2O$)), oxygen, hydrogen, and the like is included, which is suitable because oxygen, hydrogen, and the like that can be included in the light-emitting devices can be adsorbed.

The protective layer 121 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. This structure enables the top surface of the organic insulating film to be flat, and accordingly, coverage with the inorganic insulating film thereover is improved, leading to an improvement in barrier properties. Moreover, this structure is preferable because when a component (e.g., a color filter, an electrode of a touch sensor, a lens array, or the like) is provided above the protective layer 121, the flat top surface of the protective layer 121 allows the component to be less affected by an uneven shape caused by the lower components.

Figure 5A:
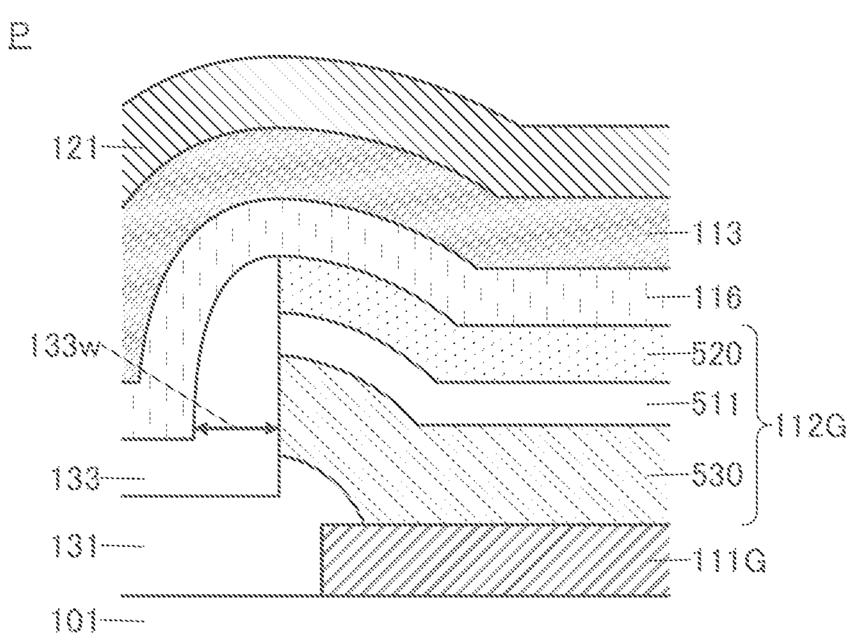
FIG. 5A and FIG. 5B are diagrams illustrating structure examples of a display device.
Figure 5B:
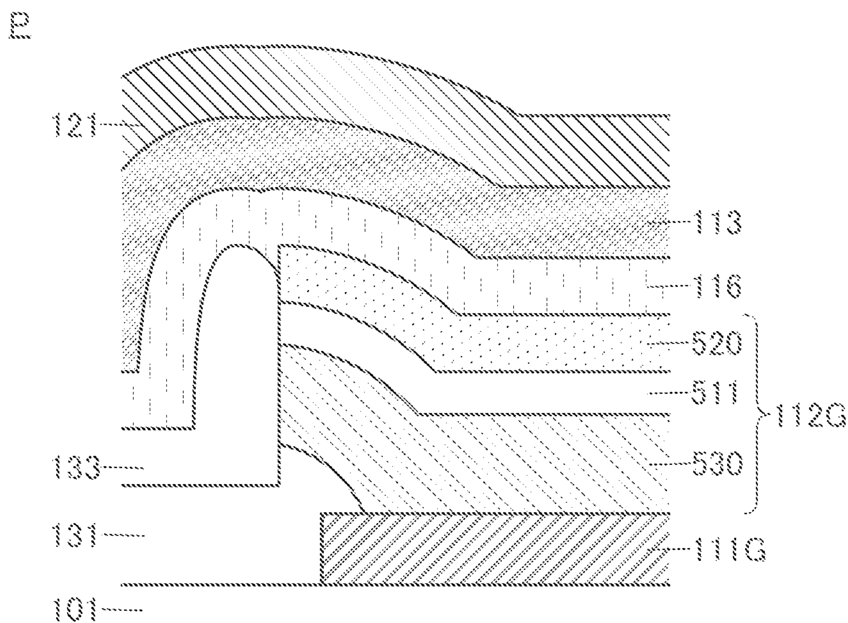

Although FIG. 2A and the like illustrate an example in which the end surface of the insulating layer 133 is flat, one embodiment of the present invention is not limited to this example. The end surface of the insulating layer 133 may be curved as illustrated in FIG. 5A. Alternatively, the end surface of the insulating layer 133 may have a projecting shape as illustrated in FIG. 5B.

Note that in the case where the width of the insulating layer 133 is not constant as illustrated in FIG. 5A and the like, the largest width of a region being in contact with the side surface of the EL layer 112 and sandwiched between the EL layer 112G and the layer 116 is regarded as the width 133*w* of the insulating layer 133. The width 133*w* of the insulating layer 133 is preferably set within the above-described range.

A structure example of a display device different from Structure example 1 is described below. Note that description of the same portions as those in Structure example 1 shown above is omitted in some cases.

Structure Example 2

FIG. 6A and FIG. 6B are schematic cross-sectional views of a display device 100A of one embodiment of the present invention. FIG. 1A can be referred to for the schematic top view of the display device 100A. FIG. 6A is a schematic cross-sectional view taken along the dashed-dotted line A1-A2 in FIG. 1A. FIG. 6B is a schematic cross-sectional view taken along the dashed-dotted line B1-B2 in FIG. 1A. FIG. 6C is an enlarged view of a region Q surrounded by the dashed-dotted line in FIG. 6A.

The display device 100A is different from the above-described display device 100 mainly in including a portion where the thickness of the insulating layer 131 in a region overlapping with the insulating layer 133 is equal or substantially equal to the thickness of the insulating layer 131 in a region overlapping with the EL layer 112G.

When the display device 100A includes a portion where the thickness of the insulating layer 131 in the region overlapping with the insulating layer 133 is equal or substantially equal to the thickness of the insulating layer 131 in the region overlapping with the EL layer 112G, a step between the top surface of the EL layer 112G and the top surface of the insulating layer 131 is small. Accordingly, the step coverage with a layer formed over the insulating layer 131 (e.g., the insulating layer 133) is improved, which can inhibit defects such as disconnection and a void from being generated in the layer.

Also in the display device 100A, the EL layer 112G may be processed into a band-like shape to be continuous in the column direction as illustrated in FIG. 1D.

Structure Example 3

Figure 7A:
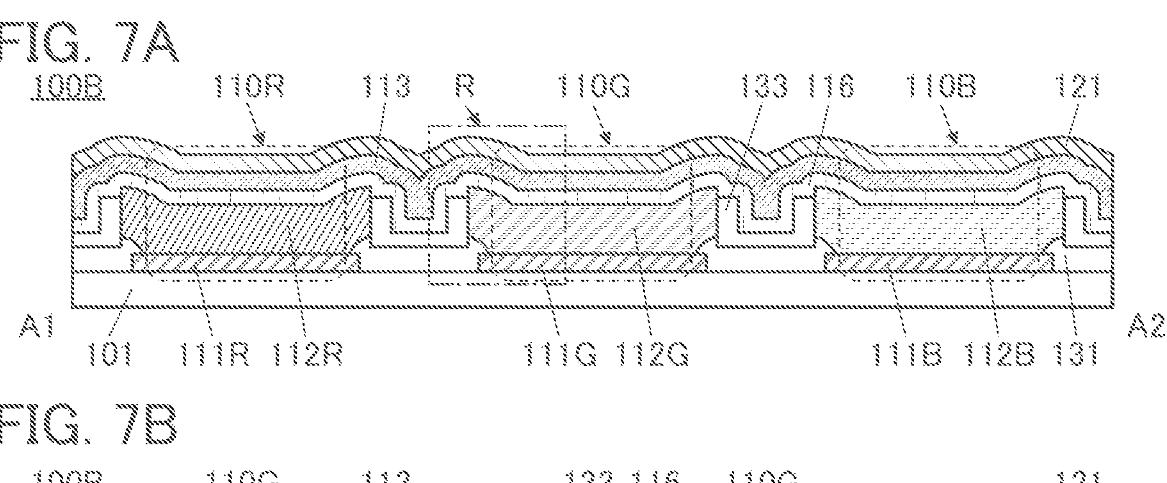
FIG. 7A to FIG. 7C are diagrams illustrating a structure example of a display device.
Figure 7B:
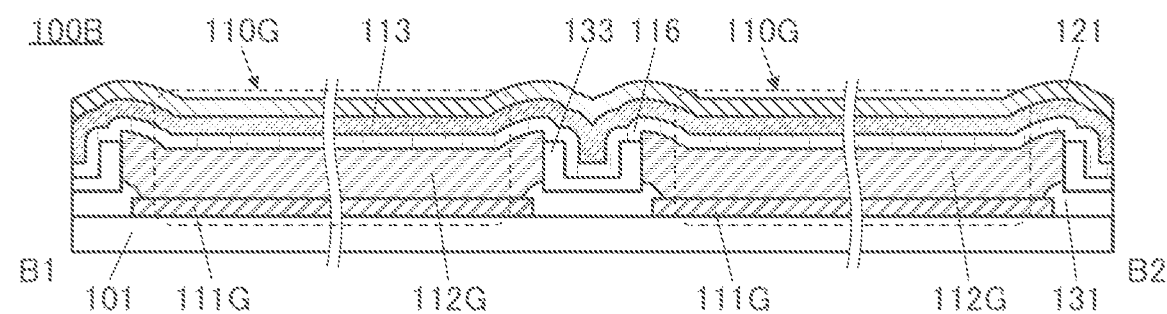
Figure 7C:
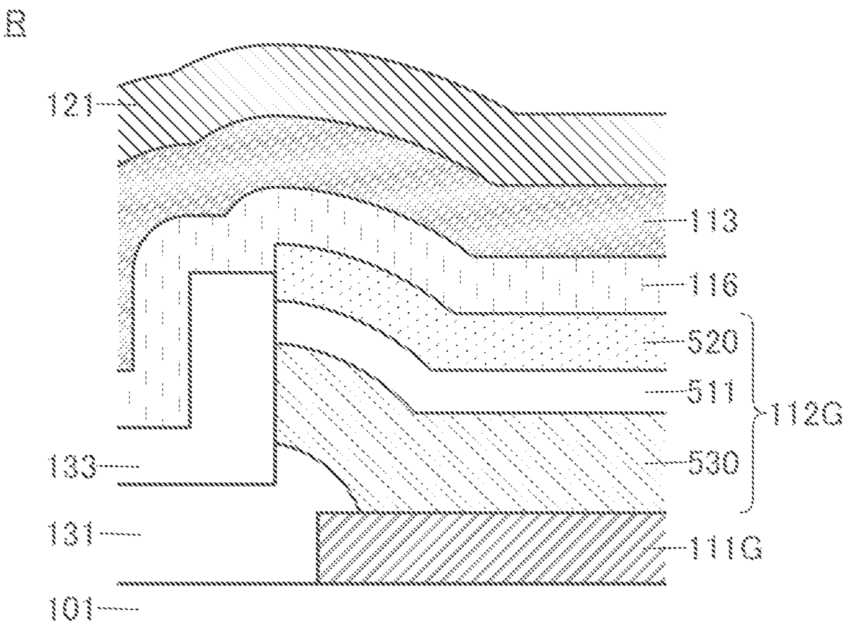

FIG. 7A and FIG. 7B are schematic cross-sectional views of a display device 100B of one embodiment of the present invention. FIG. 1A can be referred to for the schematic top view of the display device 100B. FIG. 7A is a schematic cross-sectional view taken along the dashed-dotted line A1-A2 in FIG. 1A. FIG. 7B is a schematic cross-sectional view taken along the dashed-dotted line B1-B2 in FIG. 1A. FIG. 7C is an enlarged view of a region R surrounded by the dashed-dotted line in FIG. 7A.

The display device 100B is different from the above-described display device 100 mainly in that the height of the end surface of the insulating layer 133 in contact with the EL layer 112G is different from the height of the top surface of the EL layer 112G. In the display device 100B, the height of the end surface of the insulating layer 133 in contact with the EL layer 112G is lower than the height of the top surface of the EL layer 112G. It can be said that an end portion of the insulating layer 133 is in contact with the side surface of the EL layer 112G.

As illustrated in FIG. 7C, it is preferable that the insulating layer 133 be in contact with at least the side surface of the light-emitting layer 511. When the insulating layer 133 covers the side surface of the light-emitting layer 511, oxygen, moisture, or constituent elements thereof can be inhibited from entering the inside of the light-emitting layer 511 from the side surface of the light-emitting layer 511, whereby a highly reliable display device can be provided.

Also in the display device 100B, the EL layer 112G may be processed into a band-like shape to be continuous in the column direction as illustrated in FIG. 1D.

Structure Example 4

Figure 8A:
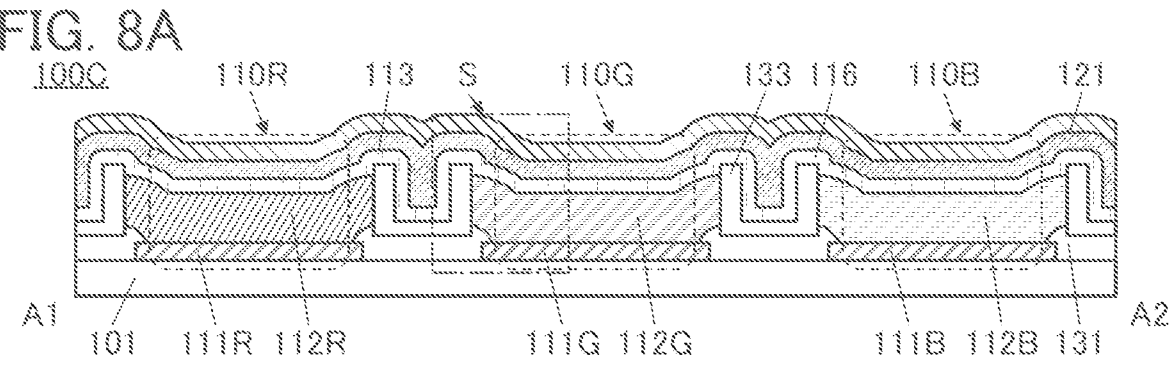
FIG. 8A to FIG. 8C are diagrams illustrating a structure example of a display device.
Figure 8B:
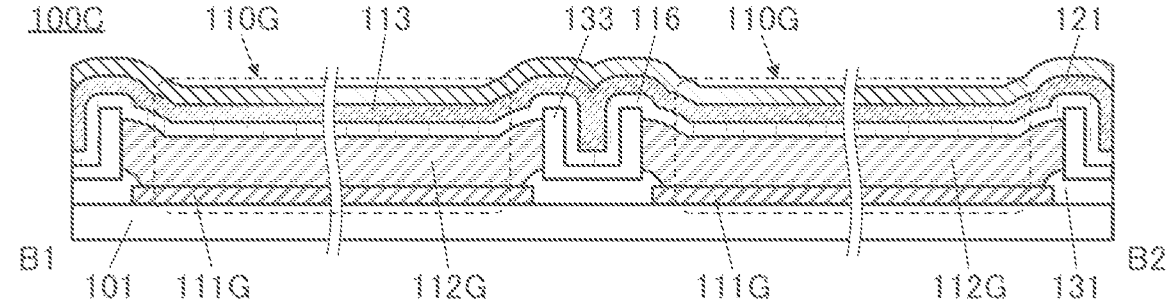
Figure 8C:
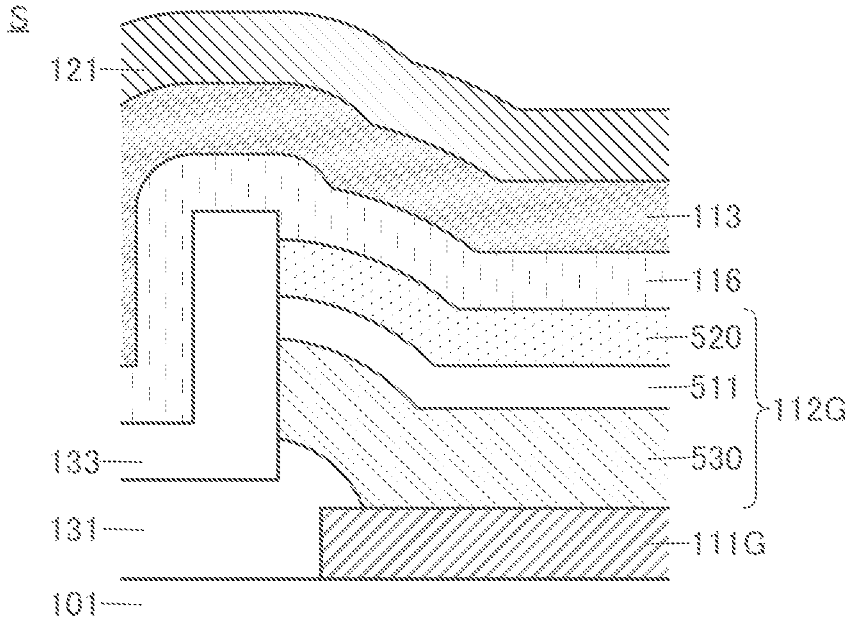

FIG. 8A and FIG. 8B are schematic cross-sectional views of a display device 100C of one embodiment of the present invention. FIG. 1A can be referred to for the schematic top view of the display device 100C. FIG. 8A is a schematic cross-sectional view taken along the dashed-dotted line A1-A2 in FIG. 1A. FIG. 8B is a schematic cross-sectional view taken along the dashed-dotted line B1-B2 in FIG. 1A. FIG. 8C is an enlarged view of a region S surrounded by the dashed-dotted line in FIG. 8A.

The display device 100C is different from the above-described display device 100 mainly in that the height of the end surface of the insulating layer 133 in contact with the EL layer 112G is higher than the height of the top surface of the EL layer 112G.

As illustrated in FIG. 8C, when the insulating layer 133 covers the side surfaces of the layer 520, the light-emitting layer 511, and the layer 530, oxygen, moisture, or constituent elements thereof can be inhibited from entering the inside of the layer 520, the light-emitting layer 511, and the layer 530 from the side surfaces of the layer 520, the light-emitting layer 511, and the layer 530, whereby a highly reliable display device can be provided.

Also in the display device 100C, the EL layer 112G may be processed into a band-like shape to be continuous in the column direction as illustrated in FIG. 1D.

Structure Example 5

FIG. 9A and FIG. 9B are schematic cross-sectional views of a display device 100D of one embodiment of the present invention. FIG. 1A can be referred to for the schematic top view of the display device 100D. FIG. 9A is a schematic cross-sectional view taken along the dashed-dotted line A1-A2 in FIG. 1A. FIG. 9B is a schematic cross-sectional view taken along the dashed-dotted line B1-B2 in FIG. 1A. FIG. 9C is an enlarged view of a region T surrounded by the dashed-dotted line in FIG. 9A.

The display device 100D is different from the above-described display device 100 mainly in that the layer 116 includes a region in contact with the top surface of the insulating layer 131. It is preferable that the insulating layer 133 be in contact with at least the side surface of the light-emitting layer 511. When the insulating layer 133 covers the side surface of the light-emitting layer 511, oxygen, moisture, or constituent elements thereof can be inhibited from entering the inside of the light-emitting layer 511 from the side surface of the light-emitting layer 511, whereby a highly reliable display device can be provided.

Also in the display device 100D, the EL layer 112G may be processed into a band-like shape to be continuous in the column direction as illustrated in FIG. 1D.

Structure Example 6

Figures 10A, 10B:
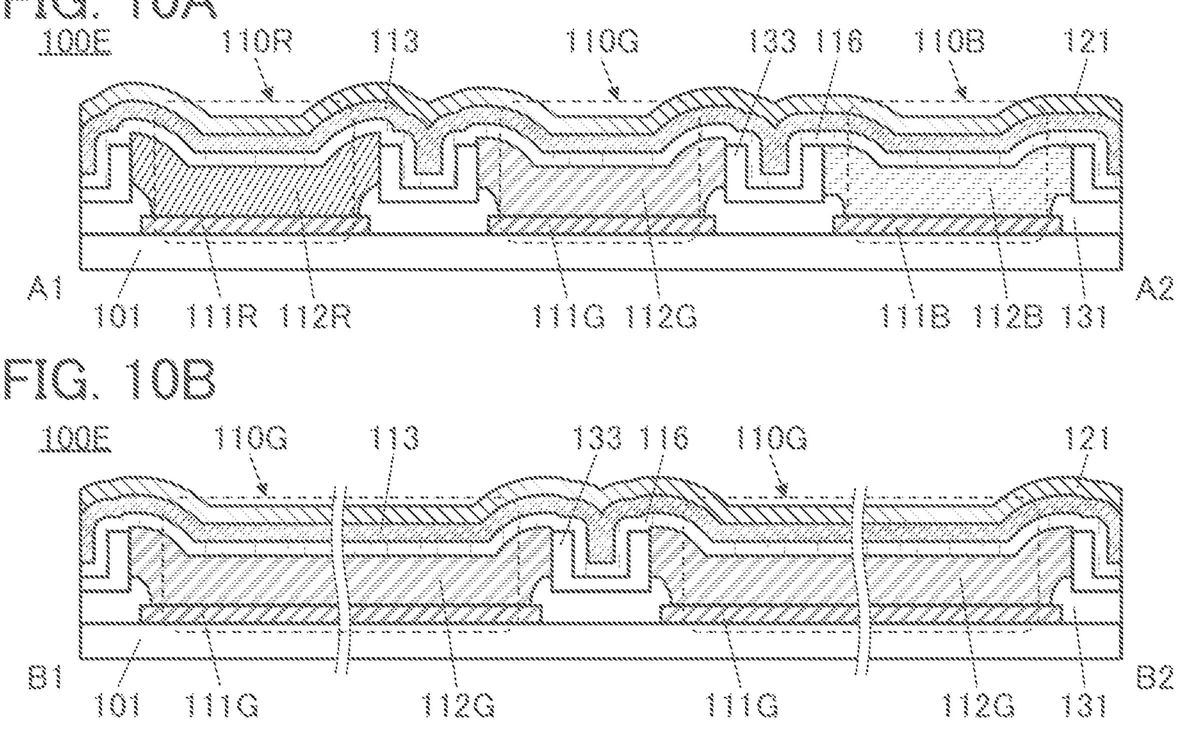
FIG. 10A and FIG. 10B are diagrams illustrating a structure example of a display device.
Figure 11:
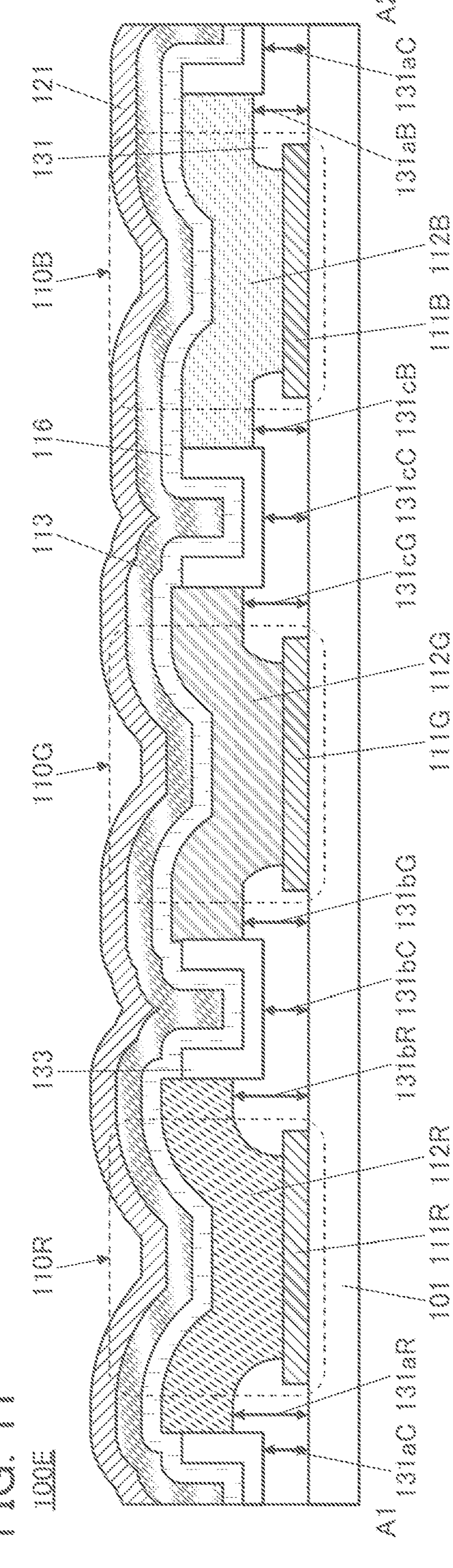
FIG. 11 is a diagram illustrating a structure example of a display device.

FIG. 10A and FIG. 10B are schematic cross-sectional views of a display device 100E of one embodiment of the present invention. FIG. 1A can be referred to for the schematic top view of the display device 100E. FIG. 10A is a schematic cross-sectional view taken along the dashed-dotted line A1-A2 in FIG. 1A. FIG. 10B is a schematic cross-sectional view taken along the dashed-dotted line B1-B2 in FIG. 1A. FIG. 11 is an enlarged view of FIG. 10A.

The display device 100E is different from the above-described display device 100 mainly in that the thickness of the insulating layer 131 differs among the light-emitting devices.

Between the light-emitting device 110R and the light-emitting device 110G, a height 131*b*G of the top surface of the insulating layer 131 in a region overlapping with the EL layer 112G is lower than a height 131*b*R of the top surface of the insulating layer 131 in a region overlapping with the EL layer 112R. A height 131*b*C of the top surface of the insulating layer 131 in a region overlapping with the insulating layer 133 is lower than the height 131*b*G.

Between the light-emitting device 110G and the light-emitting device 110B, a height 131*c*B of the top surface of the insulating layer 131 in a region overlapping with the EL layer 112B is lower than a height 131*c*G of the top surface of the insulating layer 131 in a region overlapping with the EL layer 112G. A height 131*c*C of the top surface of the insulating layer 131 in a region overlapping with the insulating layer 133 is lower than the height 131*c*B. Note that the height 131*c*G is equal or substantially equal to the above-described height 131*b*G.

Between the light-emitting device 110B and the light-emitting device 110R adjacent to the light-emitting device 110B, a height 131*a*B of the top surface of the insulating layer 131 in a region overlapping with the EL layer 112B is lower than a height 131*a*R of the top surface of the insulating layer 131 in a region overlapping with the EL layer 112R. A height 131*a*C of the top surface of the insulating layer 131 in a region overlapping with the insulating layer 133 is lower than the height 131*a*B. Note that the height 131*a*B is equal or substantially equal to the above-described height 131*c*B. The height 131*a*R is equal or substantially equal to the above-described height 131*b*R.

Note that in this specification and the like, a height of the top surface of the insulating layer 131 refers to the distance from the substrate 101 to the highest portion of a top surface of the insulating layer 131.

FIG. 11 and the like illustrate an example in which the height 131*b*G and the height 131*c*B of the top surface of the insulating layer 131 in a region overlapping with the EL layer 112G are lower than the height 131*a*R and the height 131*b*R of the top surface of the insulating layer 131 in a region overlapping with the EL layer 112R, and the height 131*c*B and the height 131*a*B of the top surface of the insulating layer 131 in a region overlapping with the EL layer 112B are lower than the height 131*b*G and the height 131*c*G of the top surface of the insulating layer 131 in a region overlapping with the EL layer 112G; however, one embodiment of the present invention is not limited to this example.

For example, a structure in which the height of the top surface of the insulating layer 131 in a region overlapping with the EL layer 112G is higher than the height of the top surface of the insulating layer 131 in a region overlapping with the EL layer 112R, and the height of the top surface of the insulating layer 131 in a region overlapping with the EL layer 112B is higher than the height of the top surface of the insulating layer 131 in a region overlapping with the EL layer 112G may be employed. The height of the top surface of the insulating layer 131 in a region overlapping with the EL layer can be made different by changing the order of forming the light-emitting device 110R, the light-emitting device 110G, and the light-emitting device 1101B, for example.

The height 131*a*C, the height 131*b*C, and the height 131*c*C of the top surface of the insulating layer 131 in a region overlapping with the insulating layer 133 may be equal or substantially equal to one another or may be different from one another.

The height of the end surface of the insulating layer 133 may be different between the light-emitting devices 110. FIG. 11 and the like illustrate an example in which the height of the end surface of the insulating layer 133 in contact with the EL layer 112R is lower than the height of the top surface of the EL layer 112R, the height of the end surface of the insulating layer 133 in contact with the EL layer 112G is lower than the height of the top surface of the EL layer 112G, and the height of the end surface of the insulating layer 133 in contact with the EL layer 112B is equal to the height of the top surface of the EL layer 112B; however, one embodiment of the present invention is not limited to this example. For example, any of the heights of the end surfaces of the insulating layer 133 may be lower than the height of the EL layer 112.

Also in the display device 100E, the EL layer 112G may be processed into a band-like shape to be continuous in the column direction.

Structure Example 7

Figure 12A:
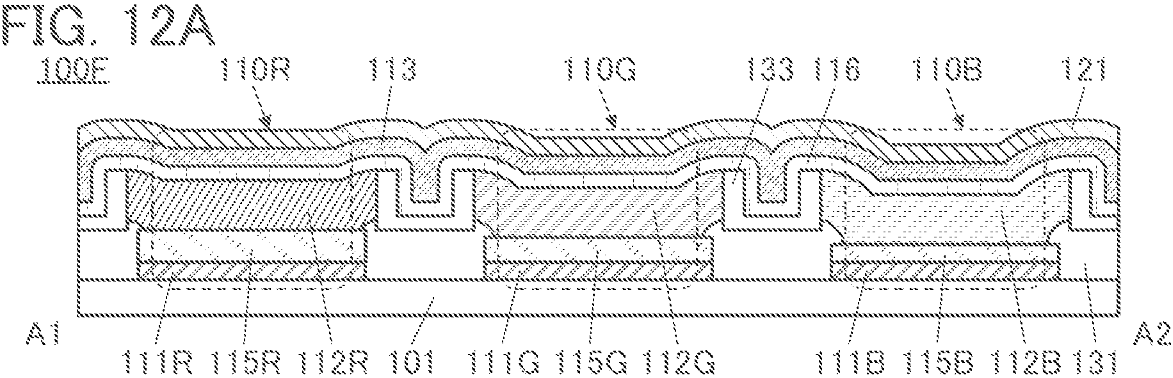
FIG. 12A to FIG. 12C are diagrams each illustrating a structure example of a display device.
Figure 12B:
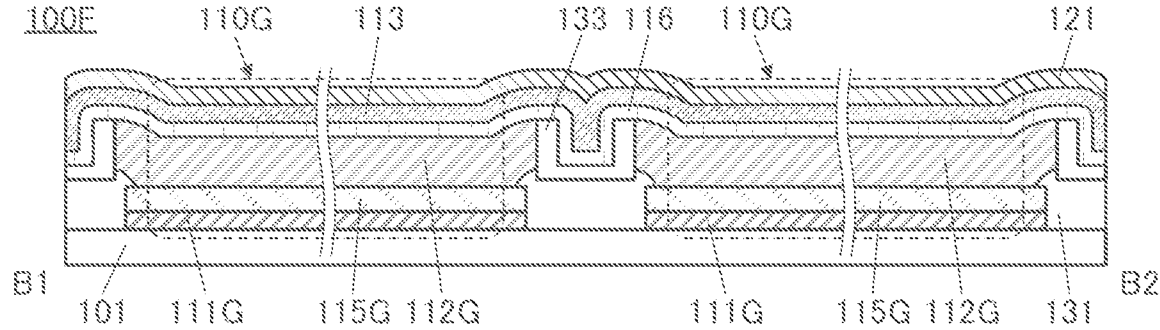

FIG. 12A and FIG. 12B are schematic cross-sectional views of a display device 100F of one embodiment of the present invention. FIG. 1A can be referred to for the schematic top view of the display device 100F. FIG. 12A is a schematic cross-sectional view taken along the dashed-dotted line A1-A2 in FIG. 1A. FIG. 12B is a schematic cross-sectional view taken along the dashed-dotted line B1-B2 in FIG. 1A.

The display device 100F is different from the above-described display device 100 mainly in the structure of the light-emitting device. The light-emitting device 110R includes an optical adjustment layer 115R between the pixel electrode 111R and the EL layer 112R. The light-emitting device 110G includes an optical adjustment layer 115G between the pixel electrode 111G and the EL layer 112G. The light-emitting device 110B includes an optical adjustment layer 115B between the pixel electrode 111B and the EL layer 112B.

The optical adjustment layer 115R, the optical adjustment layer 115G, and the optical adjustment layer 115B each have a property of transmitting visible light. The optical adjustment layer 115R, the optical adjustment layer 115G, and the optical adjustment layer 115B have different thicknesses. Thus, the optical path lengths of the light-emitting devices can differ from one another.

Here, a conductive film that has a property of reflecting visible light is used for the pixel electrode 111R, the pixel electrode 111G, and the pixel electrode 111B, and a conductive film that has properties of reflecting and transmitting visible light is used for the common electrode 113. Thus, the light-emitting devices have what is called a microcavity structure, thereby increasing the intensity of light with a specific wavelength. This can achieve a display device with high color purity.

A conductive material that has a property of transmitting visible light can be used for each of the optical adjustment layers. For example, a conductive oxide such as indium oxide, an indium tin oxide, an indium zinc oxide, zinc oxide, zinc oxide containing gallium, an indium tin oxide containing silicon, or an indium zinc oxide containing silicon can be used.

The optical adjustment layers may be formed using conductive films with different thicknesses or may have a single-layer structure, a two-layer structure, a three-layer structure, or the like, in the order of small thickness.

Note that the EL layer 112G may be processed into a band-like shape so as to be continuous in the column direction also in the display device 100F.

Structure Example 8

Figure 12C:
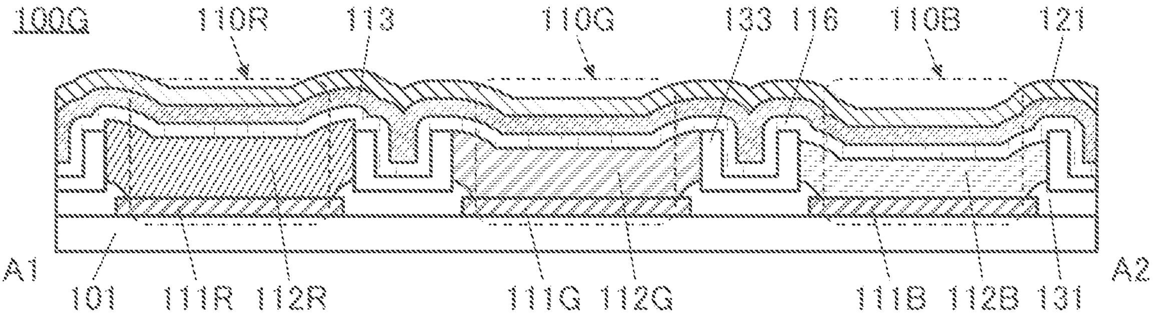

FIG. 12C is a schematic cross-sectional view of a display device 100G of one embodiment of the present invention. FIG. 1A can be referred to for the schematic top view of the display device 100G. FIG. 12C is a schematic cross-sectional view taken along the dashed-dotted line A1-A2 in FIG. 1A. FIG. 1C or FIG. 1D can be referred to for the schematic cross-sectional view taken along the dashed-dotted line B1-B2 in FIG. 1A.

The display device 100G illustrated in FIG. 12C is different from the above-described display device 100F mainly in not including the optical adjustment layers.

The display device 100G shows an example in which a microcavity structure is achieved with the thicknesses of the EL layer 112R, the EL layer 112G, and the EL layer 112B. Such a structure does not require an optical adjustment layer provided additionally, simplifying the process.

For example, in the display device 100G, the EL layer 112R of the light-emitting device 110R emitting light with the longest wavelength has the largest thickness, and the EL layer 112B of the light-emitting device 110B emitting light with the shortest wavelength has the smallest thickness.

Without limitation to this, the thicknesses of the EL layers can be adjusted in consideration of the wavelengths of light emitted from the light-emitting devices, the optical characteristics of the layers included in the light-emitting devices, the electrical characteristics of the light-emitting devices, and the like.

Note that FIG. 12C illustrates an example in which the height of the end surface of the insulating layer 133 in contact with the EL layer 112R is lower than the height of the top surface of the EL layer 112R, the height of the end surface of the insulating layer 133 in contact with the EL layer 112G is substantially equal to the height of the top surface of the EL layer 112G, and the height of the end surface of the insulating layer 133 in contact with the EL layer 112B is higher than the height of the top surface of the EL layer 112B; however, one embodiment of the present invention is not limited to this example.

Also in the display device 100G, the EL layer 112G may be processed into a band-like shape to be continuous in the column direction.

Fabrication Method Example 1

An example of a fabrication method of the display device of one embodiment of the present invention will be described below with reference to drawings. Description here is made using the display device 100E described in the above structure example as an example. FIG. 13A to FIG. 17D are schematic cross-sectional views in steps of the fabrication method of the display device described below.

Note that thin films that constitute the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of a thermal CVD method is a metal organic chemical vapor deposition (MOCVD) method.

Alternatively, thin films that constitute the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

The thin films constituting the display device can be processed by a photolithography method or the like. Besides, a nanoimprinting method, a sandblasting method, a lift-off method, or the like may be used for the processing of the thin films. Alternatively, island-shaped thin films may be directly formed by a deposition method using a blocking mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Exposure may be performed by liquid immersion exposure technique. As the light for the exposure, extreme ultraviolet (EUV) light or X-rays may be used. Furthermore, instead of the light for the exposure, an electron beam can be used. It is preferable to use extreme ultraviolet light, X-rays, or an electron beam because extremely minute processing can be performed. Note that a photomask is not needed when exposure is performed by scanning with a beam such as an electron beam.

For etching of the thin film, a dry etching method, a wet etching method, a sandblasting method, or the like can be used.

[Preparation for Substrate 101]

As a substrate 101, a substrate having at least heat resistance high enough to withstand heat treatment performed later can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate using silicon or silicon carbide, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrode 111R, Pixel Electrode 111G, and Pixel Electrode 111B]

Next, a plurality of pixel electrodes 111 are formed over the substrate 101. First, a conductive film to be the pixel electrodes is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

In the case where a conductive film that reflects visible light is used as each of the pixel electrodes, it is preferable to use a material having reflectance as high as possible in the whole wavelength range of visible light (e.g., silver or aluminum). This can increase color reproducibility as well as light extraction efficiency of the light-emitting devices.

Note that in the case where the optical adjustment layer 115R, the optical adjustment layer 115G, and the optical adjustment layer 115B are provided as illustrated in FIG. 12A and FIG. 12B, the optical adjustment layer 115R, the optical adjustment layer 115G, and the optical adjustment layer 115B are formed after the formation of the pixel electrode 111R, the pixel electrode 111G, and the pixel electrode 111B.

[Formation of Insulating Layer 131]

Figure 13A:
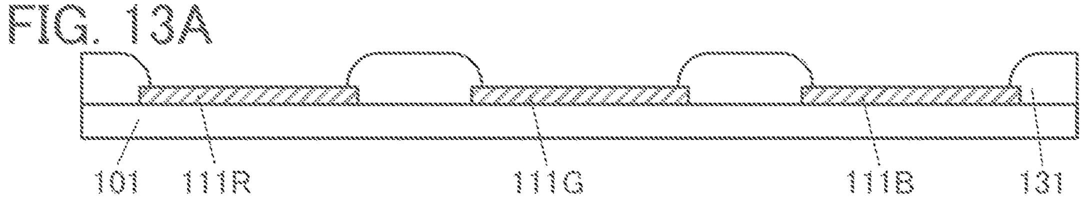
FIG. 13A to FIG. 13E are diagrams illustrating an example of a method of fabricating a display device.

Next, the insulating layer 131 is formed to cover the end portions of the pixel electrode 111R, the pixel electrode 111G, and the pixel electrode 111B (FIG. 13A). An organic insulating film or an inorganic insulating film can be used for the insulating layer 131. The end portions of the insulating layer 131 each preferably have a tapered shape to improve step coverage with an EL film formed later. In particular, when an organic insulating film is used, a photosensitive material is preferably used so that the shapes of the end portions can be easily controlled by the conditions of light exposure and development.

[Formation of EL Film 112Rf]

Figure 13B:
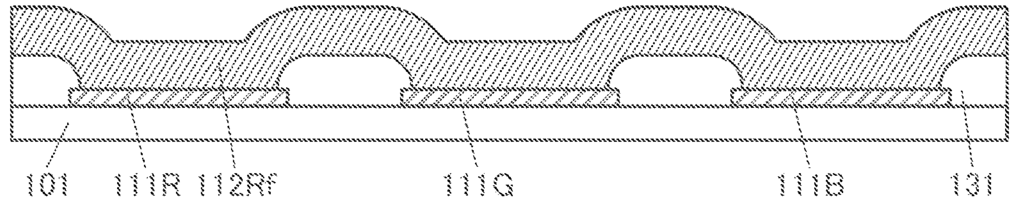

Subsequently, an EL film 112Rf to be the EL layer 112R later is deposited over the pixel electrode 111R, the pixel electrode 111G, the pixel electrode 111B, and the insulating layer 131 (FIG. 13B).

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, an ink-jet method, or the like. Without limitation to this, the above-described deposition method can be used as appropriate.

[Formation of Sacrificial Film 144*a*]

Next, a sacrificial film 144*a* is formed to cover the EL film 112Rf.

The sacrificial film 144*a* can be formed by a sputtering method, an ALD method (a thermal ALD method or a PEALD method), or a vacuum evaporation method. The sacrificial film 144*a* is preferably formed by a method that causes damage to the EL film 112Rf as little as possible. For example, an ALD method or a vacuum evaporation method can be suitably used for the formation of the sacrificial film 144*a*. In particular, aluminum oxide is favorably used for the sacrificial film 144*a* since the manufacturing cost can be reduced. The ALD method causes less deposition damage to a surface where a film is to be formed (e.g., the EL film 112Rf) than the sputtering method.

As the sacrificial film 144*a*, a film that can be removed by a wet etching method is preferably used. The use of a wet etching method can reduce damage to the EL film 112Rf in processing of the sacrificial film 144*a*, as compared with the case of using a dry etching method. In the case of using a wet etching method, it is preferable to use a chemical solution of a developer, an aqueous solution of tetramethylammonium hydroxide (TMAH), a dilute hydrofluoric acid, an oxalic acid, a phosphoric acid, a nitric acid, an acetic acid, or a mixed solution thereof, for example.

As the sacrificial film 144*a*, it is possible to use a film highly resistant to etching treatment performed on the EL films such as the EL film 112Rf, i.e., a film having high etching selectivity. Furthermore, as the sacrificial film 144*a*, it is possible to use a film having high etching selectivity with respect to a protective film such as a protective film 146*a* described later. Moreover, as the sacrificial film 144*a*, it is possible to use a film that can be removed by a wet etching method causing less damage to the EL films. Note that the conductivity of the sacrificial film 144*a* is not particularly limited. As the sacrificial film 144*a*, at least one of an insulating film, a semiconductor film, and a conductive film can be used.

As the sacrificial film 144*a*, an inorganic film such as a metal film, an alloy film, a metal oxide film, a semiconductor film, or an inorganic insulating film can be used, for example. Alternatively, an organic film such as polyvinyl alcohol can be used as the sacrificial film 144*a*.

For the sacrificial film 144*a*, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, for the sacrificial film 144*a*, a metal oxide such as an indium gallium zinc oxide (an In—Ga—Zn oxide, also referred to as IGZO) can be used. For the sacrificial film 144*a*, indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like can be used. Alternatively, for the sacrificial film 144*a*, an indium tin oxide containing silicon can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

Note that in the case where the above In—Ga—Zn oxide is used for the sacrificial film 144*a*, for example, the sacrificial film 144*a* can be removed with use of an oxalic acid, a phosphoric acid, an acetic acid, a nitric acid, or a mixed liquid thereof.

Alternatively, an inorganic insulating material such as aluminum oxide, hafnium oxide, or silicon oxide can be used for the sacrificial film 144*a*. In particular, an aluminum oxide film is preferably formed by an ALD method as the sacrificial film 144*a*, in which case damage to a base (especially the EL layer or the like) can be reduced.

The sacrificial film 144*a* may have a single-layer structure or a stacked-layer structure of two or more layers. As typical examples of the stacked-layer structure, a two-layer structure of an In—Ga—Zn oxide formed by a sputtering method and a silicon nitride film formed by a sputtering method, a two-layer structure of an In—Ga—Zn oxide formed by a sputtering method and an aluminum oxide formed by an ALD method, a two-layer structure of an aluminum oxide formed by an ALD method and an In—Ga—Zn oxide formed by a sputtering method, or the like can be given.

Note that as the formation of the sacrificial film 144*a* by an ALD method or a sputtering method, thermal deposition may be performed. The sacrificial film 144*a* is preferably formed at a temperature at which the base (here, the EL film 112Rf) does not deteriorate. The substrate temperature at the time of forming the sacrificial film 144*a* is preferably higher than or equal to room temperature and lower than or equal to 200° C., further preferably higher than or equal to 50° C. and lower than or equal to 150° C., still further preferably higher than or equal to 70° C. and lower than or equal to 100° C., and typically approximately 80° C. When the substrate temperature at the time of forming the sacrificial film 144*a* is low, the sacrificial film 144*a* becomes sparse, and when the etching rate of the sacrificial film 144*a* to the etchant becomes high in a later step, a defect such as disappearance or peeling of the sacrificial film 144*a* might occur. Setting the substrate temperature within the above-described range can inhibit deterioration of the base as well as the disappearance or occurrence of the peeling.

[Formation of Protective Film 146*a*]

Figure 13C:
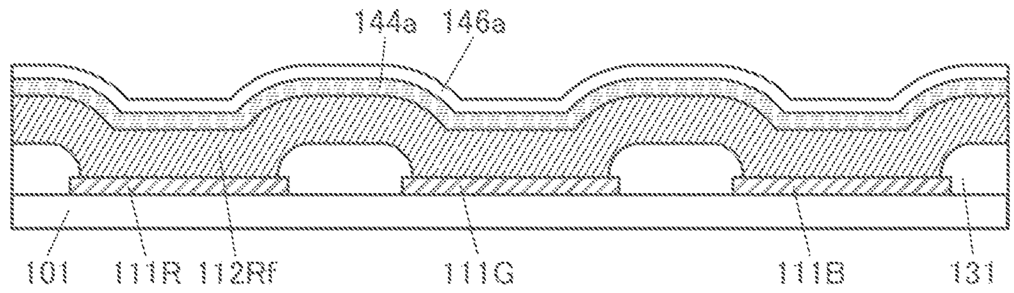

Next, the protective film 146*a* is formed over the sacrificial film 144*a* (FIG. 13C).

The protective film 146*a* is a film used as a hard mask when the sacrificial film 144*a* is etched later. In a later step of processing the protective film 146*a*, the sacrificial film 144*a* is exposed. Thus, the combination of films having high etching selectivity therebetween is selected for the sacrificial film 144*a* and the protective film 146*a*. It is thus possible to select a film that can be used for the protective film 146*a** depending on etching conditions of the sacrificial film 144a and etching conditions of the protective film 146a.

For example, in the case where dry etching using a gas containing fluorine (also referred to as a fluorine-based gas) is performed for the etching of the protective film 146a, silicon, silicon oxide, silicon oxynitride, silicon nitride oxide, silicon nitride, tungsten, titanium, molybdenum, tantalum, tantalum nitride, an alloy containing molybdenum and niobium, an alloy containing molybdenum and tungsten, or the like can be used for the protective film 146a. Here, for example, a film of a metal oxide such as IGZO or ITO is given as a film having high etching selectivity (i.e., enabling low etching rate) in dry etching using the fluorine-based gas, and such a film can be used as the sacrificial film 144a.

Without being limited to the above, a material of the protective film 146a can be selected from a variety of materials depending on etching conditions of the sacrificial film 144a and etching conditions of the protective film 146a. For example, any of the films that can be used as the sacrificial film 144a can be used.

As the protective film 146a, a nitride film can be used, for example. Specifically, it is possible to use silicon nitride, aluminum nitride, hafnium nitride, titanium nitride, tantalum nitride, tungsten nitride, gallium nitride, germanium nitride, or the like. As the protective film 146a, an oxide film can be used, for example. Specifically, silicon oxide, aluminum oxide, hafnium oxide, titanium oxide, tantalum oxide, tungsten oxide, gallium oxide, germanium oxide, or the like can be used.

Alternatively, as the protective film 146a, an organic film that can be used as the EL film 112Rf or the like can be used. For example, the organic film that is used as the EL film 112Rf, the EL film 112Gf, or the EL film 112Bf can be used as the protective film 146a. The use of such an organic film is preferable, in which case the deposition apparatus for the EL film 112Rf or the like can be used in common.

[Formation of Resist Mask 143a]

Figure 13D:
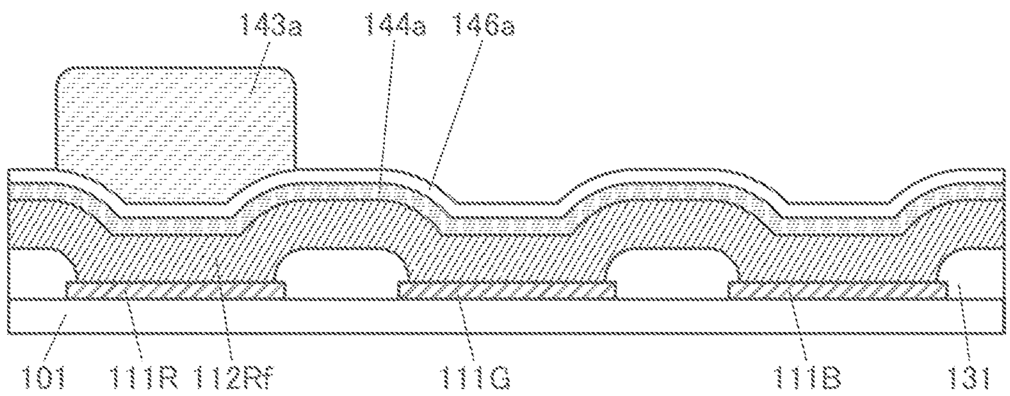

Then, the resist mask 143a is formed in a position that is over the protective film 146a and overlaps with the pixel electrode 111R (FIG. 13D).

Here, in the case where the protective film 146a is not provided and the resist mask 143a is formed over the sacrificial film 144a, if a defect such as a pinhole exists in the sacrificial film 144a, there is a risk of dissolving the EL film 112Rf because of a solvent of the resist material. The use of the protective film 146a can prevent such a defect.

For the resist mask 143a, a resist material containing a photosensitive resin such as a positive type resist material or a negative type resist material can be used.

[Etching of Protective Film 146a]

Figure 13E:
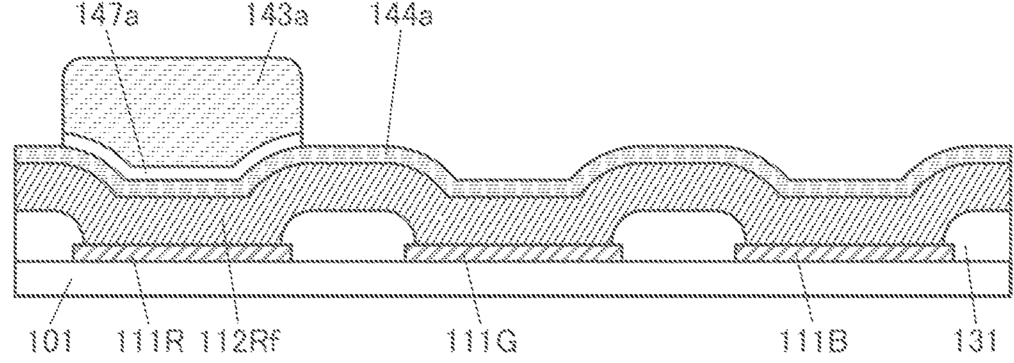

Next, part of the protective film 146a that is not covered with the resist mask 143a is removed by etching, so that a protective layer 147a having an island-like shape or a band-like shape is formed (FIG. 13E).

In the etching of the protective film 146a, an etching condition with high selectively is preferably employed so as not to remove the sacrificial film 144a by the etching. For the etching of the protective film 146a, a wet etching method or a dry etching method can be used. A dry etching method can be suitably used for the etching of the protective film 146a; a reduction in a pattern of the protective film 146a can be inhibited by a dry etching method.

[Removal of Resist Mask 143a]

Figure 14A:
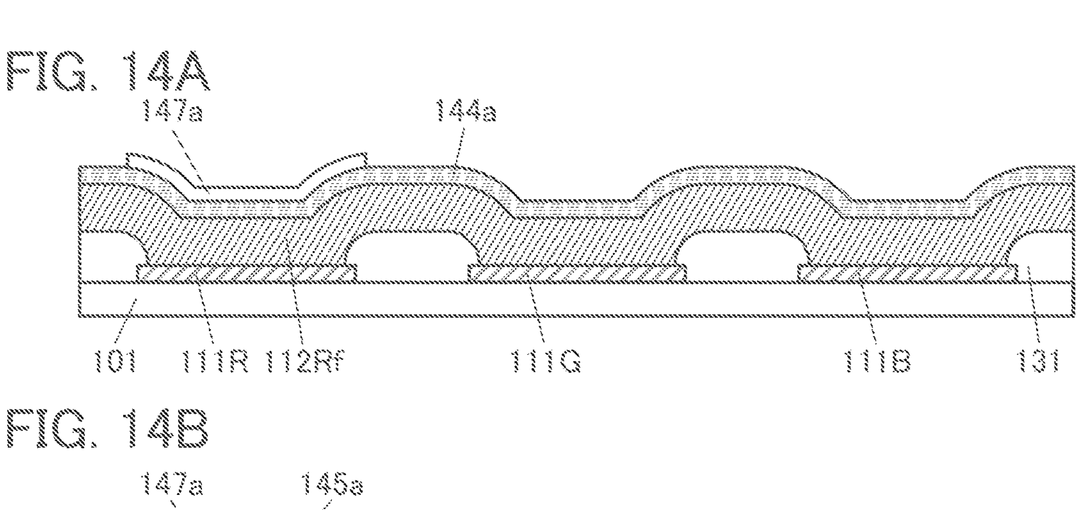
FIG. 14A to FIG. 14E are diagrams illustrating an example of a method of fabricating a display device.

Next, the resist mask 143a is removed (FIG. 14A).

The removal of the resist mask 143a can be performed by a wet etching method or a dry etching method. It is particularly preferable to perform a dry etching method (also referred to as plasma ashing) using an oxygen gas as an etching gas to remove the resist mask 143a.

At this time, the removal of the resist mask 143a is performed in a state where the EL film 112Rf is covered with the sacrificial film 144a; thus, the EL film 112Rf is less likely to be affected by the removal. This is particularly suitable in the case where etching using an oxygen gas, such as plasma ashing, is performed for the removal of the resist mask 143a because when the EL film 112Rf is exposed to oxygen, the electrical characteristics are adversely affected in some cases.

[Etching of Sacrificial Film 144a]

Figure 14B:
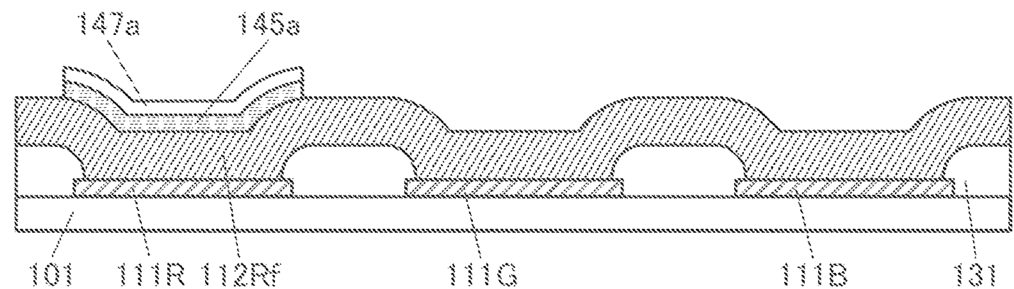

Next, part of the sacrificial film 144a that is not covered with the protective layer 147a is removed by etching using the protective layer 147a, a sacrificial layer 145a having an island-like shape or a belt-like shape is formed (FIG. 14B).

For the etching of the sacrificial film 144a, a wet etching method or a dry etching method can be used. A dry etching method can be suitably used for the etching of the sacrificial film 144a; a reduction in a pattern can be inhibited by a dry etching method.

[Etching of EL Film 112Rf]

Figure 14C:
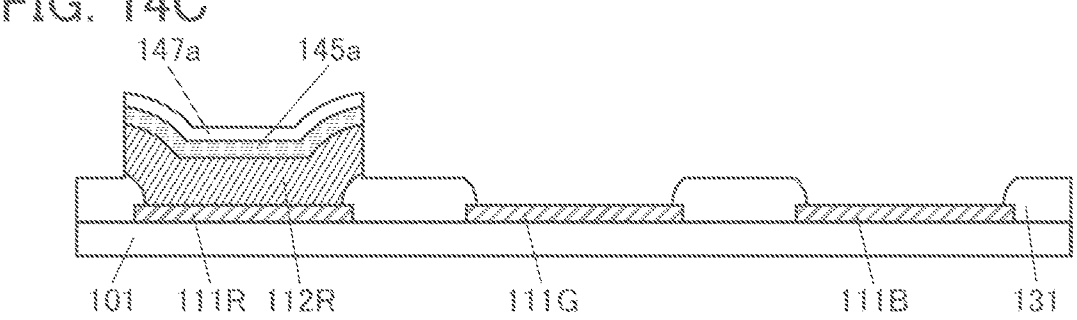

Next, part of the EL film 112Rf that is not covered with the protective layer 147a and the sacrificial layer 145a is removed by etching using the protective layer 147a and the sacrificial layer 145a as masks, so that the EL layer 112R having an island-like shape or a belt-like shape is formed (FIG. 14C). By the treatment, part of the top surface of the insulating layer 131, the top surface of the pixel electrode 111G, and the top surface of the pixel electrode 111B are exposed.

For the etching of the EL film 112Rf, dry etching is preferably used. For the dry etching, an etching gas that does not contain an oxygen gas is preferably used. This can inhibit the alteration of the EL film 112Rf to achieve a highly reliable display device. As the etching gas that does not contain an oxygen gas, one or more selected from $CF_4$, $C_4F_8$, $SF_6$, $CHF_3$, $Cl_2$, $H_2O$, $BCl_3$, $H_2$, and a noble gas can be used. As the noble gas, He can be used, for example. For example, dry etching using a mixed gas of $H_2$ and Ar is suitably employed for the etching of the EL film 112Rf. Alternatively, a mixed gas of the above gas and the gas that does not contain oxygen can be used as the etching gas.

The thickness of the insulating layer 131 in a region that does not overlap with the protective layer 147a and the sacrificial layer 145a may be reduced at the time of etching the EL film 112Rf. Note that the EL film 112Rf is etched so as not to reduce the thickness of the insulating layer 131 in the region that does not overlap with the protective layer 147a and the sacrificial layer 145a, whereby the display device 100A illustrated in FIG. 6A and the like can be fabricated.

[Removal of Protective Layer 147a]

Figure 14D:
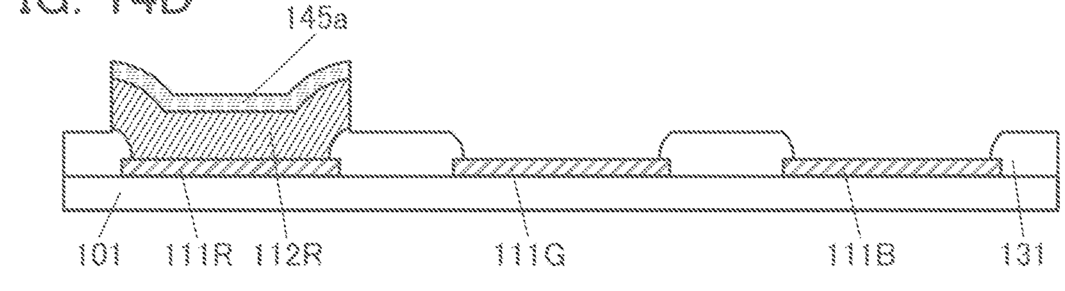

Next, the protective layer 147a is removed by etching (FIG. 14D).

For the removal of the protective layer 147a, a wet etching method or a dry etching method can be used. At this time, a method that causes damage to the EL layer 112R as little as possible is preferably employed. A dry etching method can be suitably used for the removal of the protective layer 147a. For the dry etching, an etching gas that does not contain an oxygen gas is preferably used. As the etching gas that does not contain an oxygen gas, one or more selected from $CF_4$, $C_4F_8$, $SF_6$, $CHF_3$, $Cl_2$, $H_2O$, $BCl_3$, $H_2$, and a noble gas can be used. As the noble gas, He can be used, for example. A mixed gas of the above gas and the gas that does not contain oxygen can be used as the etching gas.

Note that the etching of the EL film 112Rf and the removal of the protective layer 147*a* may be performed by the same treatment. Processing the EL film 112Rf and the protective layer 147*a* by the same treatment can simplify the process and can reduce the manufacturing cost of the display device.

As described above, the EL film 112Rf is formed, and the sacrificial film 144*a*, the protective film 146*a*, and the resist mask 143*a* are formed in this order over the EL film 112Rf. After that, the protective film 146*a* is etched to form the protective layer 147*a* and then the resist mask 143*a* is removed. Subsequently, the sacrificial film 144*a* is etched to form the sacrificial layer 145*a*. After that, the EL film 112Rf is etched to form the EL layer 112R having an island-like shape or a band-like shape. After that, the protective layer 147*a* is removed, whereby the EL layer 112R and the sacrificial layer 145*a* which have an island-like shape can be formed.

[Formation of EL Film 112Gf]

Figure 14E:
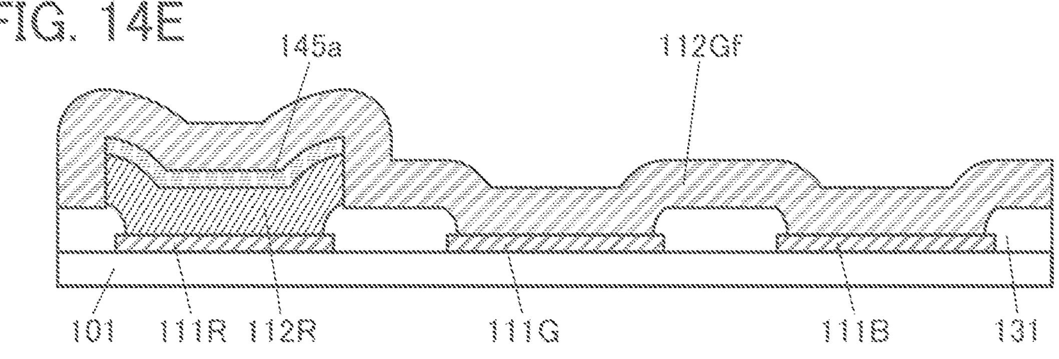

Subsequently, an EL film 112Gf to be the EL layer 112G later is deposited over the sacrificial layer 145*a*, the insulating layer 131, the pixel electrode 111G, and the pixel electrode 111B (FIG. 14E).

The description of the EL film 112Rf can be referred to for the formation method of the EL film 112Gf; thus, the detailed description is omitted.

[Formation of Sacrificial Film 144*b*]

Subsequently, a sacrificial film 144*b* is formed over the EL film 112Gf. The sacrificial film 144*b* can be formed in a manner similar to that for the sacrificial film 144*a*. In particular, the sacrificial film 144*b* is preferably formed using the same material as the sacrificial film 144*a*. The description of the sacrificial film 144*a* can be referred to for the sacrificial film 144*b*; thus, the detailed description is omitted.

[Formation of Protective Film 146*b*]

Next, a protective film 146*b* is formed over the sacrificial film 144*b*. The description of the protective film 146*a* can be referred to for the protective film 146*b*; thus, the detailed description is omitted.

[Formation of Resist Mask 143*b*]

Figure 15A:
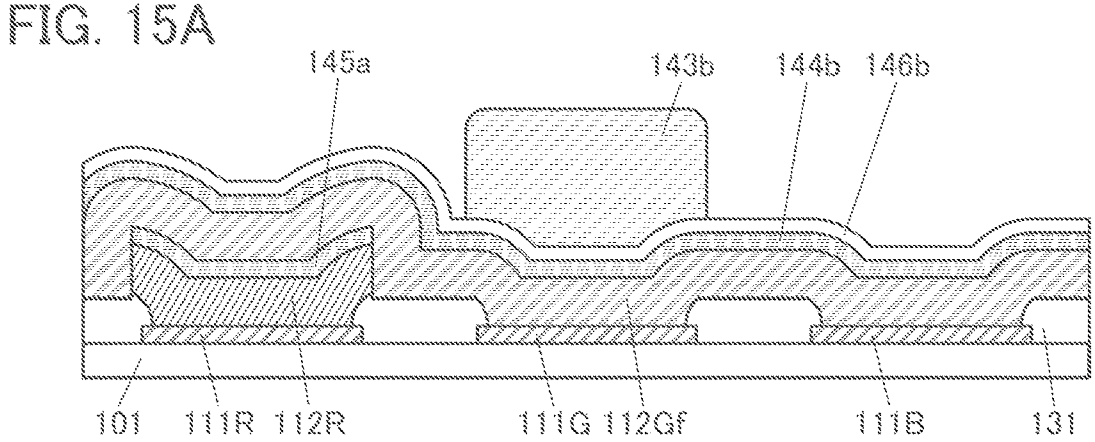
FIG. 15A to FIG. 15D are diagrams illustrating an example of a method of fabricating a display device.

Then, the resist mask 143*b* is formed in a position that is over the protective film 146*b* and overlaps with the pixel electrode 111G (FIG. 15A).

The description of the resist mask 143*a* can be referred to for the formation of the resist mask 143*b*; thus, the detailed description is omitted.

[Etching of Protective Film 146*b*]

Figure 15B:
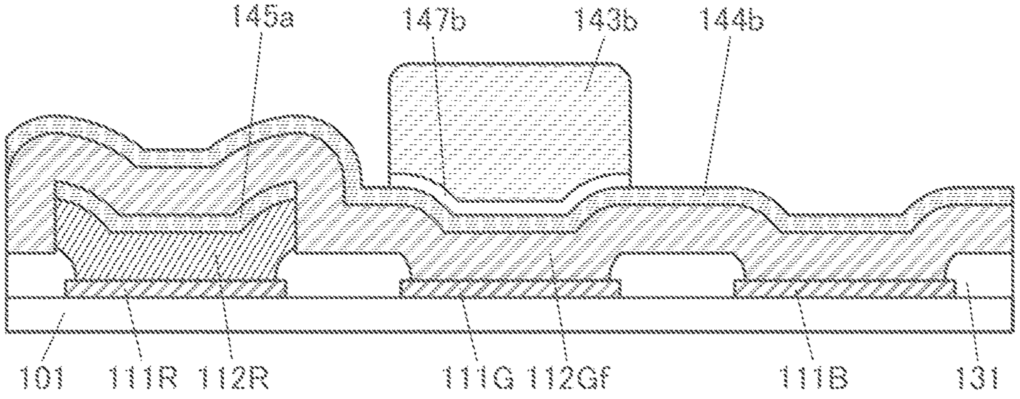

Next, part of the protective film 146*b* that is not covered with the resist mask 143*b* is removed by etching, so that a protective layer 147*b* having an island-like shape or a band-like shape is formed (FIG. 15B).

The description of the protective film 146*a* can be referred to for the etching of the protective film 146*b*; thus, the detailed description is omitted.

[Removal of Resist Mask 143*b*]

Next, the resist mask 143*b* is removed.

The description of the resist mask 143*a* can be referred to for the removal of the resist mask 143*b*; thus, the detailed description is omitted.

[Etching of Sacrificial Film 144*b*]

Next, part of the sacrificial film 144*b* that is not covered with the protective layer 147*b* is removed by etching with use of the protective layer 147*b* as a mask, so that a sacrificial layer 145*b* having an island-like shape or a band-like shape is formed.

The description of the sacrificial film 144*a* can be referred to for the etching of the sacrificial film 144*b*; thus, the detailed description is omitted.

[Etching of EL Film 112Gf]

Figure 15C:
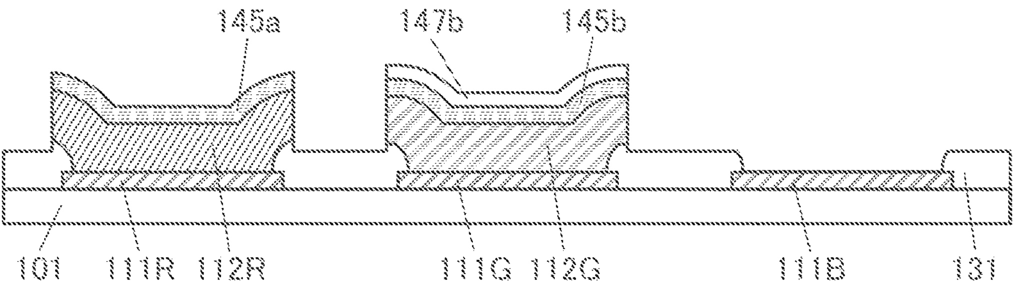

Next, part of the EL film 112Gf that is not covered with the protective layer 147*b* and the sacrificial layer 145*b* is removed by etching using the protective layer 147*b* and the sacrificial layer 145*b* as masks, so that the EL layer 112G having an island-like shape or a belt-like shape is formed (FIG. 15C). By the treatment, part of the top surface of the insulating layer 131 and the top surface of the pixel electrode 111B are exposed.

The description of the EL film 112Rf can be referred to for the etching of the EL film 112Gf; thus, the detailed description is omitted.

The thickness of the insulating layer 131 in a region that does not overlap with the sacrificial layer 145*a* and the thickness of the insulating layer 131 in a region that does not overlap with the protective layer 147*b* and the sacrificial layer 145*b* may be reduced at the time of etching the EL film 112Gf.

In some cases, the thickness of the insulating layer 131 in the region that does not overlap with the protective layer 147*a* and the sacrificial layer 145*a* is reduced at the time of etching the EL film 112Rf, and the thickness of the insulating layer 131 in the region that does not overlap with the sacrificial layer 145*a* and the thickness of the insulating layer 131 in the region that does not overlap with the protective layer 147*b* and the sacrificial layer 145*b* are reduced at the time of etching the EL film 112Gf. In that case, as illustrated in FIG. 11, the thickness of the insulating layer 131 in a region overlapping with the EL film 112Gf may be smaller than the thickness of the insulating layer 131 in a region overlapping with the EL film 112Rf.

[Removal of Protective Layer 147*b*]

Figure 15D:
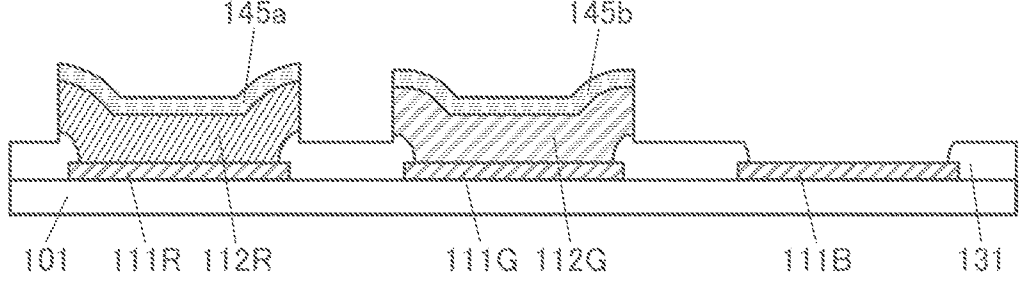

Next, the protective layer 147*b* is removed by etching (FIG. 15D).

The description of the protective layer 147*a* can be referred to for the removal of the protective layer 147*b*; thus, the detailed description is omitted.

[Formation of EL Film 112Bf]

Next, the EL film 112Bf that is to be the EL layer 112B later is formed over the sacrificial layer 145*a*, the sacrificial layer 145*b*, the insulating layer 131, and the pixel electrode 111B.

The description of the EL film 112Rf can be referred to for the formation method of the EL film 112Bf thus, the detailed description is omitted.

[Formation of Sacrificial Film 144*c*]

Subsequently, a sacrificial film 144*c* is formed over the EL film 112Bf. The sacrificial film 144*c* can be formed in a manner similar to that for the sacrificial film 144*a*. In particular, the sacrificial film 144*c* is preferably formed using the same material as the sacrificial film 144*a*.

The description of the sacrificial film 144*a* can be referred to for the sacrificial film 144*c*; thus, the detailed description is omitted.

[Formation of Protective Film 146*c*]

Next, a protective film 146*c* is formed over the sacrificial film 144*c*. The description of the protective film 146*a* can be referred to for the protective film 146*c*; thus, the detailed description is omitted.

[Formation of Resist Mask 143*c*]

Figure 16A:
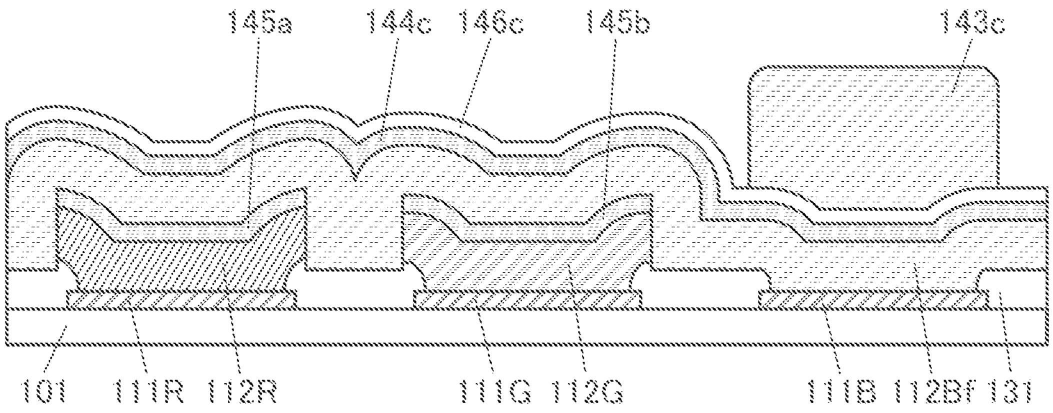
FIG. 16A to FIG. 16D are diagrams illustrating an example of a method of fabricating a display device.

Then, the resist mask 143*c* is formed in a position that is over the protective film 146*c* and overlaps with the pixel electrode 111B (FIG. 16A).

The description of the resist mask 143a can be referred to for the formation of the resist mask 143c; thus, the detailed description is omitted.

[Etching of Protective Film 146c]

Next, part of the protective film 146c that is not covered with the resist mask 143c is removed by etching, so that a protective layer 147c having an island-like shape or a band-like shape is formed.

The description of the protective film 146a can be referred to for the etching of the protective film 146c; thus, the detailed description is omitted.

[Removal of Resist Mask 143c]

Figure 16B:
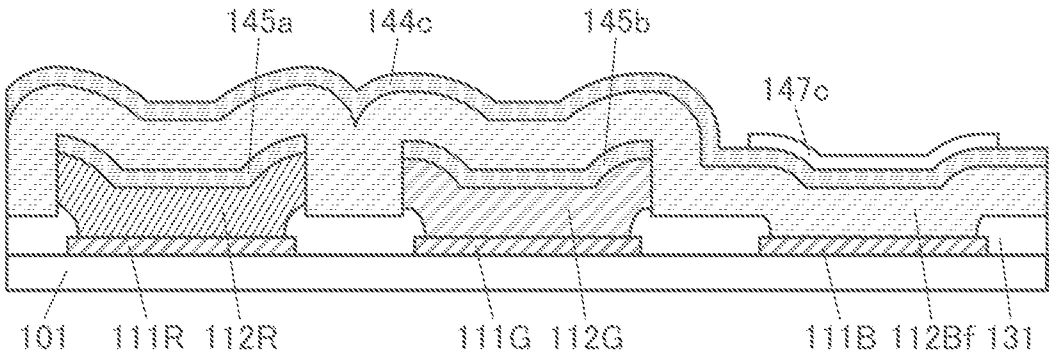

Next, the resist mask 143c is removed (FIG. 16B).

The description of the resist mask 143a can be referred to for the removal of the resist mask 143c; thus, the detailed description is omitted.

[Etching of Sacrificial Film 144c]

Next, part of the sacrificial film 144c that is not covered with the protective layer 147c is removed by etching with use of the protective layer 147c as a mask, so that a sacrificial layer 145c having an island-like shape or a band-like shape is formed.

The description of the sacrificial film 144a can be referred to for the etching of the sacrificial film 144c; thus, the detailed description is omitted.

[Etching of EL Film 112Bf]

Figure 16C:
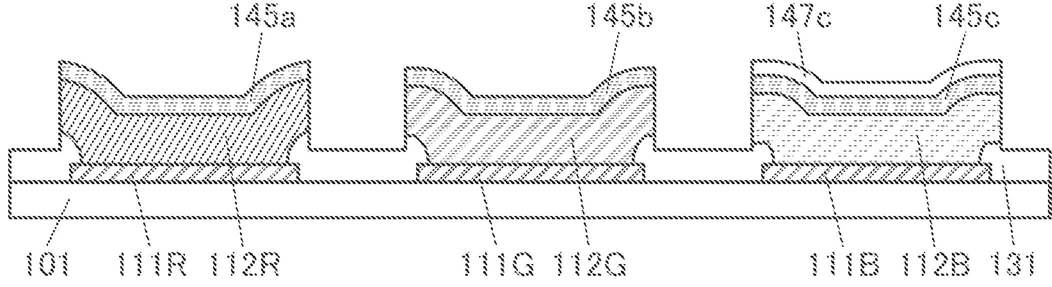

Next, part of the EL film 112Bf that is not covered with the protective layer 147c and the sacrificial layer 145c is removed by etching using the protective layer 147c and the sacrificial layer 145c as masks, so that the EL layer 112B having an island-like shape or a belt-like shape is formed (FIG. 16C). By the treatment, part of the top surface of the insulating layer 131, the top surface of the sacrificial layer 145a, and the top surface of the sacrificial layer 145b are exposed.

The description of the EL film 112Rf can be referred to for the etching of the EL film 112Bf; thus, the detailed description is omitted.

The thickness of the insulating layer 131 in a region that does not overlap with the sacrificial layer 145a, the thickness of the insulating layer 131 in a region that does not overlap with the sacrificial layer 145b, and the thickness of the insulating layer 131 in a region that does not overlap with the protective layer 147c and the sacrificial layer 145c may be reduced at the time of etching the EL film 112Bf.

In some cases, the thickness of the insulating layer 131 in the region that does not overlap with the protective layer 147a and the sacrificial layer 145a is reduced at the time of etching the EL film 112Rf, the thickness of the insulating layer 131 in the region that does not overlap with the sacrificial layer 145a and the thickness of the insulating layer 131 in the region that does not overlap with the protective layer 147b and the sacrificial layer 145b are reduced at the time of etching the EL film 112Gf, and the thickness of the insulating layer 131 in the region that does not overlap with the sacrificial layer 145a, the thickness of the insulating layer 131 in the region that does not overlap with the sacrificial layer 145b, and the thickness of the insulating layer 131 in the region that does not overlap with the protective layer 147c and the sacrificial layer 145c are reduced at the time of etching the EL film 112Bf. In that case, as illustrated in FIG. 11, the thickness of the insulating layer 131 in the region overlapping with the EL film 112Gf may be smaller than the thickness of the insulating layer 131 in the region overlapping with the EL film 112Rf, and the thickness of the insulating layer 131 in a region overlapping with the EL film 112Bf may be smaller than the thickness of the insulating layer 131 in the region overlapping with the EL film 112Gf.

[Removal of Protective Layer 147c]

Figure 16D:
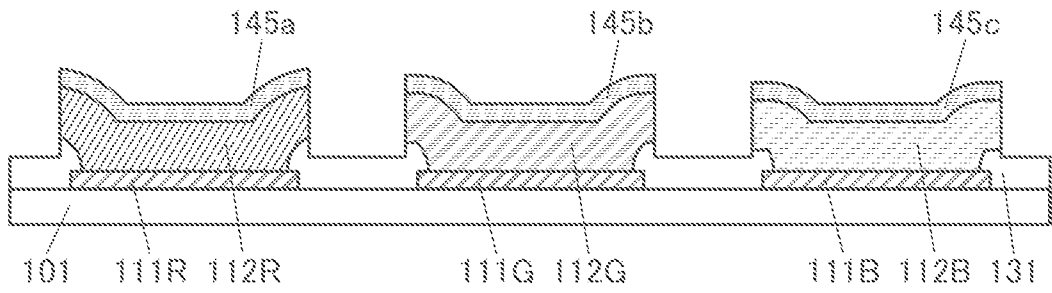

Next, the protective layer 147c is removed by etching (FIG. 16D).

The description of the protective layer 147a can be referred to for the removal of the protective layer 147c; thus, the detailed description is omitted.

Through the above steps, the three kinds of EL layers can be separately formed.

[Formation of Insulating Film 133f]

Figure 17A:
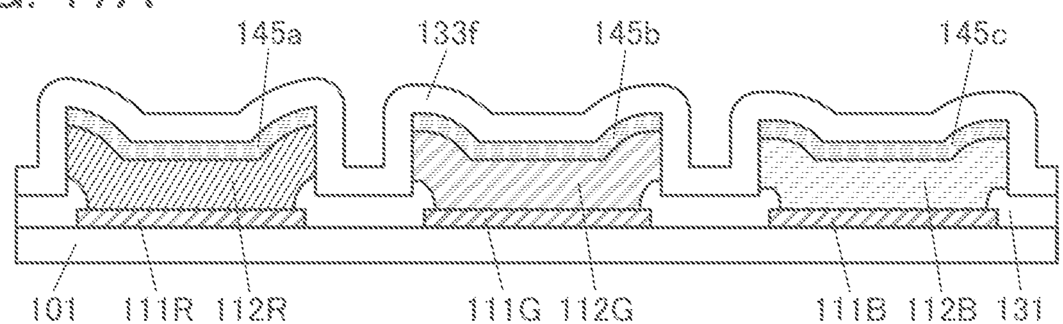
FIG. 17A to FIG. 17D are diagrams illustrating an example of a method of fabricating a display device.

Next, an insulating film 133f is formed over the insulating layer 131, the sacrificial layer 145a, the sacrificial layer 145b, and the sacrificial layer 145c (FIG. 17A).

The insulating film 133f is a film to be the insulating layer 133 later. For the insulating film 133f, aluminum oxide, magnesium oxide, hafnium oxide, gallium oxide, indium gallium zinc oxide, silicon oxide, silicon oxynitride, silicon nitride, silicon nitride oxide, or the like can be used, for example. Note that the insulating film 133f may be formed by stacking some of these.

For the formation of the insulating film 133f, a sputtering method, a chemical vapor deposition (CVD) method, a molecular beam epitaxy (MBE) method, a pulsed laser deposition (PLD) method, an atomic layer deposition (ALD) method, or the like can be used. An ALD method achieving favorable coverage can be suitably used for forming the insulating film 133f.

[Formation of Insulating Layer 133]

Figure 17B:
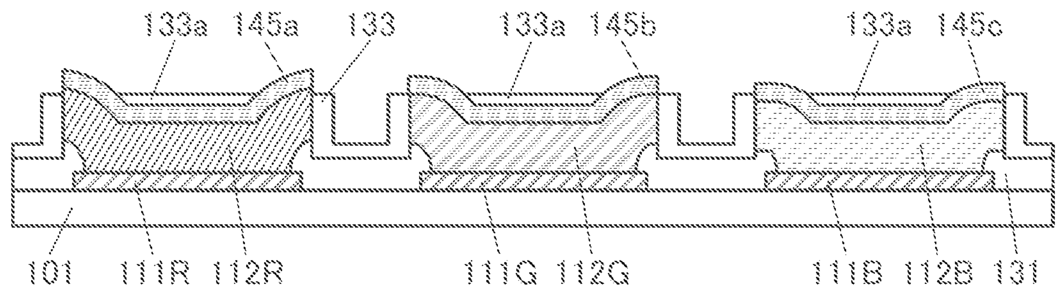

Next, part of the insulating film 133f is removed to expose part of the sacrificial layer 145a, part of the sacrificial layer 145b, and part of the sacrificial layer 145c. Thus, the insulating layer 133 covering side surfaces of the EL layer 112R, the EL layer 112G, and the EL layer 112B is formed and an insulating layer 133a is formed over the sacrificial layer 145a, the sacrificial layer 145b, and the sacrificial layer 145c (FIG. 17B). For the formation of the insulating layer 133 and the insulating layer 133a, a wet etching method or a dry etching method can be used. In particular, anisotropic etching employing a dry etching method can be suitably used.

For example, in the case where all the insulating film 133f over the sacrificial layer 145a, the sacrificial layer 145b, and the sacrificial layer 145c is removed at the time of forming the insulating layer 133, i.e., in the case where the insulating layer 133a is not formed over the sacrificial layer 145a, the sacrificial layer 145b, or the sacrificial layer 145c, the width 133w of the insulating layer 133 might be reduced. For this reason, the etching amount is controlled such that part of the sacrificial layer 145a, part of the sacrificial layer 145b, and part of the sacrificial layer 145c are exposed and the insulating layer 133a is formed over the sacrificial layer 145a, the sacrificial layer 145b, and the sacrificial layer 145c, whereby a reduction in the width 133w of the insulating layer 133 can be inhibited.

Note that although FIG. 17A illustrates an example in which the insulating layer 133a is formed over the sacrificial layer 145a, the sacrificial layer 145b, and the sacrificial layer 145c, one embodiment of the present invention is not limited to this example. Alternatively, a structure in which the insulating layer 133a is formed over one or more of the sacrificial layer 145a, the sacrificial layer 145b, and the sacrificial layer 145c may be employed. Alternatively, a structure in which the insulating layer 133a is formed over none of the sacrificial layer 145a, the sacrificial layer 145b, and the sacrificial layer 145c may be employed.

The height of the end surface of the insulating layer 133 can be adjusted by the etching amount in the formation of the insulating layer 133. The etching amount is preferably adjusted such that the insulating layer 133 covers the side surface of the EL layer 112. In particular, the etching amount is preferably adjusted such that the insulating layer 133 covers a side surface of the light-emitting layer included in the EL layer 112. The etching amount is preferably adjusted such that the width 133*w* of the insulating layer 133 in a region in contact with the side surface of the EL layer 112 is within the above range. The thickness of the insulating film 133*f* may be adjusted together with the etching amount in order to make the height of the end surface of the insulating layer 133 and the width 133*w* have desired values.

[Removal of Sacrificial Layer]

Figure 17C:
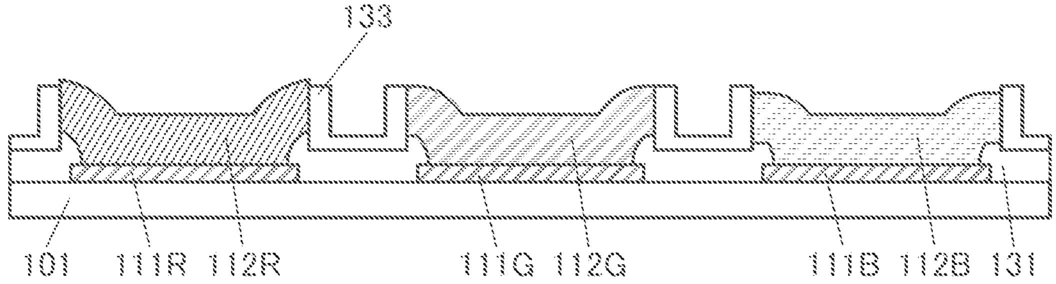

Next, the sacrificial layer 145*a*, the sacrificial layer 145*b*, and the sacrificial layer 145*c* are removed to expose the top surfaces of the EL layer 112R, the EL layer 112G, and the EL layer 112B (FIG. 17C). At this time, the sacrificial layer 145*a*, the sacrificial layer 145*b*, and the sacrificial layer 145*c* are removed and the insulating layer 133*a* over the sacrificial layer 145*a*, the insulating layer 133*a* over the sacrificial layer 145*b*, and the insulating layer 133*a* over the sacrificial layer 145*c* are also removed.

The sacrificial layer 145*a*, the sacrificial layer 145*b*, and the sacrificial layer 145*c* can be removed by a wet etching method or a dry etching method. At this time, a method that causes damage to the EL layer 112R, the EL layer 112G, and the EL layer 112B as little as possible is preferably employed. In particular, a wet etching method is preferably used. For example, a wet etching method using a tetramethyl ammonium hydroxide solution (TMAH), a diluted hydrofluoric acid, an oxalic acid, a phosphoric acid, an acetic acid, a nitric acid, or a mixed solution thereof is preferably performed. With the use of an etchant that dissolves the sacrificial layer 145*a*, the sacrificial layer 145*b*, and the sacrificial layer 145*c*, the sacrificial layer 145*a*, the sacrificial layer 145*b*, and the sacrificial layer 145*c* are removed and the insulating layer 133*a* over the sacrificial layer 145*a*, the insulating layer 133*a* over the sacrificial layer 145*b*, and the insulating layer 133*a* over the sacrificial layer 145*c* can also be removed (hereinafter also referred to as lift-off).

At the removal of the sacrificial layer 145*a*, the sacrificial layer 145*b*, and the sacrificial layer 145*c*, part of the insulating layer 133 may be removed. For example, at the removal of the sacrificial layer 145*a*, the sacrificial layer 145*b*, and the sacrificial layer 145*c*, the height of the end surface of the insulating layer 133 may be reduced.

After the sacrificial layer 145*a*, the sacrificial layer 145*b*, and the sacrificial layer 145*c* are removed, drying treatment is preferably performed in order to remove water contained in the EL layer 112R, the EL layer 112G, and the EL layer 112B and water adsorbed on the surfaces thereof. For example, heat treatment is preferably performed in an inert gas atmosphere or a reduced-pressure atmosphere. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

[Formation of Layer 116]

Figure 17D:
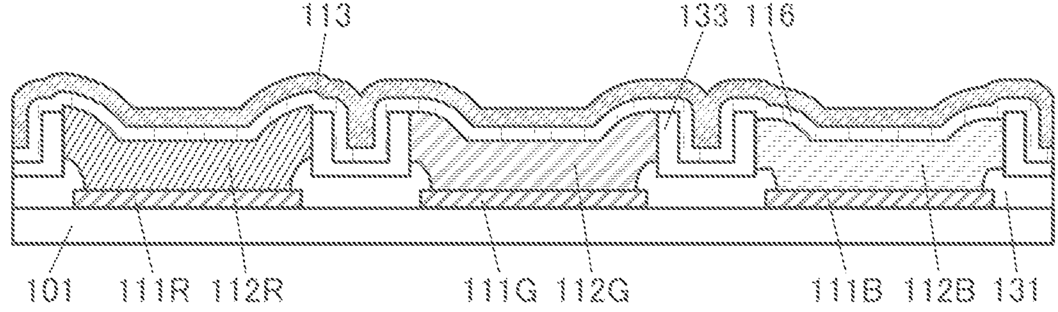

Next, the layer 116 is formed to cover the insulating layer 133, the EL layer 112R, the EL layer 112G, and the EL layer 112B (FIG. 17D). The layer 116 can be formed by, for example, an evaporation method, a sputtering method, an ink-jet method, or the like. Without limitation to this, the above-described deposition method can be used as appropriate.

In the case where the layer 116 has a stacked-layer structure as illustrated in FIG. 3A, layers included in the layer 116 are formed. For example, in the case where the layer 116*a* is an electron-transport layer and the layer 116*b* is an electron-injection layer, an electron-transport layer and an electron-injection layer over the electron-transport layer are formed.

[Formation of Common Electrode 113]

Next, the common electrode 113 is formed to cover the layer 116. For the formation of the common electrode 113, a sputtering method, an evaporation method, or the like can be used, for example (FIG. 17D).

Through the above steps, the light-emitting device 110R, the light-emitting device 110G, and the light-emitting device 110B can be fabricated.

[Formation of Protective Layer 121]

Next, the protective layer 121 is formed over the common electrode 113 (FIG. 10A). An inorganic insulating film used for the protective layer 121 is preferably formed by a sputtering method, a PECVD method, or an ALD method. In particular, an ALD method is preferable because it provides excellent step coverage and is less likely to cause a defect such as a pinhole. An organic insulating film is preferably formed by an inkjet method because a uniform film can be formed in a desired area.

Through the above steps, the display device 100E described as an example in Structure example 8 can be fabricated.

By the above fabricating method, the EL layer 112R, the EL layer 112G, and the EL layer 112B can be formed separately. Since process damage to the EL layer 112R, the EL layer 112G, and the EL layer 112B can be reduced, an extremely highly reliable display device can be achieved.

Although the fabricating method in which the EL layer 112R, the EL layer 112G, and the EL layer 112B are formed in this order is described, one embodiment of the present invention is not limited thereto. The order of forming the EL layer 112R, the EL layer 112G, and the EL layer 112B can be determined as appropriate. For example, an EL layer that is not susceptible to process damage may be formed first and then an EL layer that is susceptible to process damage may be formed. By determining the order of forming layers in consideration of process damage, the reliability of the display device can be further increased.

Fabrication Method Example 2

A fabrication method example that is partly different from Fabrication method example 1 described above will be described below. Note that description of the same portions as Fabrication method example 1 described above is omitted and different portions will be described.

As in Fabrication method example 1, components up to the insulating film 133*f* over the insulating layer 131, the sacrificial layer 145*a*, the sacrificial layer 145*b*, and the sacrificial layer 145*c* are formed (FIG. 17A). The description in Fabrication method example 1 can be referred to for the steps up to the formation of the insulating film 133*f*; thus, the detailed description is omitted.

[Formation of Insulating Layer 133]

Figure 18:
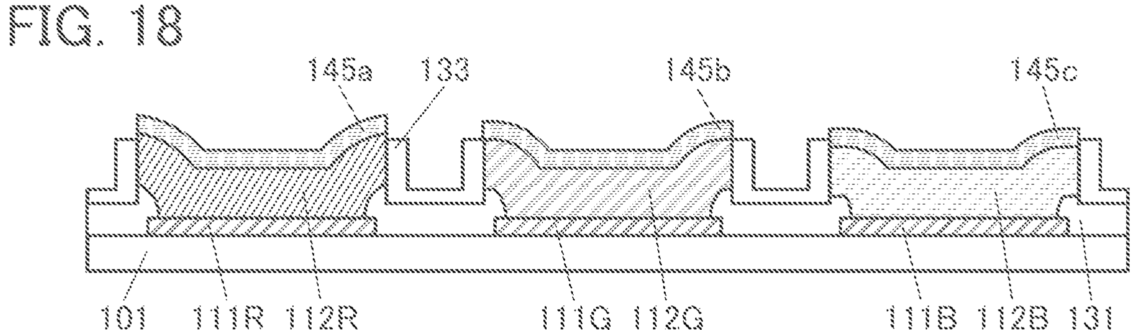
FIG. 18 is a diagram illustrating an example of a method of fabricating a display device.

Next, part of the insulating film 133*f* is removed by anisotropic etching to expose the sacrificial layer 145*a*, the sacrificial layer 145*b*, and the sacrificial layer 145*c*. Thus, the insulating layer 133 covering side surfaces of the EL layer 112R, the EL layer 112G, and the EL layer 112B is formed (FIG. 18). As the anisotropic etching, a dry etching method can be suitably used, for example.

[Removal of Sacrificial Layer]

Next, the sacrificial layer 145*a*, the sacrificial layer 145*b*, and the sacrificial layer 145*c* are removed to expose the top surfaces of the EL layer 112R, the EL layer 112G, and the EL layer 112B (FIG. 17C). The description of Fabrication method example 1 can be referred to for the removal of the sacrificial layer 145*a*, the sacrificial layer 145*b*, and the sacrificial layer 145*c*; thus, the detailed description is omitted.

After the sacrificial layer 145*a*, the sacrificial layer 145*b*, and the sacrificial layer 145*c* are removed, drying treatment is preferably performed in order to remove water contained in the EL layer 112R, the EL layer 112G, and the EL layer 112B and water adsorbed on the surfaces thereof. The above description in <Fabrication method example 1> can be referred to for the drying treatment; thus, the detailed description is omitted.

[Formation of EL Layer 116]

Next, the layer 116 is formed (FIG. 17D). The above description in <Fabrication method example 1> can be referred to for the steps after the formation of the layer 116; thus, the detailed description is omitted.

Through the above steps, the display device 100E can be fabricated.

The above is the description of an example of the method of fabricating a display device.

Structure Example 9

An example of using a light-emitting device exhibiting white light emission is described below.

Figure 19A:
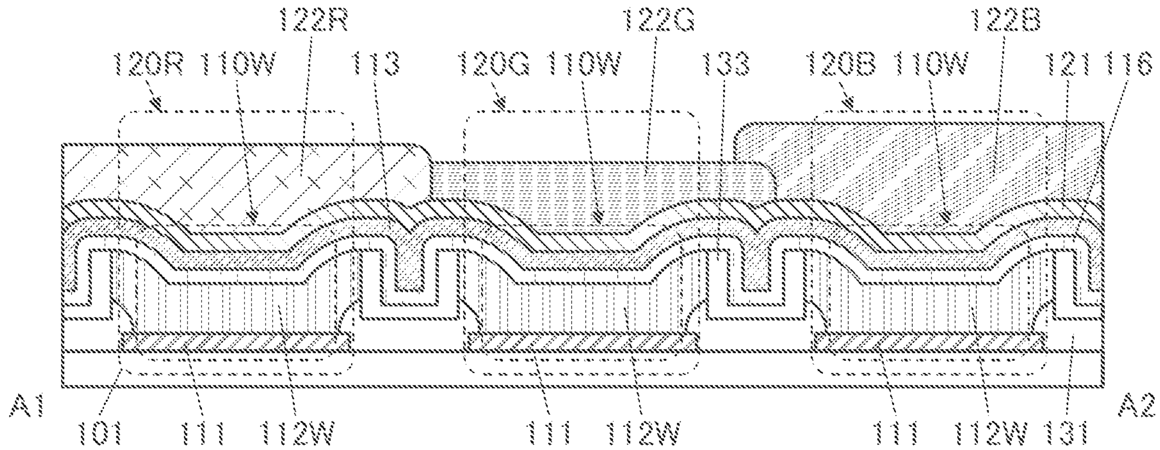
FIG. 19A to FIG. 19C are diagrams illustrating structure examples of a display device.
Figure 19B:
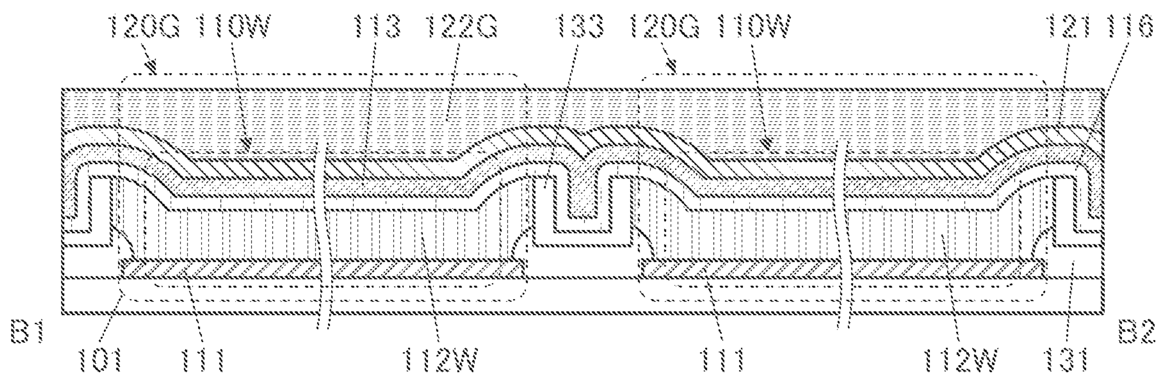

FIG. 19A and FIG. 19B are schematic cross-sectional views of a display device 150 of one embodiment of the present invention. FIG. 1A can be referred to for the schematic top view of the display device 150. FIG. 19A is a schematic cross-sectional view taken along the dashed-dotted line A1-A2 in FIG. 1A. FIG. 19B is a schematic cross-sectional view taken along the dashed-dotted line B1-B2 in FIG. 1A.

The display device 150 includes the light-emitting unit 120R, the light-emitting unit 120G, and the light-emitting unit 120B. The light-emitting unit 120R, the light-emitting unit 120G, and the light-emitting unit 120B each include a light-emitting device 110W. The light-emitting device 110W includes a pixel electrode 111, an EL layer 112W, and the common electrode 113. The EL layer 112W and the common electrode 113 are provided across a plurality of pixels to be shared by the plurality of pixels. The EL layer 112W includes a light-emitting layer that exhibits white light emission. The light-emitting device 110W is a light-emitting device exhibiting white light emission.

The light-emitting unit 120R, the light-emitting unit 120G, and the light-emitting unit 120B include a coloring layer 122R, a coloring layer 122G, and a coloring layer 122B, respectively, over the protective layer 121. For example, the coloring layer 122R transmits red light, the coloring layer 122G transmits green light, and the coloring layer 122B transmits blue light. This can achieve a full-color display device. Since each coloring layer is formed over the protective layer 121, the positional alignment of the light-emitting devices and the coloring layers is easy compared with the case where the coloring layers are formed over a substrate different from the substrate 101 and then the two substrates are bonded to each other; thus, a display device with extremely high resolution can be achieved.

Here, the EL layer 112W is divided between different light-emitting units. This suitably prevents unintentional light emission (also referred to as crosstalk) due to a current flow through the EL layer 112W between adjacent light-emitting units. As a result, the contrast can be increased to achieve a display apparatus with high display quality.

Figure 19C:
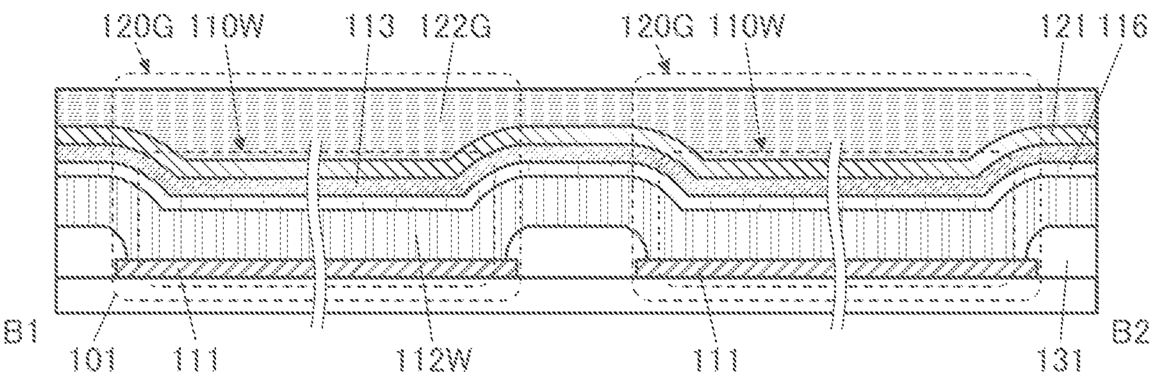

Note that as illustrated in FIG. 19C, a structure where the EL layer 112W is not divided between the light-emitting units of the same color may be employed.

Fabrication Method Example 3

An example of a method of fabricating the display device 150 described in Structure example 9 mentioned above is described below. Note that description of the portions overlapping with Fabrication method 1 mentioned above is omitted in some cases.

Figure 20A:
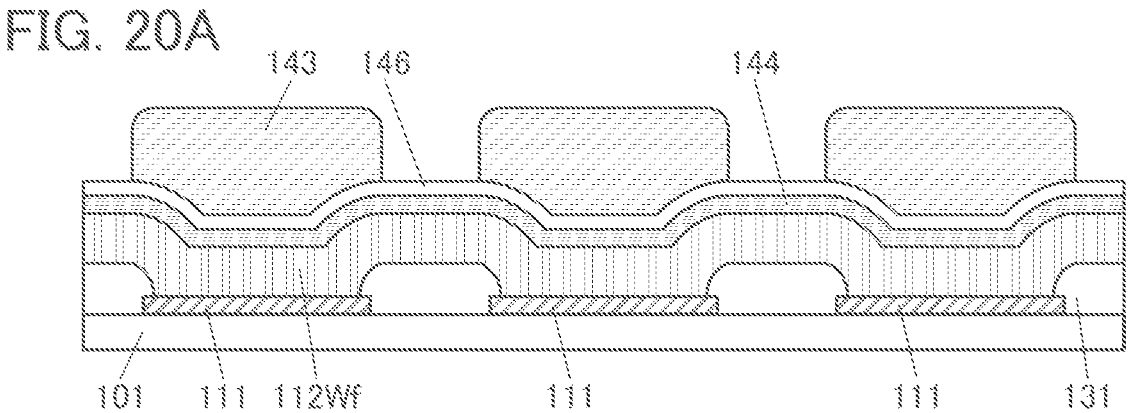
FIG. 20A to FIG. 20D are diagrams illustrating an example of a method of fabricating a display device.

First, as illustrated in FIG. 20A, a plurality of the pixel electrodes 111 and a plurality of the insulating layer 131 are formed over the substrate 101. Furthermore, an EL film 112Wf, a sacrificial film 144, and a protective film 146 are formed to cover them. In addition, a resist mask 143 is formed in a position that is over the protective film 146 and overlaps with the pixel electrode 111.

Figure 20B:
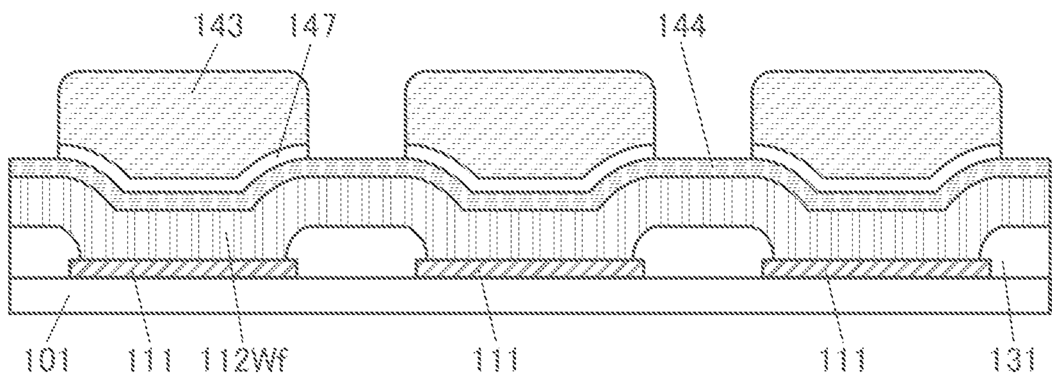

Next, part of the protective film 146 that is not covered with the resist mask 143 is removed by etching, whereby a protective layer 147 having an island-like shape or a band-like shape is formed (FIG. 20B).

Figure 20C:
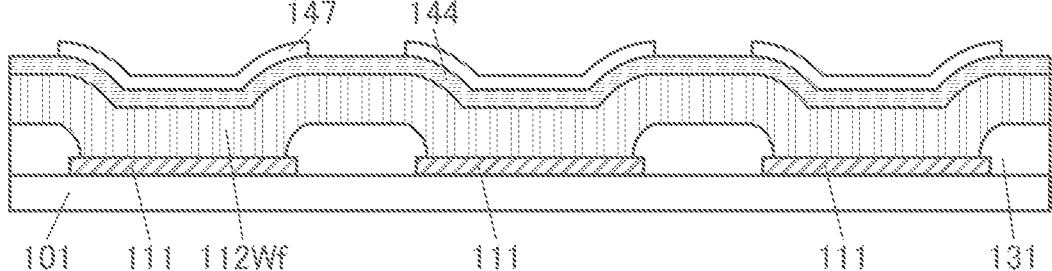

Next, the resist mask 143 is removed (FIG. 20C).

Figure 20D:
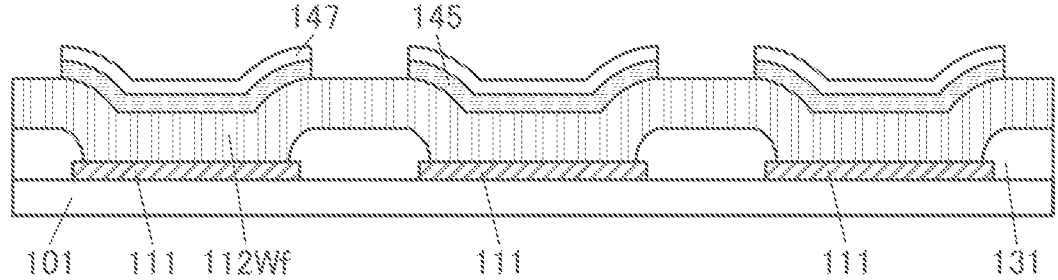

Next, the sacrificial film 144 that is not covered with the protective layer 147 is removed by etching using the protective layer 147 as a mask, so that a sacrificial layer 145 is formed (FIG. 20D).

Figure 21A:
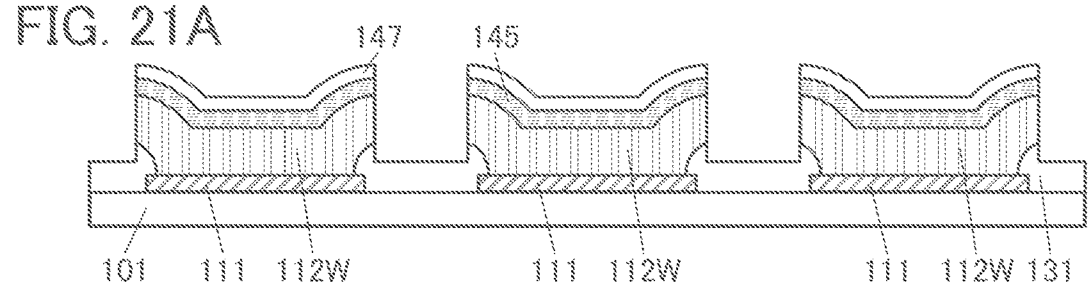
FIG. 21A to FIG. 21E are diagrams illustrating an example of a method of fabricating a display device.

Then, the EL film 112Wf that is not covered with the protective layer 147 is removed by etching using the protective layer 147 as a mask, whereby the EL film 112Wf is divided. Thus, a plurality of EL layers 112W each having a band-like shape are formed (FIG. 21A).

Next, the protective layer 147 is removed by etching.

Figure 21B:
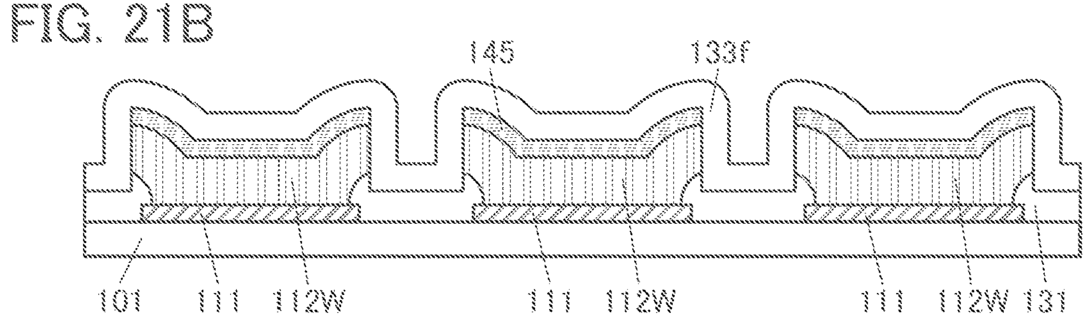

Next, the insulating film 133*f* is formed over the insulating layer 131 and the sacrificial layer 145 (FIG. 21B).

Figure 21C:
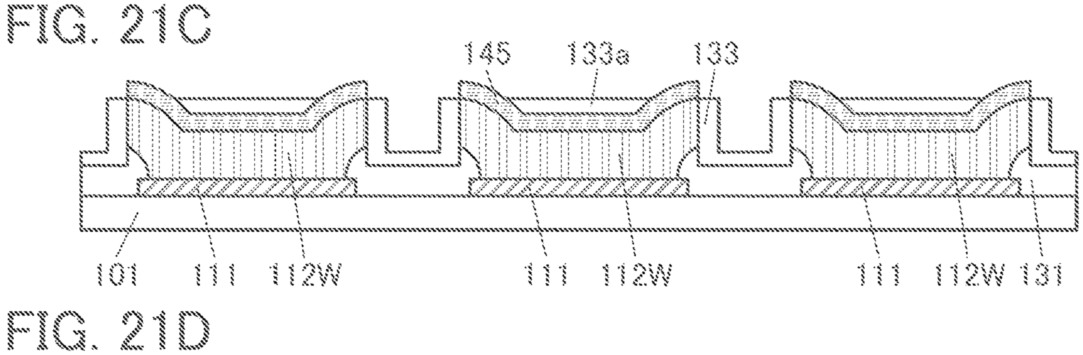

Next, part of the insulating film 133*f* is removed by anisotropic etching to expose the sacrificial layer 145. Thus, the insulating layer 133 covering the side surface of the EL layer 112W is formed (FIG. 21C). As the anisotropic etching, a dry etching method can be suitably used, for example.

Figure 21D:
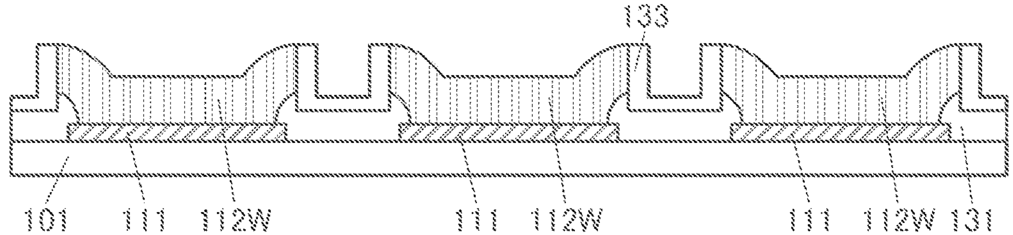

After that, the sacrificial layer 145 over the EL layer 112 is removed to expose a top surface of the EL layer 112W (FIG. 21D).

Next, the layer 116 and the common electrode 113 are formed to cover the EL layers 112W and the insulating layers 131, whereby a plurality of light-emitting devices 110W can be fabricated.

Figure 21E:
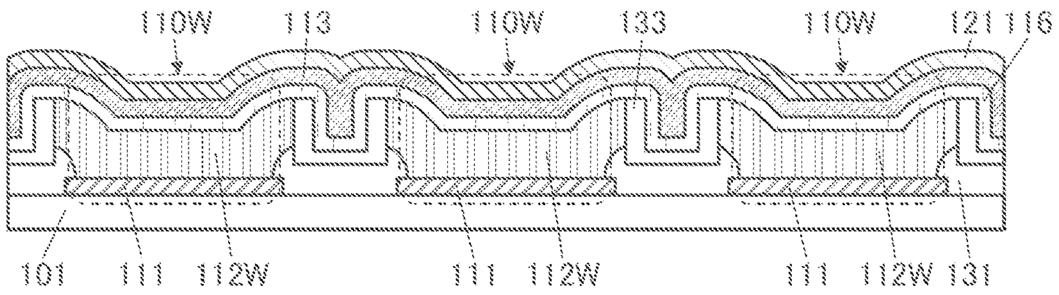

Next, the protective layer 121 is formed to cover the common electrode 113 (FIG. 21E).

Subsequently, the coloring layer 122R, the coloring layer 122G, and the coloring layer 122B are each formed over the protective layer 121. Each of the coloring layer 122R, the coloring layer 122G, and the coloring layer 122B can be formed by a photolithography method using a photosensitive resin.

Through the above steps, the display device 150 described as an example in Structure example 9 can be fabricated.

Fabrication Method Example 4

A fabrication method example that is partly different from Fabrication method example 3 described above will be described below. Note that description of the same portions as Fabrication method example 3 described above is omitted and different portions will be described.

As in Fabrication method example 3, components up to the insulating film 133*f* over the insulating layer 131 and the sacrificial layer 145 are formed (FIG. 21B). The description in Fabrication method example 3 can be referred to for the steps up to the formation of the insulating film 133*f*; thus, the detailed description is omitted.

Figure 22:
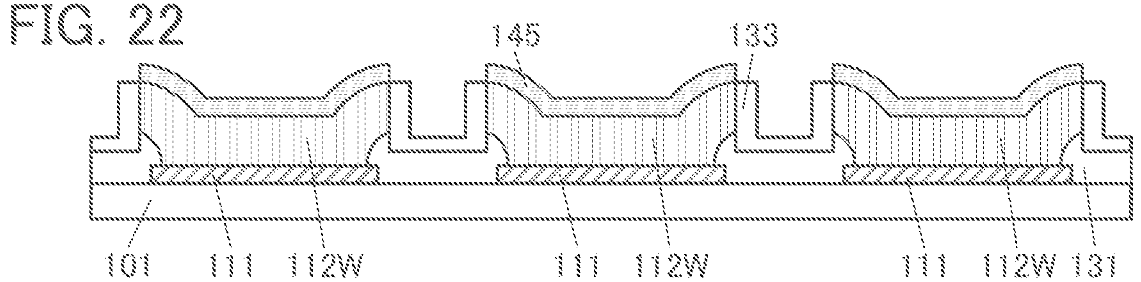
FIG. 22 is a diagram illustrating a method of fabricating a display device.

Next, part of the insulating film 133*f* is removed by anisotropic etching to expose the sacrificial layer 145. Thus, the insulating layer 133 covering the side surface of the EL layer 112W is formed (FIG. 22). As the anisotropic etching, a dry etching method can be suitably used, for example.

After that, the sacrificial layer 145 over the EL layer 112 is removed to expose the top surface of the EL layer 112W (FIG. 21D). The above description in <Fabrication method example 3> can be referred to for the steps after the removal of the sacrificial layer 145; thus, the detailed description is omitted.

Through the above steps, the display device 150 can be fabricated.

At least part of this embodiment can be implemented in combination with the other embodiments described in this specification as appropriate.

Embodiment 2

In this embodiment, structure examples of display devices of one embodiment of the present invention will be described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 23:
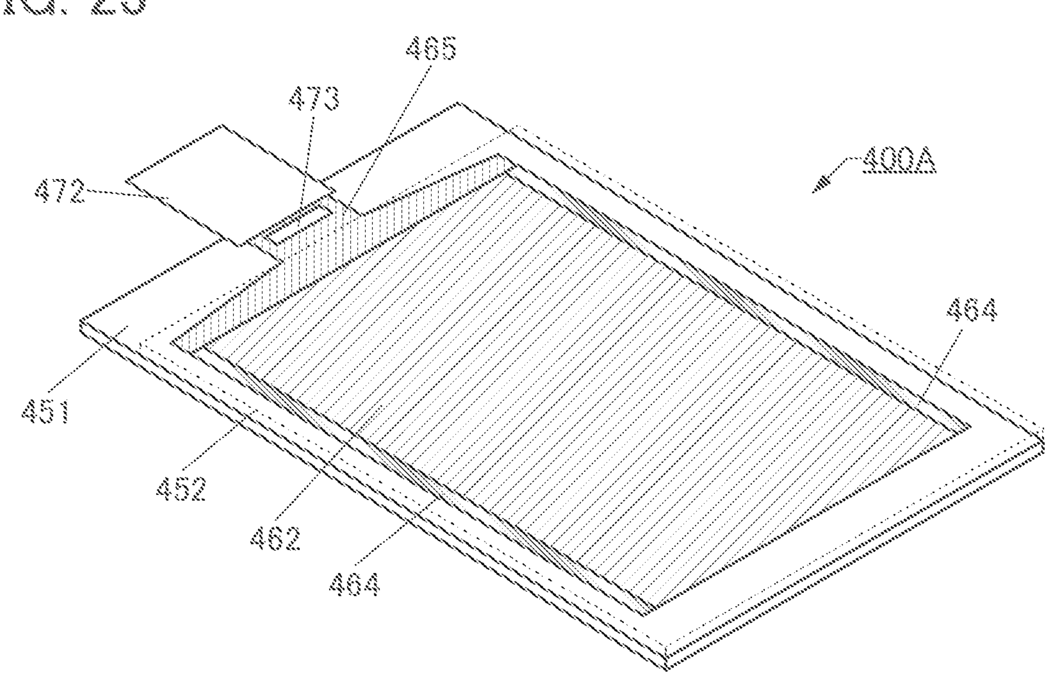
FIG. 23 is a perspective view illustrating an example of a display device.
Figures 24A, 24B:
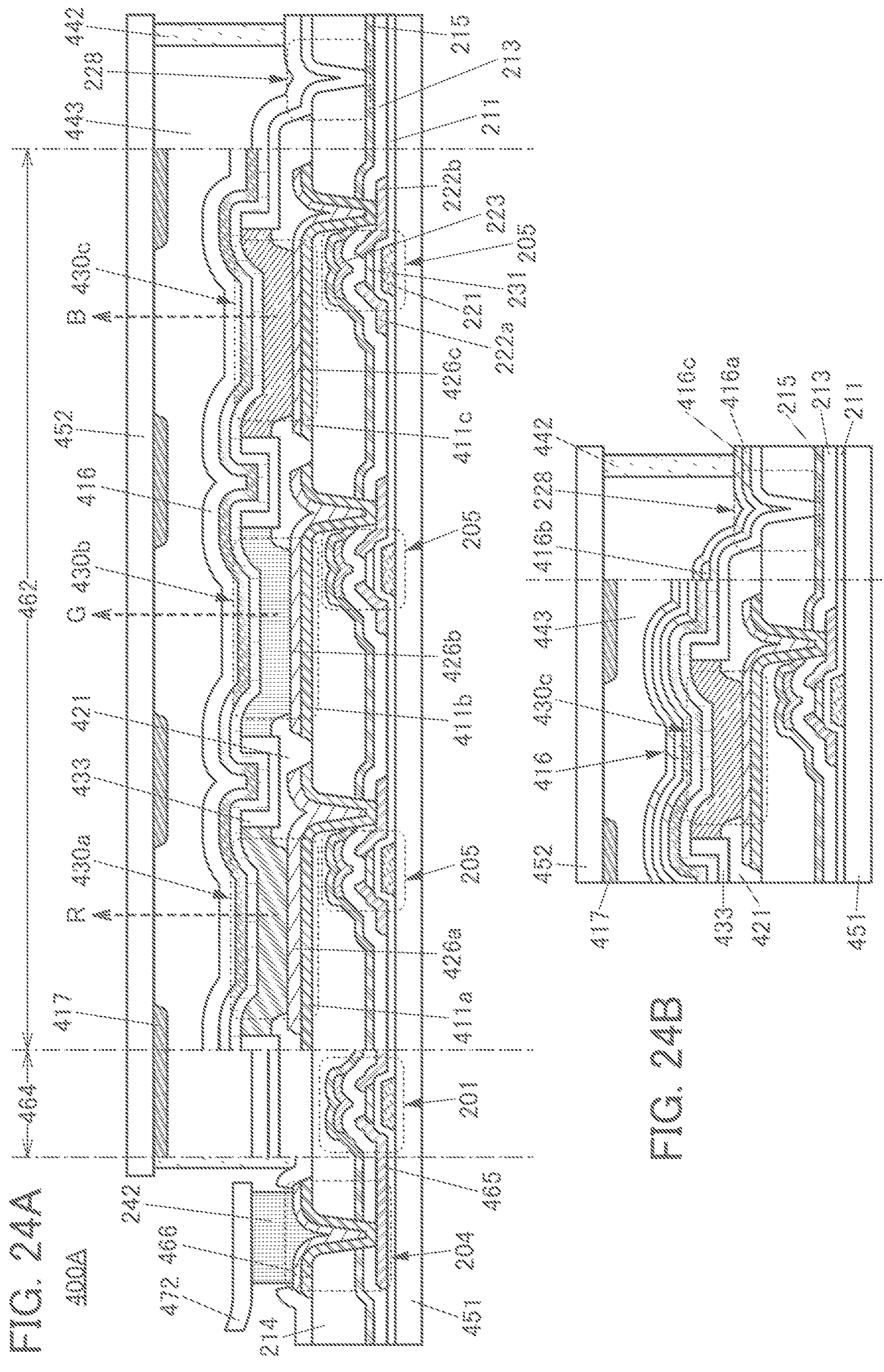
FIG. 24A and FIG. 24B are cross-sectional views illustrating examples of a display device.

FIG. 23 is a perspective view of a display device 400A, and FIG. 24A is a cross-sectional view of the display device 400A.

The display device 400A has a structure in which a substrate 452 and a substrate 451 are bonded to each other. In FIG. 23, the substrate 452 is denoted by a dashed line.

The display device 400A includes a display portion 462, a circuit 464, a wiring 465, and the like. FIG. 23 illustrates an example in which an IC 473 and an FPC 472 are mounted on the display device 400A. Thus, the structure illustrated in FIG. 23 can be regarded as a display module including the display device 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or from the IC 473.

FIG. 23 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 24A illustrates an example of cross sections of part of a region including the FPC 472, part of the circuit 464, part of the display portion 462, and part of a region including an end portion of the display device 400A.

The display device 400A illustrated in FIG. 24A includes a transistor 201, a transistor 205, a light-emitting device 430*a* that emits red light, a light-emitting device 430*b* that emits green light, a light-emitting device 430*c* that emits blue light, and the like between the substrate 451 and the substrate 452.

The light-emitting device described in Embodiment 1 can be used as the light-emitting device 430*a*, the light-emitting device 430*b*, and the light-emitting device 430*c*.

In the case where a pixel of the display device includes three kinds of subpixels including light-emitting devices emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure, a hollow sealing structure, or the like can be employed to seal the light-emitting devices. In FIG. 24A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting device. The space 443 surrounded by the substrate 452, the adhesive layer 442, and the substrate 451 may be filled with a resin different from that of the adhesive layer 442.

The light-emitting devices 430*a*, 430*b*, and 430*c* each include an optical adjustment layer between a pixel electrode and an EL layer. The light-emitting device 430*a* includes an optical adjustment layer 426*a*, the light-emitting device 430*b* includes an optical adjustment layer 426*b*, and the light-emitting device 430*c* includes an optical adjustment layer 426*c*. Refer to Embodiment 1 for the details of the light-emitting devices.

A pixel electrode 411*a*, a pixel electrode 411*b*, and a pixel electrode 411*c* are each connected to a conductive layer 222*b* included in the transistor 205 through an opening provided in an insulating layer 214.

The end portions of the pixel electrodes and the optical adjustment layers are covered with an insulating layer 421. The pixel electrodes each contain a material that reflects visible light, and a counter electrode contains a material that transmits visible light.

Light from the light-emitting device is emitted toward the substrate 452 side. For the substrate 452, a material having a high visible-light-transmitting property is preferably used.

The transistor 201 and the transistor 205 are formed over the substrate 451. These transistors can be fabricated using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400A. This can inhibit entry of impurities from the end portion of the display device 400A through the organic insulating film. Alternatively, the organic insulating film may be formed such that its end portion is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 24A, an opening is formed in the insulating layer 214. This can inhibit entry of impurities into the display portion 462 from the outside through the insulating layer 214 even when an organic insulating film is used as the insulating layer 214. Consequently, the reliability of the display device 400A can be increased.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as agate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the transistors, and any of an amorphous semiconductor and semiconductors having crystallinity (a microcrystalline semiconductor, a polycrystalline semiconductor, a single crystal semiconductor, and a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display device in this embodiment. Alternatively, a semiconductor layer of a transistor may contain silicon.

Examples of silicon include amorphous silicon and crystalline silicon (e.g., low-temperature polysilicon or single crystal silicon).

The semiconductor layer preferably contains indium, an element M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 416 covering the light-emitting devices inhibits entry of impurities such as water into the light-emitting devices; as a result, the reliability of the light-emitting devices can be increased.

In the region 228 in the vicinity of the end portion of the display device 400A, the insulating layer 215 and the protective layer 416 are preferably in contact with each other through an opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the display device 400A can be increased.

FIG. 24B illustrates an example in which the protective layer 416 has a three-layer structure. In FIG. 24B, the protective layer 416 includes an inorganic insulating layer 416*a* over the light-emitting device 430*c*, an organic insulating layer 416*b* over the inorganic insulating layer 416*a*, and an inorganic insulating layer 416*c* over the organic insulating layer 416*b*.

The end portion of the inorganic insulating layer 416*a* and the end portion of the inorganic insulating layer 416*c* extend beyond the end portion of the organic insulating layer 416*b* and are in contact with each other. The inorganic insulating layer 416*a* is in contact with the insulating layer 215 (inorganic insulating layer) through the opening in the insulating layer 214 (organic insulating layer). Accordingly, the light-emitting device can be surrounded by the insulating layer 215 and the protective layer 416, whereby the reliability of the light-emitting device can be increased.

As described above, the protective layer 416 may have a stacked-layer structure of an organic insulating film and an inorganic insulating film. In that case, the end portions of the inorganic insulating films preferably extend beyond the end portion of the organic insulating film.

For each of the substrate 451 and the substrate 452, glass, quartz, ceramics, sapphire, a resin, a metal, an alloy, a semiconductor, or the like can be used. The substrate on the side from which light from the light-emitting device is extracted is formed using a material that transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A twocomponent-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode and the common electrode) included in the light-emitting device.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Display Device 400B]

Figures 25A, 25B:
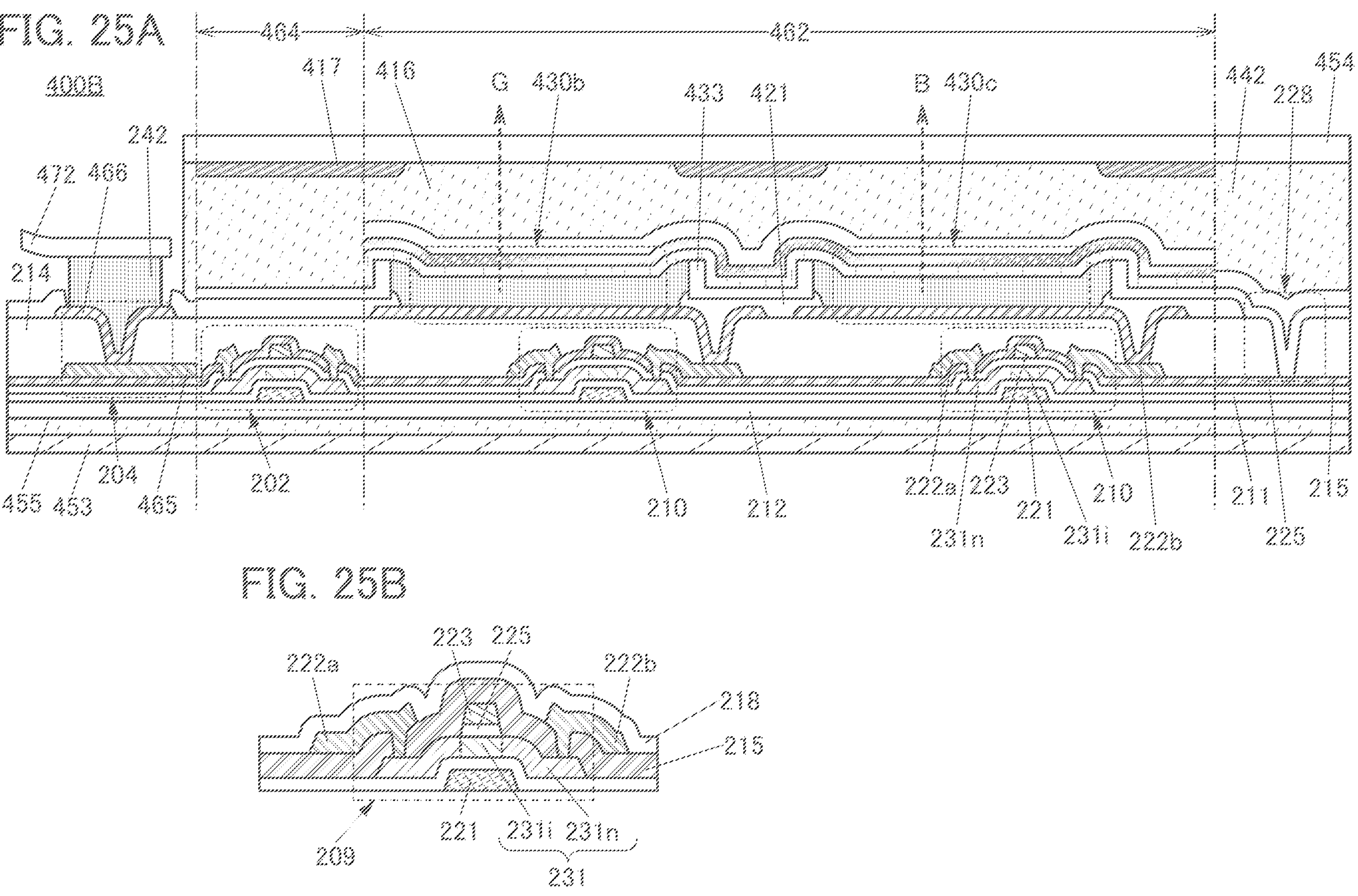
FIG. 25A is a cross-sectional view illustrating an example of a display device.
FIG. 25B is a cross-sectional view illustrating an example of a transistor.

FIG. 25A is a cross-sectional view of a display device 400B. A perspective view of the display device 400B is similar to that of the display device 400A (FIG. 23). FIG. 25A illustrates an example of cross sections of part of a region including the FPC 472, part of the circuit 464, and part of the display portion 462 in the display device 400B. FIG. 25A specifically illustrates an example of a cross section of a region including the light-emitting device 430*b* emitting green light and the light-emitting device 430*c* emitting blue light in the display portion 462. Note that portions similar to those in the display device 400A are not described in some cases.

The display device 400B illustrated in FIG. 25A includes a transistor 202, transistors 210, the light-emitting device 430*b*, the light-emitting device 430*c*, and the like between a substrate 453 and a substrate 454.

The substrate 454 and the protective layer 416 are bonded to each other with the adhesive layer 442. The adhesive layer 442 is provided to overlap with the light-emitting device 430*b* and the light-emitting device 430*c*, and the display device 400B employs a solid sealing structure.

The substrate 453 and an insulating layer 212 are bonded to each other with an adhesive layer 455.

As a method of fabricating the display device 400B, first, a formation substrate provided with the insulating layer 212, the transistors, the light-emitting devices, and the like and the substrate 454 provided with the light-blocking layer 417 are bonded to each other with the adhesive layer 442. Then, the substrate 453 is attached to a surface exposed by separation of the formation substrate, whereby the components formed over the formation substrate are transferred to the substrate 453. The substrate 453 and the substrate 454 are preferably flexible. Accordingly, the display device 400B can be highly flexible.

The inorganic insulating film that can be used as the insulating layer 211, the insulating layer 213, and the insulating layer 215 can be used as the insulating layer 212.

The pixel electrode is connected to the conductive layer 222*b* included in the transistor 210 through the opening provided in the insulating layer 214. The conductive layer 222*b* is connected to a low-resistance region 231*n* through an opening provided in the insulating layer 215 and an insulating layer 225. The transistor 210 has a function of controlling the driving of the light-emitting device.

The end portions of the pixel electrode are covered with the insulating layer 421. A side surface of the EL layer is covered with the insulating layer 433.

Light from the light-emitting devices 430*b* and 430*c* is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 25A illustrates an example in which the insulating layer 225 covers the top and side surfaces of the semiconductor layer. The conductive layer 222*a* and the conductive layer 222*b* are connected to the corresponding low-resistance regions 231*n* through openings provided in the insulating layer 225 and the insulating layer 215.

In a transistor 209 illustrated in FIG. 25B, the insulating layer 225 overlaps with the channel formation region 231*i* of the semiconductor layer 231 and does not overlap with the low-resistance regions 231*n*. The structure illustrated in FIG. 25B is obtained by processing the insulating layer 225 with the conductive layer 223 as a mask, for example. In FIG. 25B, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

Embodiment 3

In this embodiment, a structure example of a display device different from those described above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

<Display Module>

Figure 26A:
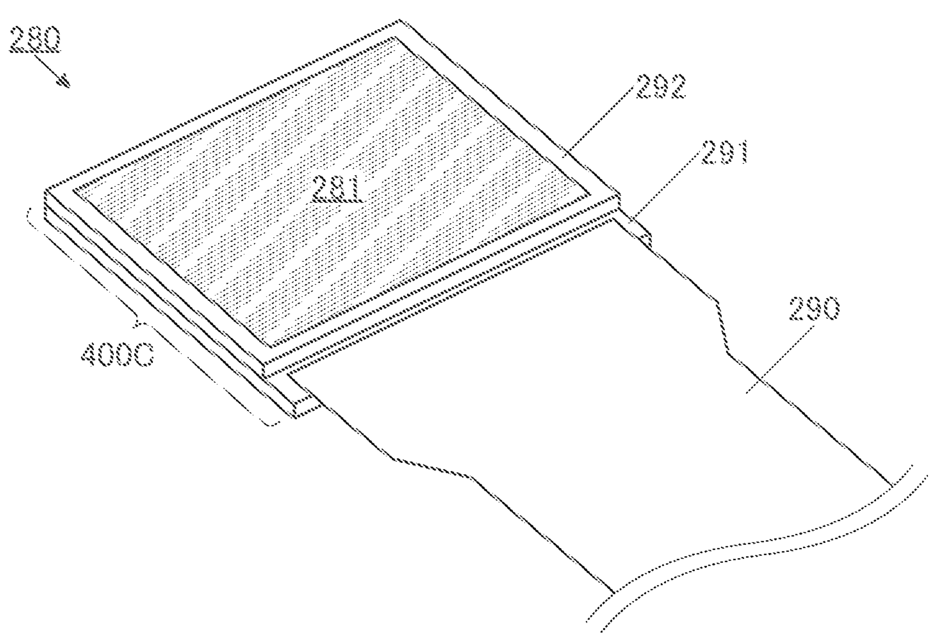
FIG. 26A and FIG. 26B are perspective views illustrating an example of a display module.

FIG. 26A is a perspective view of a display module 280. The display module 280 includes a display device 400C and an FPC 290. Note that the display device included in the display module 280 is not limited to the display device 400C and may be a display device 400D or a display device 400E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 26B:
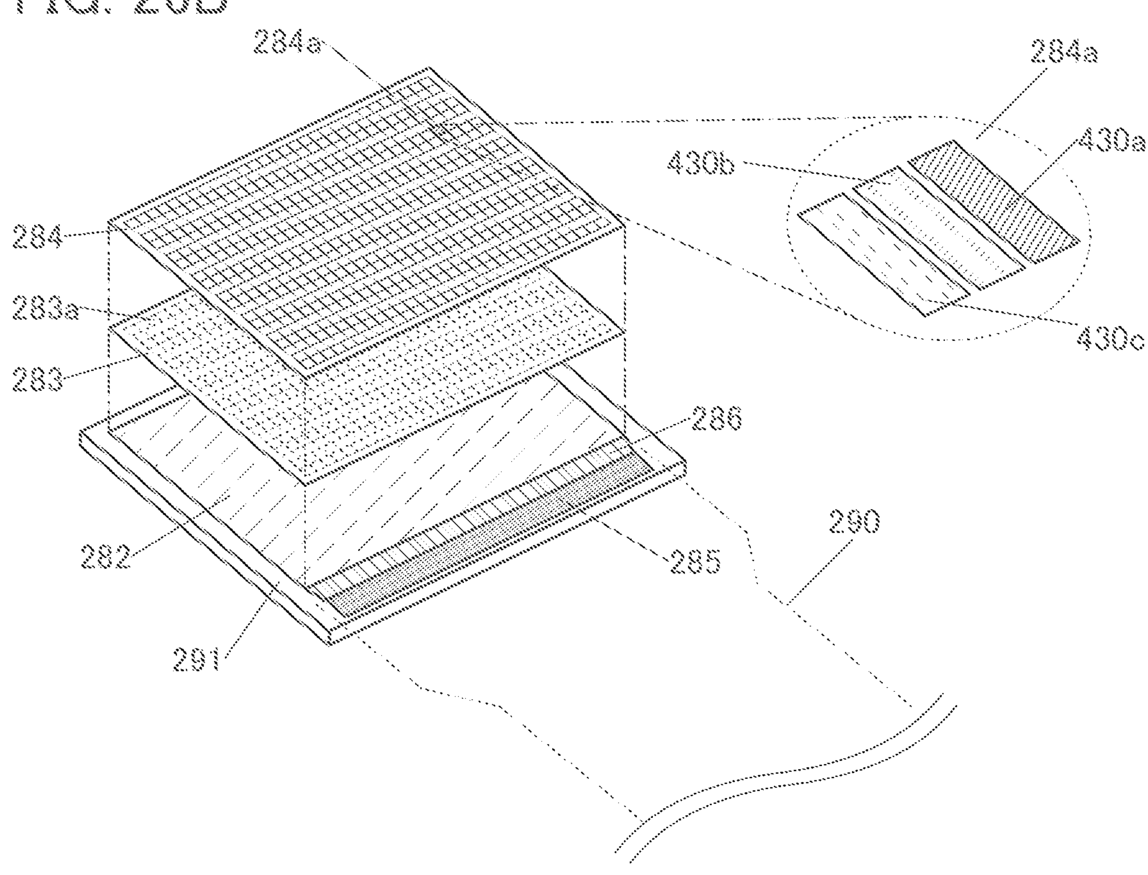

FIG. 26B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion that is over the substrate 291 and does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 26B. The pixel 284*a* includes the light-emitting devices 430*a*, 430*b*, and 430*c* that emit light of different colors from each other. The plurality of light-emitting devices may be arranged in a stripe pattern as illustrated in FIG. 26B. Alternatively, a variety of arrangement methods, such as delta arrangement and PenTile arrangement, can be employed.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to one of a source and a drain of the selection transistor. Thus, an active-matrix display device is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as ahead-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device such as a watch-type device.

<Display Device 400C>

Figure 27:
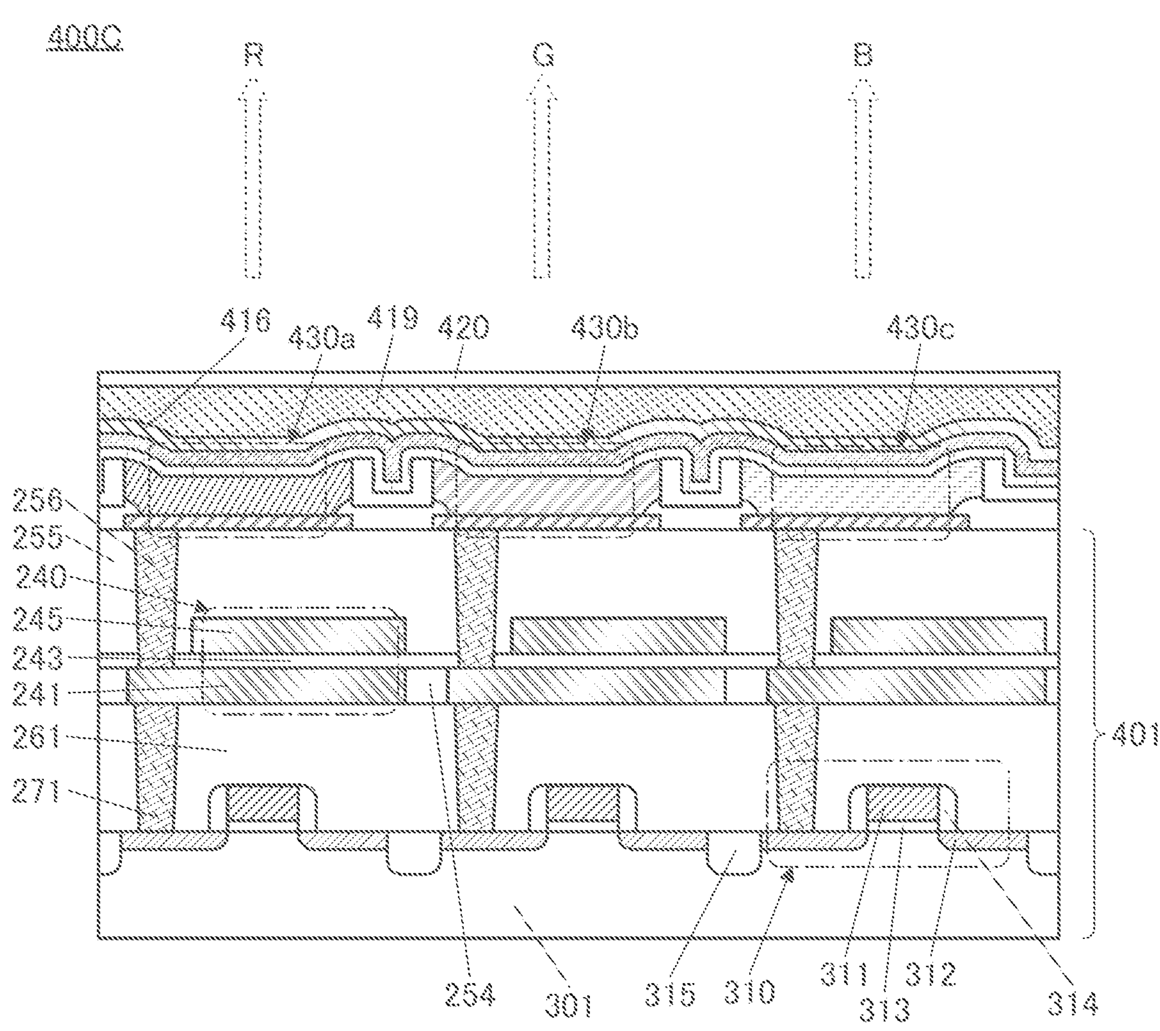
FIG. 27 is a cross-sectional view illustrating an example of a display device.

The display device 400C illustrated in FIG. 27 includes a substrate 301, the light-emitting devices 430*a*, 430*b*, and 430*c*, a capacitor 240, and a transistor 310.

The substrate 301 corresponds to the substrate 291 illustrated in FIG. 26A and FIG. 26B. A stacked-layer structure 401 including the substrate 301 and the components thereover up to an insulating layer 255 corresponds to the substrate in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer.

The low-resistance regions 312 are regions where the substrate 301 is doped with an impurity, and function as a source and a drain. The insulating layer 314 is provided to cover the side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting devices 430*a*, 430*b*, and 430*c* and the like are provided over the insulating layer 255. The protective layer 416 is provided over the light-emitting devices 430*a*, 430*b*, and 430*c*, and a substrate 420 is bonded to the top surface of the protective layer 416 with a resin layer 419. The substrate 420 corresponds to the substrate 292 illustrated in FIG. 26A.

The pixel electrode of the light-emitting device is electrically connected to one of the source and the drain of the transistor 310 through a plug 256 embedded in the insulating layer 255, the conductive layer 241 embedded in the insulating layer 254, and the plug 271 embedded in the insulating layer 261.

<Display Device 400D>

Figure 28:
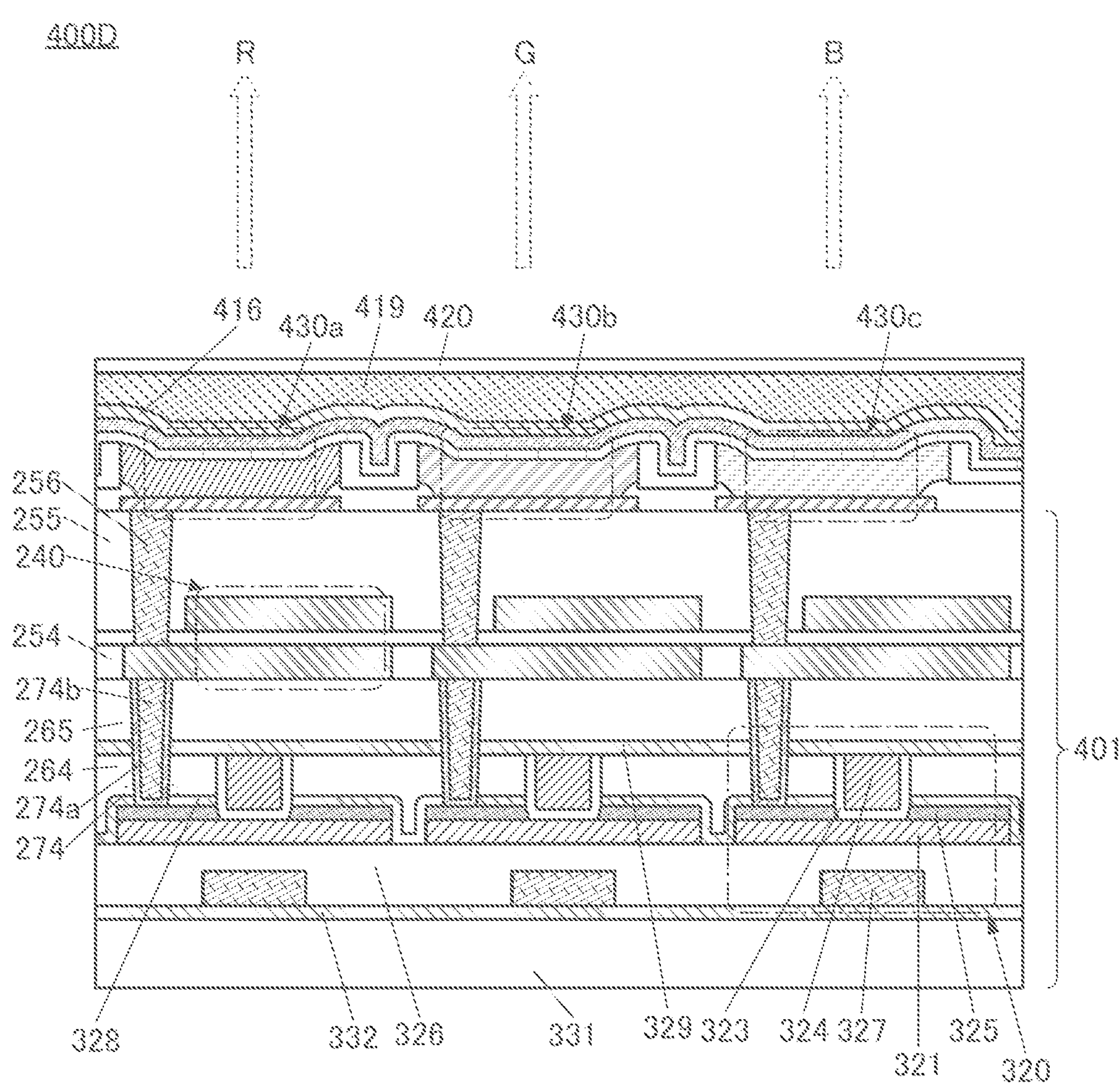
FIG. 28 is a cross-sectional view illustrating an example of a display device.

The display device 400D illustrated in FIG. 28 differs from the display device 400C mainly in a structure of a transistor. Note that portions similar to those in the display device 400C are not described in some cases.

A transistor 320 is a transistor that contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 26A and FIG. 26B. The stacked-layer structure 401 including the substrate 331 and the components thereover up to the insulating layer 255 corresponds to the layer including a transistor in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. A material that can be suitably used for the semiconductor layer 321 will be described in detail later.

The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material through which hydrogen and oxygen are less likely to diffuse is preferably used for the conductive layer 274*a*.

The structures of the insulating layer 254 and the components thereover up to the substrate 420 in the display device 400D are similar to those in the display device 400C.

<Display Device 400E>

Figure 29:
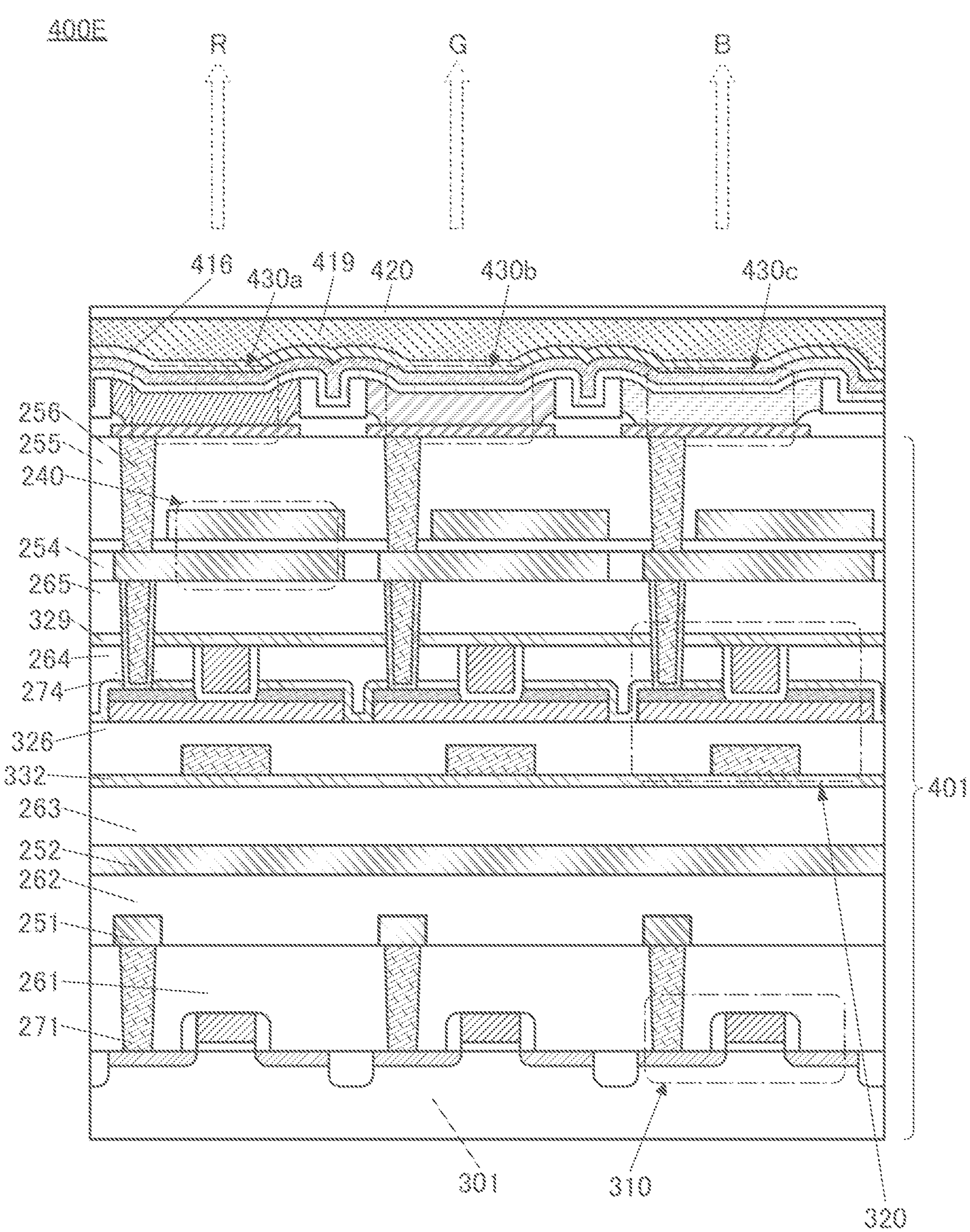
FIG. 29 is a cross-sectional view illustrating an example of a display device.

The display device 400E illustrated in FIG. 29 has a structure in which the transistor 310 whose channel is formed in the substrate 301 and the transistor 320 including a metal oxide in the semiconductor layer where the channel is formed are stacked. Note that portions similar to those in the display devices 400C and 400D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display device can be downsized as compared with the case where a driver circuit is provided around a display region.

At least part of the structure examples, the drawings corresponding thereto, and the like described in this embodiment as an example can be combined with the other structure examples, the other drawings, and the like as appropriate.

Embodiment 4

Described in this embodiment is a metal oxide (also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including completely amorphous), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of a crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

<CAAC-OS>

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction or an interatomic bond distance changed by substitution of a metal atom.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

<nc-OS>

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

<a-Like OS>

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS will be described in detail. Note that the CAC-OS relates to the material composition.

<CAC-OS>

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with <In>, <Ga>, and <Zn>, respectively. For example, the first region in the CAC-OS in the In—Ga—Zn oxide has <In> higher than <In> in the composition of the CAC-OS film. Moreover, the second region has <Ga> higher than <Ga> in the composition of the CAC-OS film. For example, the first region has higher <In> and lower <Ga> than the second region. Moreover, the second region has higher <Ga> and lower <In> than the first region.

Specifically, the first region includes an indium oxide, an indium zinc oxide, or the like as its main component. The second region includes a gallium oxide, a gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible; for example, the ratio of the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 5

In this embodiment, electronic devices of one embodiment of the present invention will be described with reference to FIG. 30 to FIG. 33.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be fabricated at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display device of one embodiment of the present invention can have a high resolution, and thus can be suitably used for an electronic device having a relatively small display portion. As such an electronic device, a watch-type or bracelet-type information terminal (wearable device); and a wearable device worn on a head, such as a device for VR such as a head-mounted display and a glasses-type device for AR can be given, for example. Examples of wearable devices include a device for SR and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high definition and high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 30A:
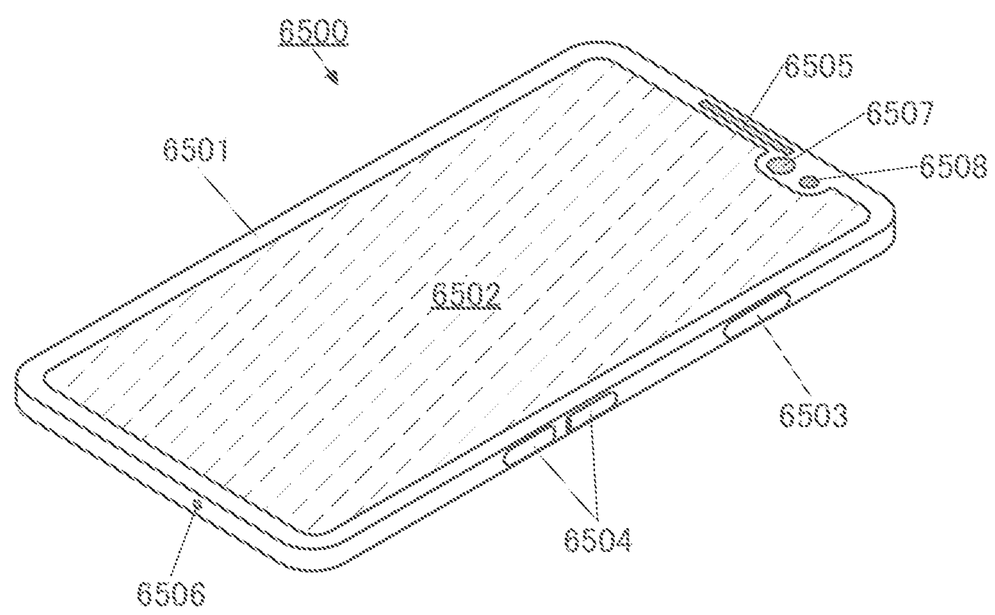
FIG. 30A and FIG. 30B are drawings illustrating an example of an electronic device.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 30B:
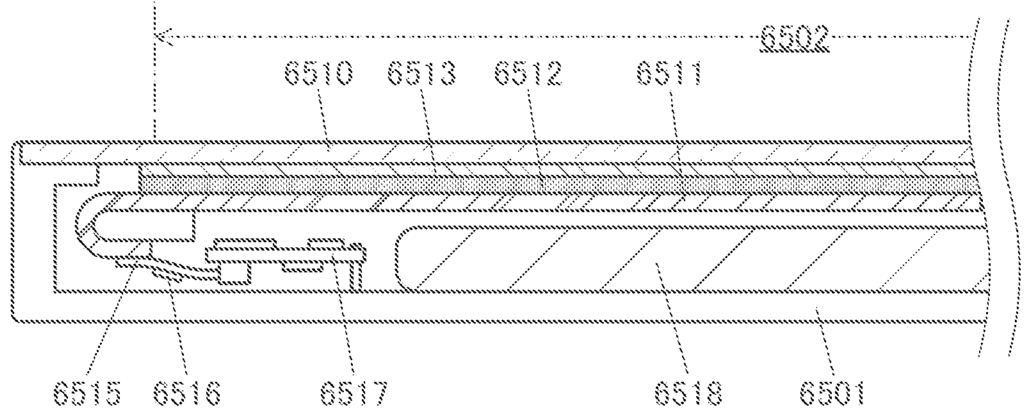

FIG. 30B is a schematic cross-sectional view including an end portion of the housing 6501 on the microphone 6506 side.

A protection member 6510 having a light-transmitting property is provided on a display surface side of the housing

6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

Figures 31A, 31B, 31C, 31D:
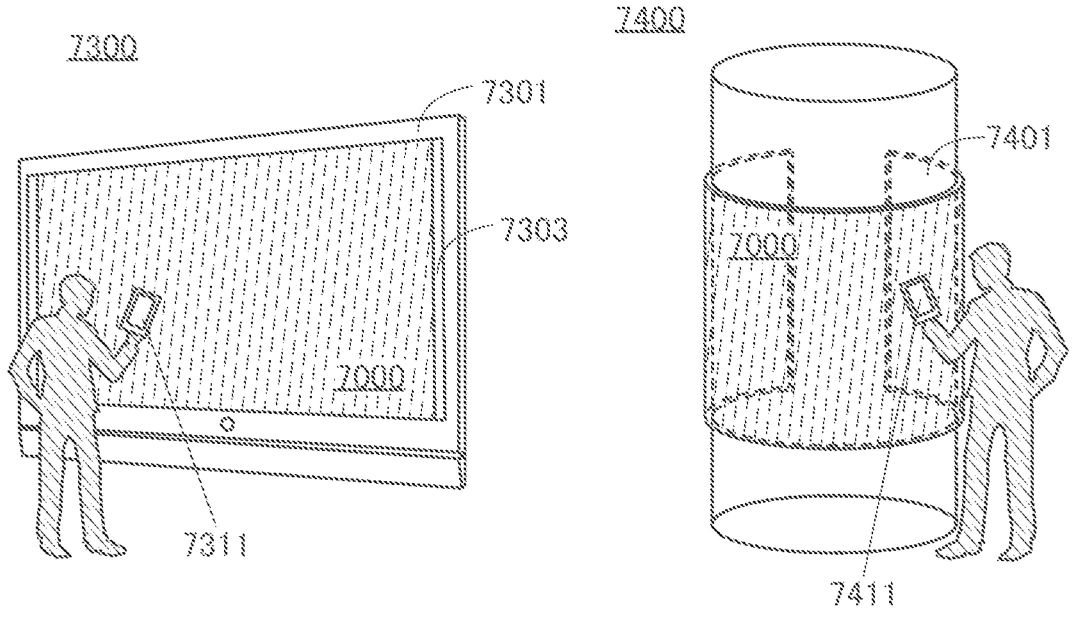
FIG. 31A to FIG. 31D are diagrams illustrating examples of electronic devices.

FIG. 31A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 31A can be performed with an operation switch provided in the housing 7101 and a separate remote controller 7111.

Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

FIG. 31B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 31C and FIG. 31D illustrate examples of digital signage.

Digital signage 7300 illustrated in FIG. 31C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 31D illustrates digital signage 7400 mounted on a cylindrical pillar 7401. The digital signage 7400 includes the display portion 7000 provided along a curved surface of the pillar 7401.

The display device of one embodiment of the present invention can be used in the display portion 7000 in each of FIG. 31C and FIG. 31D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 31C and FIG. 31D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figures 32A, 32B, 32C, 32D, 32E, 32F:
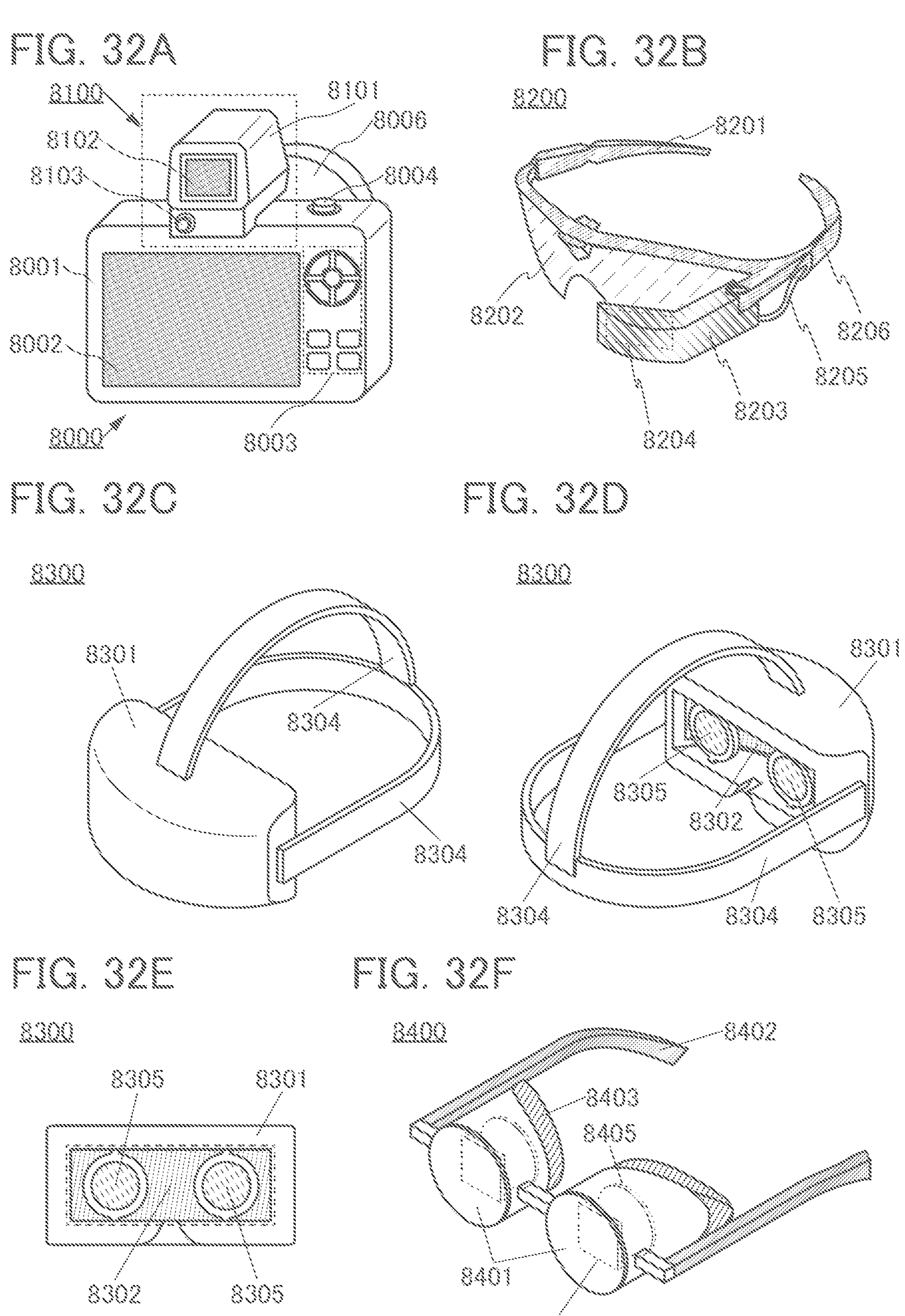
FIG. 32A to FIG. 32F are diagrams illustrating examples of electronic devices.

FIG. 32A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power button or the like.

The display device of one embodiment of the present invention can be used in the display portion 8002 of the camera 8000 and the display portion 8102 of the finder 8100. Note that a finder may be incorporated in the camera 8000.

FIG. 32B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203.

The main body 8203 includes a wireless receiver or the like to receive video information and display it on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display device of one embodiment of the present invention can be used in the display portion 8204.

FIG. 32C to FIG. 32E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved so that the user can feel high realistic sensation. Another image displayed on another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 32E. In other words, a video with a strong sense of reality can be seen by the user with use of the display portion 8302.

FIG. 32F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism, and the focus adjustment mechanism can adjust the position of the lens 8405 according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy videos and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 33A to FIG. 33F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays), a microphone 9008, and the like.

The electronic devices illustrated in FIG. 33A to FIG. 33F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices illustrated in FIG. 33A to FIG. 33F will be described in detail below.

Figures 33A, 33B, 33C, 33D, 33E, 33F:
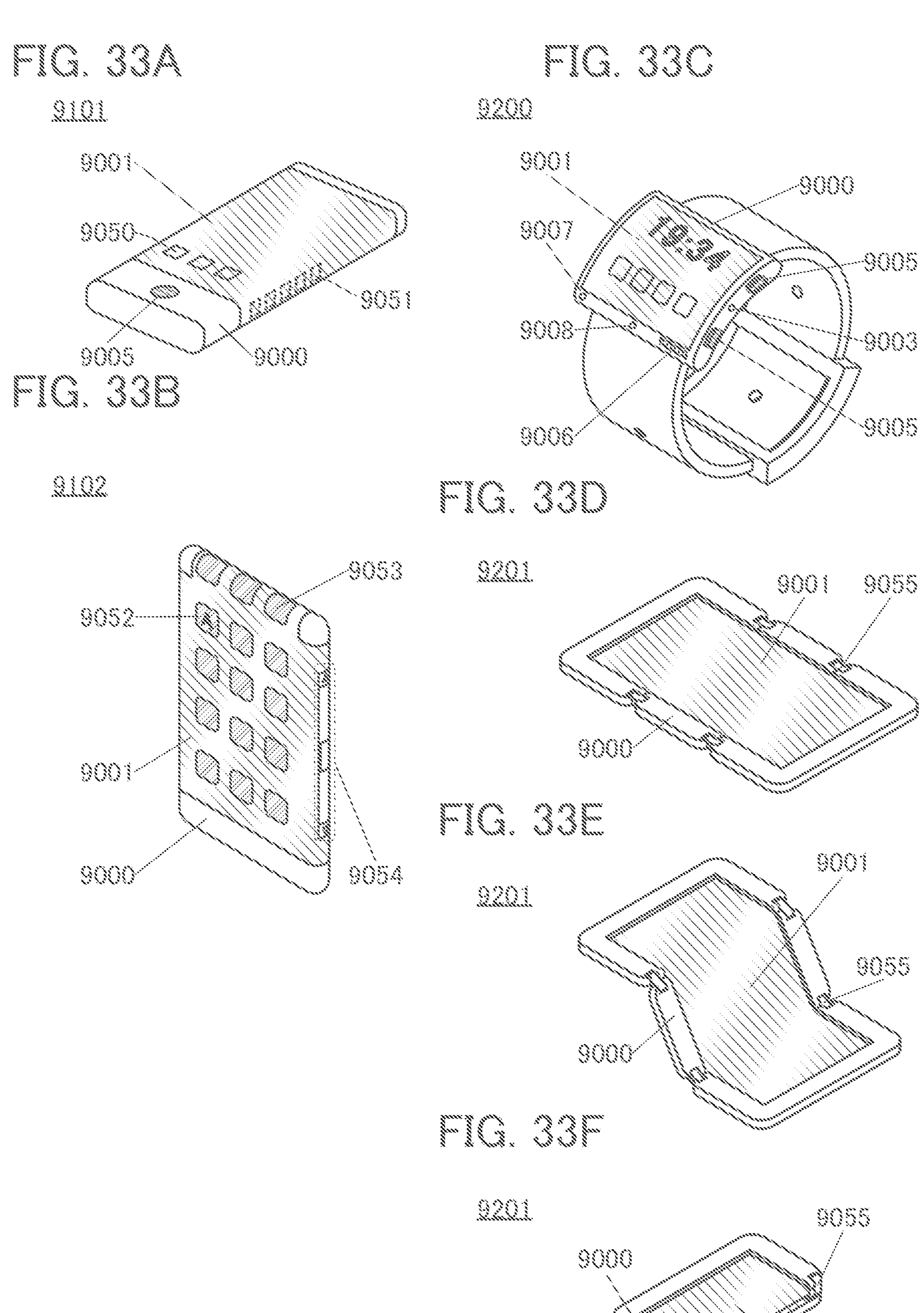
FIG. 33A to FIG. 33F are diagrams illustrating examples of electronic devices.

FIG. 33A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 33A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the reception strength of an antenna. Alternatively, the icon 9050 or the like may be displayed at the position where the information 9051 is displayed.

FIG. 33B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 33C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 33D to FIG. 33F are perspective views illustrating a foldable portable information terminal 9201. FIG. 33D is a perspective view of an opened state of the portable information terminal 9201, FIG. 33F is a perspective view of a folded state thereof, and FIG. 33E is a perspective view of a state in the middle of change from one of FIG. 33D and FIG. 33F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

REFERENCE NUMERALS

100A: display device, 100B: display device, 100C: display device, 100D: display device, 100E: display device, 100F: display device, 100G: display device, 100: display device, 101: substrate, 110B: light-emitting device, 110G: light-emitting device, 110R: light-emitting device, 110W: light-emitting device, 110: light-emitting device, 111B: pixel electrode, 111G: pixel electrode, 111R: pixel electrode, 111: pixel electrode, 112B: EL layer, 112Bf: EL film, 112G: EL layer, 112Ga: EL layer, 112Gf EL film, 112R: EL layer, 112Rf: EL film, 112W: EL layer, 112Wf EL film, 112: EL layer, 113: common electrode, 115B: optical adjustment layer, 115G: optical adjustment layer, 115R: optical adjustment layer, 116*a*: layer, 116*b*: layer, 116: layer, 120B: light-emitting unit, 120G: light-emitting unit, 120R: light-emitting unit, 121: protective layer, 122B: coloring layer, 122G: coloring layer, 122R: coloring layer, 131*a*B: height, 131*a*C: height, 131*a*R: height, 131*b*C: height, 131*b*G: height, 131*b*R: height, 131*c*B: height, 131*c*C: height, 131*c*G: height, 131: insulating layer, 133*a*: insulating layer, 133*f* insulating film, 133*w*: width, 133: insulating layer, 143*a*: resist mask, 143*b*: resist mask, 143*c*: resist mask, 143: resist mask, 144*a*: sacrificial film, 144*b*: sacrificial film, 144*c*: sacrificial film, 144: sacrificial film, 145*a*: sacrificial layer, 145*b*: sacrificial layer, 145*c*: sacrificial layer, 145: sacrificial layer, 146*a*: protective film, 146*b*: protective film, 146*c*: protective film, 146: protective film, 147*a*: protective layer, 147*b*: protective layer, 147*c*: protective layer, 147: protective layer, 150: display device, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231*i*: channel formation region, 231*n*: low-resistance region, 231: semiconductor layer, 240: capacitance, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 400A: display device, 400B: display device, 400C: display device, 400D: display device, 400E: display device, 401: stacked-layer structure, 411*a*: pixel electrode, 411*b*: pixel electrode, 411*c*: pixel electrode, 416*a*: inorganic insulating layer, 416*b*: organic insulating layer, 416*c*: inorganic insulating layer, 416: protective layer, 417: light-blocking layer, 419: resin layer, 420: substrate, 421: insulating layer, 426*a*: optical adjustment layer, 426*b*: optical adjustment layer, 426*c*: optical adjustment layer, 430*a*: light-emitting device, 430*b*: light-emitting device, 430*c*: light-emitting device, 433: insulating layer, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 511: light-emitting layer, 512: light-emitting layer, 513: light-emitting layer, 520: layer, 522: layer, 530: layer, 532: layer, 540: intermediate layer, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A method of fabricating a display device, comprising the steps of:

forming a first pixel electrode and a second pixel electrode;

forming a first insulating layer comprising a region covering an end portion of the first pixel electrode and a region covering an end portion of the second pixel electrode;

forming a first EL film over the first pixel electrode, the first insulating layer, and the second pixel electrode;

forming a first sacrificial film covering the first EL film;

etching the first sacrificial film to form a first sacrificial layer comprising a region overlapping with the first pixel electrode;

etching the first EL film and a part of the first insulating layer using the first sacrificial layer as a mask to form a first EL layer and a second insulating layer each comprising a region overlapping with the first sacrificial layer and to expose the second pixel electrode and a part of a top surface of the second insulating layer;

forming a second EL film over the first sacrificial layer, the second insulating layer, and the second pixel electrode;

forming a second sacrificial film covering the second EL film;

etching the second sacrificial film to form a second sacrificial layer comprising a region overlapping with the second pixel electrode;

etching the second EL film and a part of the second insulating layer using the second sacrificial layer as a mask to form a second EL layer comprising a region overlapping with the second sacrificial layer and a third insulating layer comprising a first region overlapping with the first sacrificial layer and a second region overlapping with the second sacrificial layer and to expose a part of a top surface of the third insulating layer;

forming an insulating film covering a top surface and a side surface of the first sacrificial layer, a side surface of the first EL layer, the top surface of the third insulating layer, a top surface and a side surface of the second sacrificial layer, and a side surface of the second EL layer;

etching the insulating film to form a first fourth insulating layer comprising a region in contact with the side surface of the first EL layer, a region in contact with the part of the top surface of the third insulating layer and a region in contact with the side surface of the second EL layer and to expose the first sacrificial layer and the second sacrificial layer; and removing the first sacrificial layer and the second sacrificial layer.

2. The method of fabricating a display device according to claim 1, wherein the first sacrificial film comprises one or more of a metal film, an alloy film, a metal oxide film, a semiconductor film, and an inorganic insulating film, and wherein dry etching using an etching gas not containing an oxygen gas is employed in the etching of the first EL film.

3. The method of fabricating a display device according to claim 2, wherein the etching gas not containing an oxygen gas is one or more selected from $CF_4$, $C_4F_8$, $SF_6$, $CHF_3$, $Cl_2$, $BCl_3$, $H_2$, and a noble gas.

4. The method of fabricating a display device according to claim 1, further comprising a step of forming a first protective layer comprising a region overlapping with the first pixel electrode after the step of forming the first sacrificial film, wherein the first sacrificial film is etched using the first protective layer as a mask to form the first sacrificial layer.

5. The method of fabricating a display device according to claim 4, further comprising a step of removing the first protective layer before the forming the second EL film.

6. The method of fabricating a display device according to claim 1, further comprising a step of forming a common electrode over a top surface of the first EL layer, a top surface of the second EL layer, and a top surface and a side surface of the first fourth insulating layer after the removing the first sacrificial layer and the second sacrificial layer.

7. The method of fabricating a display device according to claim 6, further comprising a step of forming a layer covering the top surface of the first EL layer, the top surface of the second EL layer, and the top surface and the side surface of the fourth insulating layer before the forming the common electrode, wherein the layer comprises a substance with an electron-injection property.

8. The method of fabricating a display device according to claim 6, further comprising a step of forming a layer covering the top surface of the first EL layer, the top surface of the second EL layer, and the top surface and the side surface of the first fourth insulating layer before the forming the common electrode, wherein the layer has a stacked-layer structure of a first layer containing a substance with an electron-transport property and a second layer containing a substance with an electron-injection property over the first layer.

9. The method of fabricating a display device according to claim 6, further comprising a step of forming a layer covering the top surface of the first EL layer, the top surface of the second EL layer, and the top surface and the side surface of the first fourth insulating layer before the step of forming the common electrode, wherein the layer comprises a substance with a hole-injection property.

10. The method of fabricating a display device according to claim 6, further comprising a step of forming a layer covering the top surface of the first EL layer, the top surface of the second EL layer, and the top surface and the side surface of the fourth insulating layer before the forming the common electrode, wherein the layer has a stacked-layer structure of a first layer containing a substance with a hole-transport property and a second layer containing a substance with a hole-injection property over the first layer.

11. A method of fabricating a display device, comprising the steps of:

forming a first pixel electrode and a second pixel electrode;

forming a first insulating layer comprising a region covering an end portion of the first pixel electrode and a region covering an end portion of the second pixel electrode;

forming a first EL film over the first pixel electrode, the first insulating layer, and the second pixel electrode;

forming a first sacrificial film covering the first EL film;

etching the first sacrificial film to form a first sacrificial layer comprising a region overlapping with the first pixel electrode;

etching the first EL film and a part of the first insulating layer using the first sacrificial layer as a mask to form a first EL layer and a second insulating layer each comprising a region overlapping with the first sacrificial layer and to expose the second pixel electrode and a part of a top surface of the second insulating layer;

forming a second EL film over the first sacrificial layer, the second insulating layer, and the second pixel electrode;

forming a second sacrificial film covering the second EL film;

etching the second sacrificial film to form a second sacrificial layer comprising a region overlapping with the second pixel electrode;

etching the second EL film and a part of the second insulating layer using the second sacrificial layer as a mask to form a second EL layer comprising a region overlapping with the second sacrificial layer and a third insulating layer comprising a first region overlapping with the first sacrificial layer and a second region overlapping with the second sacrificial layer and to expose a part of a top surface of the third insulating layer;

forming an insulating film covering a top surface and a side surface of the first sacrificial layer, a side surface of the first EL layer, the top surface of the third insulating layer, a top surface and a side surface of the second sacrificial layer, and a side surface of the second EL layer;

etching the insulating film to form a fourth insulating layer comprising a region in contact with the side surface of the first EL layer, a region in contact with the part of the top surface of the third insulating layer, and a region in contact with the side surface of the second EL layer and to form a fifth insulating layer over the first sacrificial layer and a sixth insulating layer over the second sacrificial layer; and removing the first sacrificial layer and the second sacrificial layer and removing the fifth insulating layer and the sixth insulating layer.

12. A method of fabricating a display device, comprising the steps of:

forming a first pixel electrode and a second pixel electrode;

forming a first insulating layer comprising a region covering an end portion of the first pixel electrode and a region covering an end portion of the second pixel electrode;

forming an EL film over the first pixel electrode, the first insulating layer, and the second pixel electrode;

forming a sacrificial film covering the EL film;

etching the sacrificial film to form a first sacrificial layer comprising a region overlapping with the first pixel electrode and to form a second sacrificial layer comprising a region overlapping with the second pixel electrode;

etching the EL film and a part of the first insulating layer using the first sacrificial layer and the second sacrificial layer as masks to form a first EL layer comprising a region overlapping with the first sacrificial layer, a second EL layer comprising a region overlapping with the second sacrificial layer, and a second insulating layer comprising a first region overlapping with the first sacrificial layer and a second region overlapping with the second sacrificial layer and to expose a part of a top surface of the second insulating layer;

forming an insulating film covering a top surface and a side surface of the first sacrificial layer, a side surface of the first EL layer, the top surface of the second insulating layer, a top surface and a side surface of the second sacrificial layer, and a side surface of the second EL layer;

etching the insulating film to form a third insulating layer comprising a region in contact with the side surface of the first EL layer, a region in contact with the part of the top surface of the second insulating layer, and a region in contact with the side surface of the second EL layer and to expose the first sacrificial layer and the second sacrificial layer; and removing the first sacrificial layer and the second sacrificial layer, wherein the EL film comprises a light-emitting layer emitting white light.

13. The method of fabricating a display device according to claim 12, wherein in the etching the insulating film, a fourth insulating layer is formed over the first sacrificial layer and a fifth insulating layer is formed over the second sacrificial layer, and wherein in the removing the first sacrificial layer and the second sacrificial layer, the fourth insulating layer and the fifth insulating layer are removed.

14. The method of fabricating a display device according to claim 13, further comprising a step of forming a first protective layer overlapping with the first pixel electrode and a second protective layer overlapping with the second pixel electrode after the forming the sacrificial film, wherein the sacrificial film is etched using the first protective layer and the second protective layer as masks to form the first sacrificial layer and the second sacrificial layer.

15. The method of fabricating a display device according to claim 14, further comprising a step of removing the first protective layer and the second protective layer before the forming the insulating film.

16. The method of fabricating a display device according to claim 12, wherein the sacrificial film comprises one or more of a metal film, an alloy film, a metal oxide film, a semiconductor film, and an inorganic insulating film.

17. The method of fabricating a display device according to claim 12, further comprising a step of forming a common electrode over a top surface of the first EL layer, a top surface of the second EL layer, and a top surface and a side surface of the first third insulating layer after the removing the first sacrificial layer and the second sacrificial layer.

18. The method of fabricating a display device according to claim 17, further comprising a step of forming a layer covering the top surface of the first EL layer, the top surface of the second EL layer, and the top surface and the side surface of the third insulating layer before the forming the common electrode, wherein the layer comprises at least one of a substance with an electron-injection property and a substance with a hole-injection property.

* * * * *